US011763898B2

(12) United States Patent
Aiouaz et al.

(10) Patent No.: US 11,763,898 B2
(45) Date of Patent: Sep. 19, 2023

(54) VALUE-VOLTAGE-DISTIRUBUTION-INTERSECTION-BASED READ DISTURB INFORMATION DETERMINATION SYSTEM

(71) Applicant: Dell Products L.P., Round Rock, TX (US)

(72) Inventors: Ali Aiouaz, Bee Cave, TX (US); Walter A. O'Brien, III, Westborough, MA (US); Leland W. Thompson, Tustin, CA (US)

(73) Assignee: Dell Products L.P., Round Rock, TX (US)

( * ) Notice: Subject to any disclaimer, the term of this patent is extended or adjusted under 35 U.S.C. 154(b) by 65 days.

(21) Appl. No.: 17/581,879

(22) Filed: Jan. 22, 2022

(65) Prior Publication Data
US 2023/0238063 A1    Jul. 27, 2023

(51) Int. Cl.
*G11C 16/34* (2006.01)
*G11C 16/30* (2006.01)
*G11C 16/28* (2006.01)
*G11C 16/10* (2006.01)

(52) U.S. Cl.
CPC ........ *G11C 16/3418* (2013.01); *G11C 16/102* (2013.01); *G11C 16/28* (2013.01); *G11C 16/30* (2013.01)

(58) Field of Classification Search
None
See application file for complete search history.

(56) References Cited

U.S. PATENT DOCUMENTS

| 10,114,584 | B2  | 10/2018 | Gorobets et al. |
| 11,676,671 | B1* | 6/2023  | Aiouaz ............ G11C 29/12005 365/15 |

OTHER PUBLICATIONS

U.S. Appl. No. 17/578,694, filed 2022.*
U.S. Appl. No. 17/580,359, filed 2022.*
U.S. Appl. No. 17/580,756, filed 2022.*
U.S. Appl. No. 17/580,888, filed 2022.*
U.S. Appl. No. 17/579,654, filed 2022.*
U.S. Appl. No. 17/581,874, filed 2022.*
U.S. Appl. No. 17/581,785, filed 2022.*

(Continued)

*Primary Examiner* — Kretelia Graham
(74) *Attorney, Agent, or Firm* — Joseph Mencher

(57) ABSTRACT

A value-voltage-distribution-intersection-based read disturb information determination system includes a storage device coupled to a global read temperature identification system. The storage device identifies a value voltage distribution intersection of first and second value voltage distributions for respective first and second values in a first row in a storage subsystem in the storage device, and determines a default value voltage reference shift between a default value voltage reference level associated with the first value and the second value and the value voltage distribution intersection. Based on the default value voltage reference shift, the storage device determines read disturb information for the first row in the storage subsystem in the storage device, and uses it to generate a read temperature for a second row in the storage subsystem in the storage device that it provides to the global read temperature identification system.

20 Claims, 34 Drawing Sheets

(56) References Cited

OTHER PUBLICATIONS

U.S. Appl. No. 17/581,677, filed 2022.*
U.S. Appl. No. 17/579,988, filed 2022.*
U.S. Appl. No. 17/579,689, filed 2022.*
U.S. Appl. No. 17/579,282, filed 2022.*
U.S. Appl. No. 17/279,020, filed 2022.*
U.S. Appl. No. 17/579,020 (Year: 2022).*

* cited by examiner

VALUE-VOLTAGE-DISTIRUBUTION-INTERSECTION-BASED READ DISTURB INFORMATION DETERMINATION SYSTEM

BACKGROUND

The present disclosure relates generally to information handling systems, and more particularly to determining read disturb information associated with storage locations that store data in an information handling system for use in identifying logical storage location read temperatures associated with that data.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices and/or storage systems, and/or other computing devices known in the art, includes storage systems having one or more storage devices (e.g., Solid State Drive (SSD) storage devices) for storing data generated by the computing device. In some situations, it may be desirable to identify how often logical storage locations associated with any storage device are read. For example, different storage devices with different capabilities are associated with different costs (e.g., storage devices with relatively "higher" capabilities are more expensive than storage devices with relative "lower" capabilities), while different data stored in a storage system may have different characteristics, with some data being read relatively often (also referred to as data having a relatively "hot" read temperature) and other data being read relatively less often (also referred to as data having a relatively "cold" read temperature). As will be appreciated by one of skill in the art in possession of the present disclosure, financial margins of storage providers (e.g., entities that provide storage for customers) may be improved by offering particular storage Service Level Agreements (SLAs) while using relatively cheaper storage devices, and value can be passed on to customers by providing improved storage SLAs for data with relatively "hot" read temperatures without incurring higher costs for all storage devices in the storage system (e.g., by storing data with relatively "hot" read temperatures on relatively higher capability/cost storage devices, and storing data with relatively "cold" read temperatures on relatively lower capability/cost storage devices).

Conventional read temperature identification systems typically utilize a host processor (or a storage processor) and a host memory in a server device and/or storage system to identify read temperatures of logical storage locations in SSD storage device(s) included in, connected to, and/or otherwise coupled to that server device and/or storage system. For example, a Logical Block Address (LBA) range may be divided into smaller address ranges or logical "chunks" (e.g., 128 KB chunks). A counter (e.g., a Dynamic Random Access Memory (DRAM) counter) in the host memory may then be assigned to track read access to each logical chunk, and when the host processor performs read operations to read data from each of the SSD storage device(s) in the server device and/or storage system, the host processor will map the LBA range of that read operation to the corresponding logical chunk(s) being read, and increment the counter(s) for those physical storage element chunk(s) in the host memory. However, such conventional read temperature identification systems suffer from a number of issues.

For example, the conventional read temperature identification systems discussed above require dedicated host memory (e.g., for a 16 TB SSD storage device with 128 KB logical chunks, 32 MB of dedicated host memory is required if 8 bit counters are utilized), and the read temperature information identified will not be power-fail safe without a persistent power implementation (e.g., a battery backup, the use of Storage Class Memory (SCM) devices, etc.), each of which increases costs. In another example, the conventional read temperature identification systems discussed above increase complexity, as for a High Availability (HA) system each of multiple host processors included in a server device and/or storage system must generate its own read temperature map that tracks read temperatures of its storage devices in that server device and/or storage system, and then those host processors must synchronize their respective read temperature maps. Further complexity may be introduced when more Input/Output (I/O) initiators are utilized (e.g., when additional host processors are utilized in Non-Volatile Memory express over Fabrics (NVMe-oF) Just a Bunch Of Drives (JBOD) systems, disaggregated storage systems, and/or other systems that would be apparent to one of skill in the art in possession of the present disclosure).

In yet another example, the conventional read temperature identification systems discussed above may be inaccurate in some situations, as read temperature identification operations may be performed "in the background" with a "best effort" approach, and when host processors in a server device and/or storage system are busy performing other operations, those read temperature identification operations may not be performed in order to prevent I/O latency and/or other performance issues. While the host processors in a server device and/or storage system may sometimes only delay the read temperature identification operations in those situations, in some cases the read temperature identification operations may simply not be performed. In yet another example, the conventional read temperature identification systems discussed above can introduce a performance impact to data path(s) in a server device and/or storage system due to the use of the host processor and the host memory bus in performing the read temperature identification (e.g., via Read Modify Write (RMW) operations to provide these relatively small read temperature data writes via 64 byte cache line host memory entries, resulting in increased cache thrashing operations).

One conventional read temperature identification solution to the issues discussed above is to assume or characterize (a priori) the read temperatures of a storage device based on the type of data being read (e.g., metadata vs customer data), the type of application instructing the read operation (e.g., Relational Database Management System (RDBMS) applications vs. social media post applications (e.g., applications provided "tweets" via the TWITTER® social networking service available from TWITTER® of San Francisco, Calif., United States) vs. video streaming applications), the type of workload being performed (e.g., 4K vs. 8K video streaming workloads, sequential access vs. random access workloads, etc.). However, such conventional read temperature identification solutions suffer from a number of issues as well.

For example, the conventional read temperature identification solutions discussed above require pre-qualification or classification of data attributes, and cannot provide granularity beyond the particular classification that is used. In another example, conventional read temperature identification solutions do not allow for sub-classifications of data (e.g., a video type of the read data) that may be useful, will not allow data (e.g., video data such as that providing a movie) that is read often to be provided on a faster storage device or replicated at additional storage locations, and present issues with tracking effective "hits" per storage device and load balancing (as conventional read temperature identification solutions are typically limited to tracking data requests (e.g., video data requests) at the application level). In yet another example, conventional read temperature identification solutions require modification of software when new types of data, applications, and/or workloads are introduced and, as such, are less resilient with regard to optimizing read performance for use cases that emerge over time, and present additional costs associated with research and development to qualify new workloads or applications, develop software, test that software, perform software patch updates on server devices and/or storage systems that will use that software, and/or introduce other added cost factors that would be apparent to one of skill in the art in possession of the present disclosure.

Accordingly, it would be desirable to provide read temperature identification system that addresses the issues discussed above.

SUMMARY

According to one embodiment, a storage device includes a processing system; and a memory system that is coupled to the processing system and that includes instructions that, when executed by the processing system, cause the processing system to provide a value-voltage-distribution-intersection-based read disturb information determination engine that is configured to: identify a value voltage distribution intersection of a first value voltage distribution for a first value in a first row in a storage subsystem, and a second value voltage distribution for a second value in the first row in the storage subsystem; determine a default value voltage reference shift between a default value voltage reference level associated with the first value and the second value and the value voltage distribution intersection; determine, based on the default value voltage reference shift, read disturb information for the first row in the storage subsystem; generate, using the read disturb information, a read temperature for a second row in the storage subsystem; and provide the read temperature to the global read temperature identification system.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more solid state drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
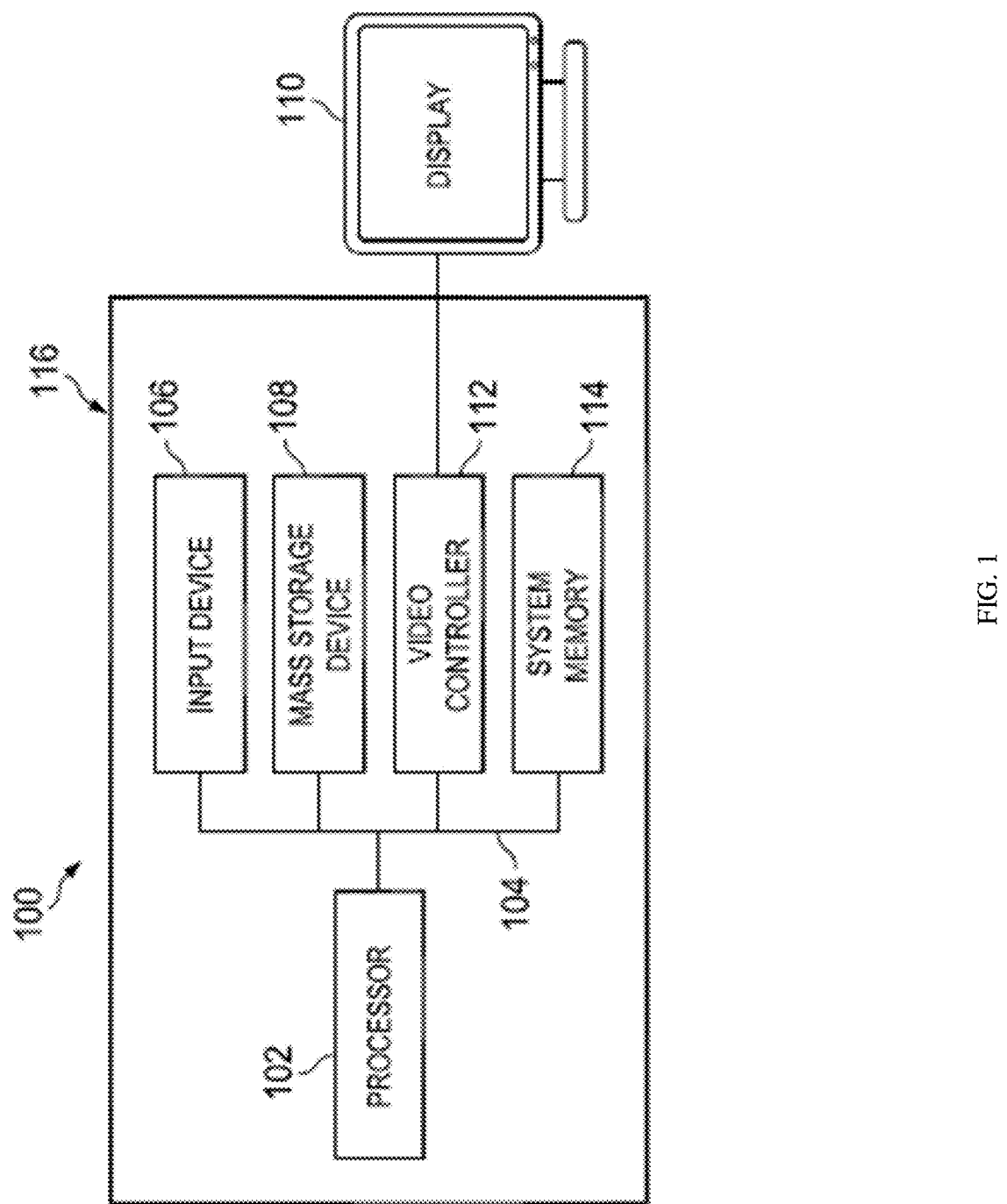
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
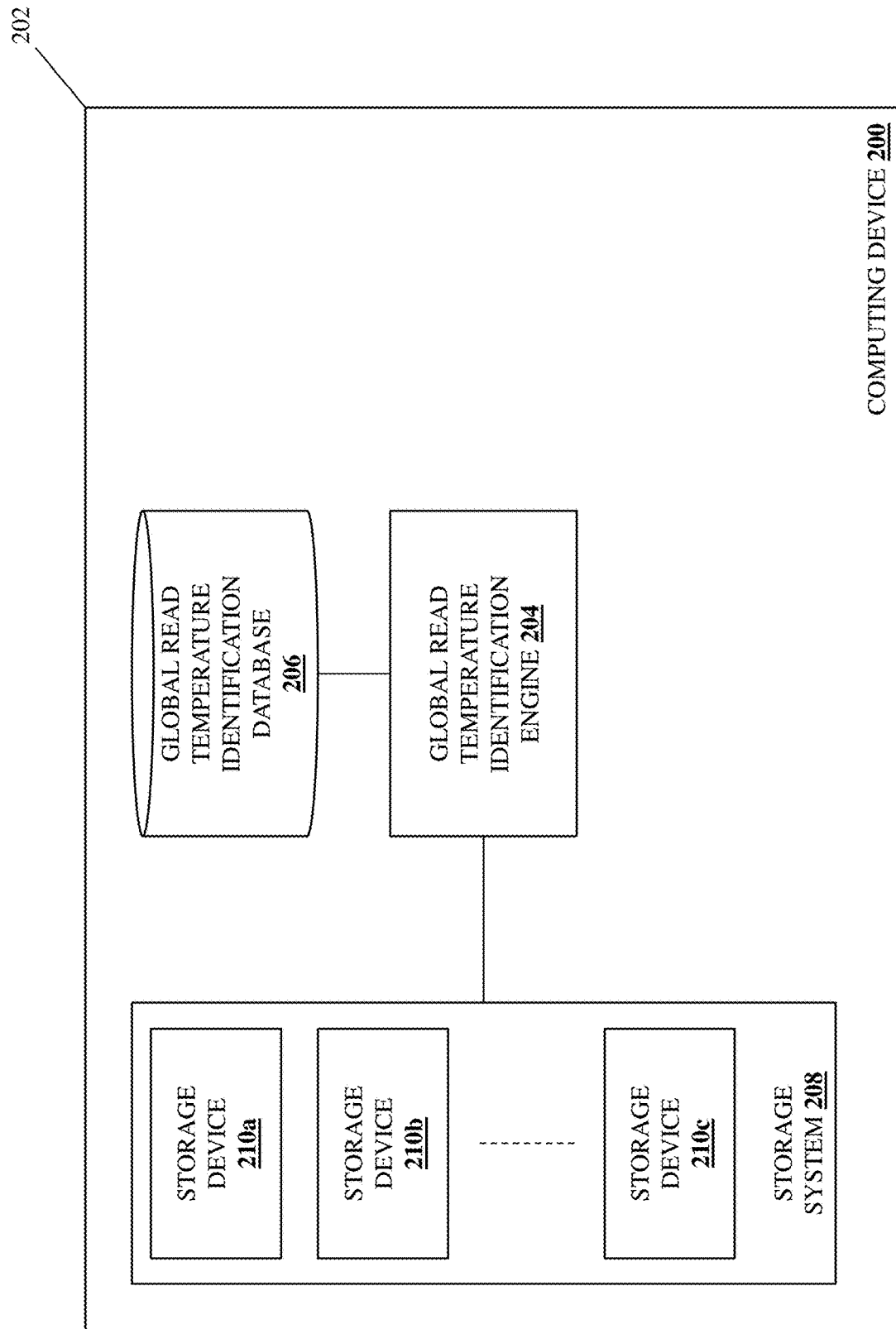
FIG. 2 is a schematic view illustrating an embodiment of a computing device that may include the read-disturb-based read temperature identification system of the present disclosure.

Referring now to FIG. 2, an embodiment of a computing device 200 is illustrated that may include the read-disturb-based read temperature identification system of the present disclosure. In an embodiment, the computing device 200 may be provided by the IHS 100 discussed above with reference to FIG. 1 and/or may include some or all of the components of the IHS 100, and in the specific examples below is illustrated and described as being provided by a server device and/or a storage system. However, while illustrated and discussed as being provided by particular computing devices, one of skill in the art in possession of the present disclosure will recognize that the functionality of the computing device 200 discussed below may be provided by other devices that are configured to operate similarly as the computing device 200 discussed below. In the illustrated embodiment, the computing device 200 includes a chassis 202 that houses the components of the computing device 200, only some of which are illustrated and discussed below. For example, the chassis 202 may house a processing system (not illustrated, but which may include the processor 102 discussed above with reference to FIG. 1 that may be provided by a Central Processing Unit (CPU) and/or other processing systems that one of skill in the art in possession of the present disclosure would recognize as providing a computing device host processor) and a memory system (not illustrated, but which may include the memory 114 discussed above with reference to FIG. 1) that is coupled to the processing system and that includes instructions that, when executed by the processing system, cause the processing system to provide a global read temperature identification engine 204 that is configured to perform the functionality of the global read temperature identification engines and/or computing devices discussed below.

The memory system housed in the chassis 202 may also include a global read temperature identification database 206 that is configured to store any of the information utilized by the global read temperature identification engine 204 discussed below. The chassis 202 may also house a storage system 208 that, in the illustrated embodiment, includes a plurality of storage devices 210a, 210b, and up to 210c. In the specific examples below, each of the storage devices 210a-210c in the storage system 208 are described as being provided by particular Solid State Drive (SSD) storage devices, but one of skill in the art in possession of the present disclosure will appreciate how the teachings of the present disclosure may benefit other storage device technologies, and thus storage devices utilizing those other types of storage device technologies are envisioned as falling within the scope of the present disclosure as well. However, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the functionality discussed below, while remaining within the scope of the present disclosure as well.

Figure 3A:
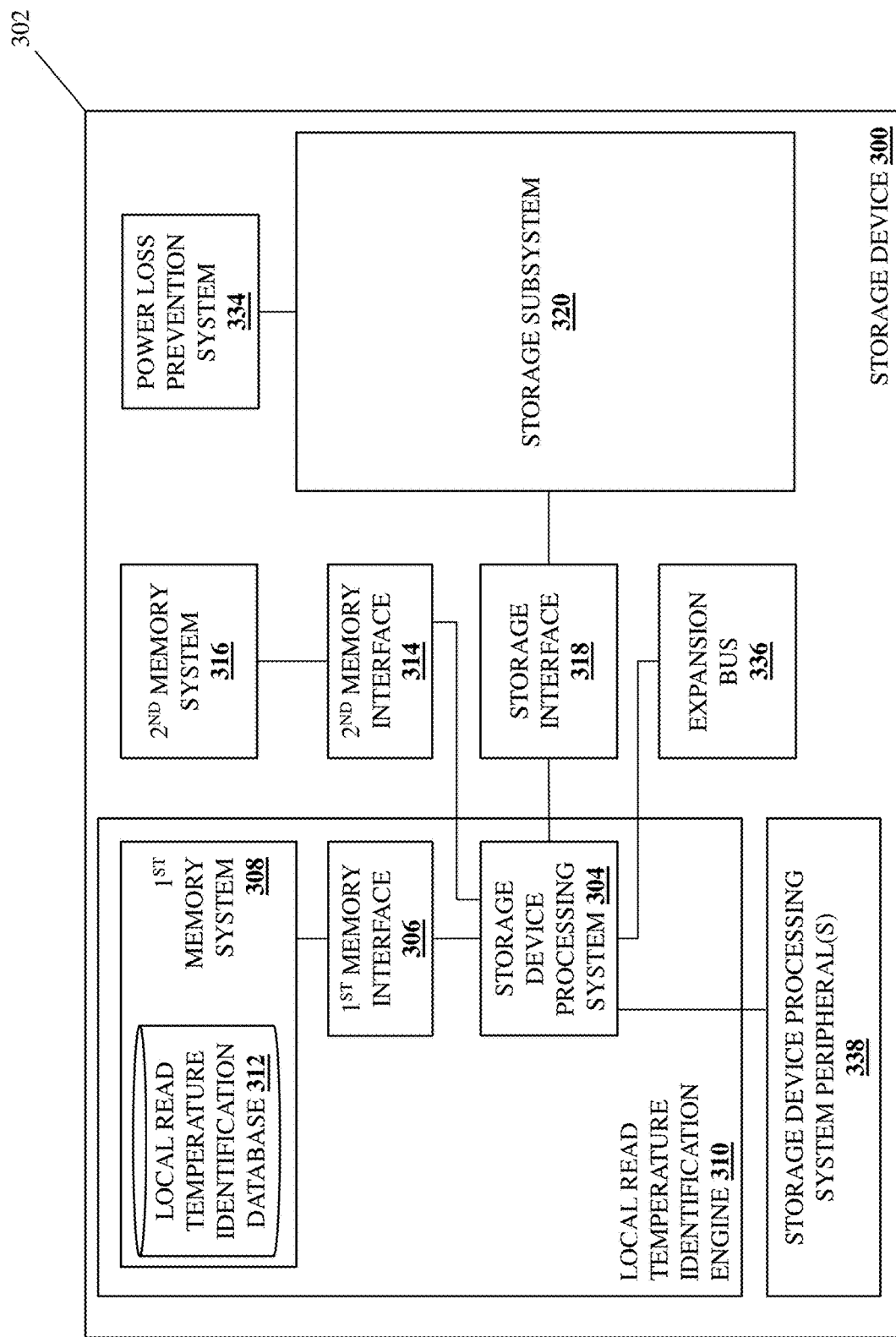
FIG. 3A is a schematic view illustrating an embodiment of a storage device that may be included in the computing device of FIG. 2 and that may provide the read-disturb-based read temperature identification system of the present disclosure.

Referring now to FIG. 3A, an embodiment of a storage device 300 is illustrated that may provide any or each of the storage devices 210a-210c in the storage system 208 discussed above with reference to FIG. 2. In an embodiment, the storage device 300 may be provided by the IHS 100 discussed above with reference to FIG. 1 and/or may include some or all of the components of the IHS 100, and in the specific examples below is illustrated and described as being provide by an SSD storage device (e.g., a Non-Volatile Memory express (NVMe) SSD storage device). However, while illustrated and discussed as being provided by a particular storage device, one of skill in the art in possession of the present disclosure will appreciate that the teachings of the present disclosure may be implemented in other storage devices that are configured to operate similarly as the storage device 200 discussed below. In the illustrated embodiment, the storage device 200 includes a chassis 302 that houses the components of the storage device 300, only some of which are illustrated and discussed below.

For example, the chassis 302 may house a storage device processing system 304 (which may include the processor 102 discussed above with reference to FIG. 1 such as a Central Processing Unit (CPU), storage device controller, and/or other processing systems that one of skill in the art in possession of the present disclosure would recognize as being provided in an SSD storage device) that is coupled via a first memory interface 306 (e.g., a Dual Data Rate (DDR) interface) to a first memory system 308 (which may include the memory 114 discussed above with reference to FIG. 1 such as Dynamic Random Access Memory (DRAM) devices and/or other memory systems that would be apparent to one of skill in the art in possession of the present disclosure). As illustrated in the specific examples provided herein, the first memory system 308 may include instructions that, when executed by the storage processing system 304, cause the storage device processing system 304 to provide a local read temperature identification engine 310 that is configured to perform the functionality of the local read temperature identification engines and/or storage devices discussed below.

As also illustrated in the specific examples provided herein, the first memory system 308 may include a local read temperature identification database 312 that is configured to store any of the information utilized by the local read temperature identification engine 310 discussed below. However, one of skill in the art in possession of the present disclosure will recognize that other embodiments of the present disclosure may provide the local read temperature identification database 312 in other locations while remaining within the scope of the present disclosure as well. For example, as illustrated, the storage device processing system 304 may also be coupled via a second memory interface 314 (e.g., a Storage Class Memory (SCM) interface) to a second memory system 316 (which may include the memory 114 discussed above with reference to FIG. 1 such as SCM devices and/or other memory systems that would be apparent to one of skill in the art in possession of the present disclosure), and the local read temperature identification database 312 may be provided by the second memory system 316 while remaining within the scope of the present disclosure as well.

Figure 3B:
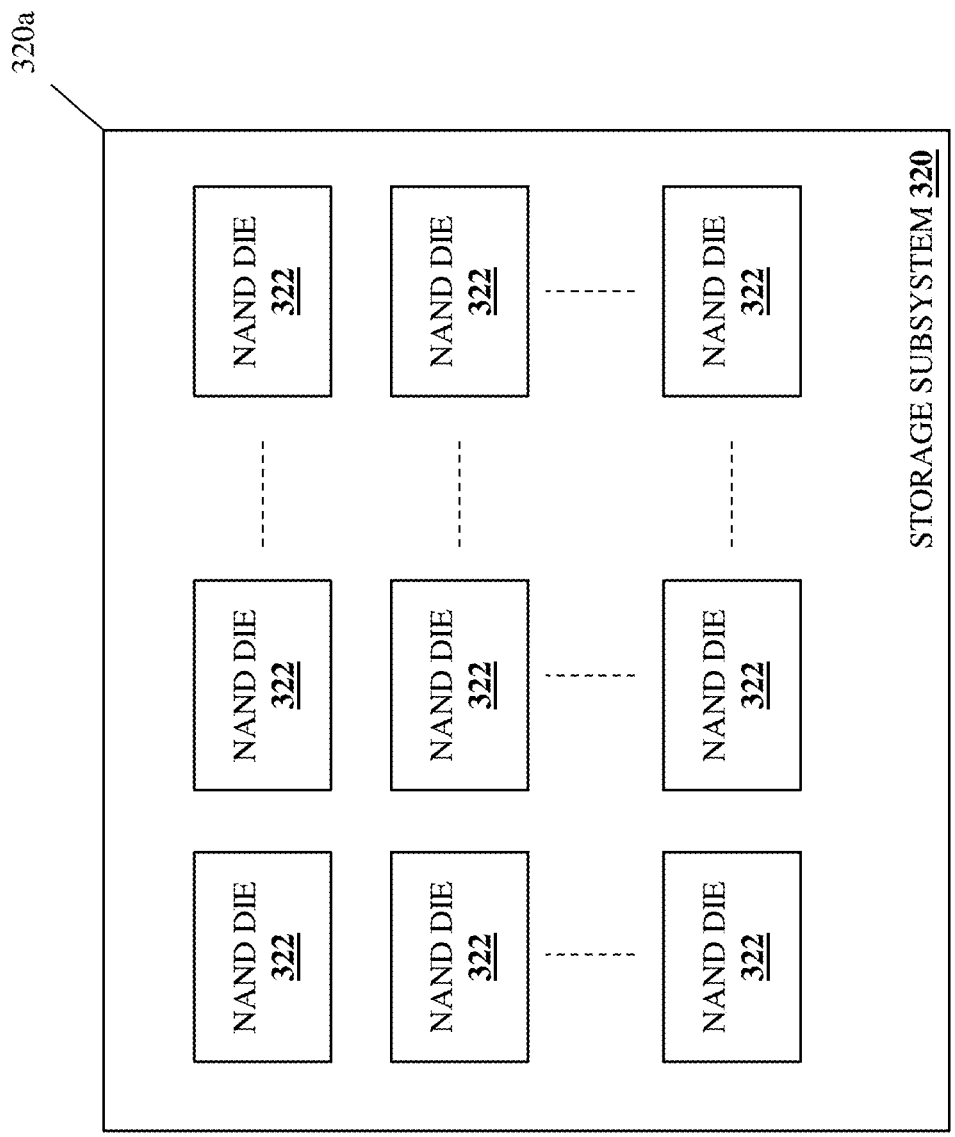
FIG. 3B is a schematic view illustrating an embodiment of a storage subsystem that may be included in the storage device of FIG. 3A.
Figure 3C:
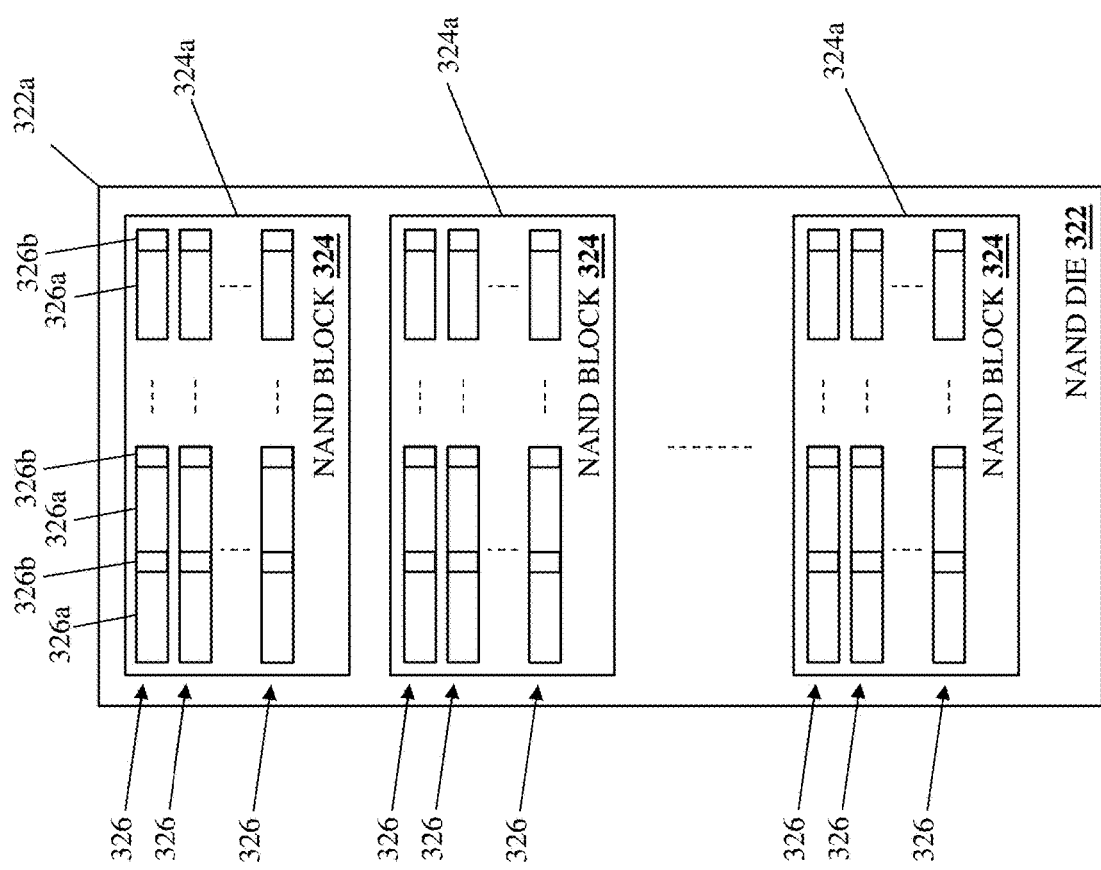
FIG. 3C is a schematic view illustrating an embodiment of NAND die that may be included in the storage subsystem of FIG. 3B.

The storage device processing system 304 may also be coupled via a storage interface 318 to a storage subsystem 320. With reference to FIG. 3B, in some embodiments, the storage subsystem 320 may include a storage subsystem chassis 320a that supports a plurality of NAND die 322. With reference to FIG. 3C, each NAND die 322 may include a chassis 322a that supports a plurality of NAND blocks 324, with each NAND block 324 including a chassis 324a that supports a plurality of NAND wordlines 326. Furthermore, each NAND wordline 326 may include a plurality of cells that provide a plurality of data portions 326a, and a respective error check portion 326b (e.g., a Cyclic Redundancy Check (CRC) portion and/or other error check data known in the art) may be associated with each of those data portions 326a. However, one of skill in the art in possession of the present disclosure will appreciate how in some embodiments the data written to a NAND block 324 may include "padding" data or other data which conventionally does require the writing of associated error check portions.

To provide a specific example, the storage subsystem 320 may include 128, 256, or 512 NAND die, with each NAND die including approximately 2000 NAND blocks, and with each NAND block including NAND wordlines grouped into 100-200 NAND layers (although forecasts predict that NAND wordlines will be grouped into up to 800 layers by the year 2030). As will be appreciated by one of skill in the art in possession of the present disclosure, conventional Triple Level Cell (TLC) technology typically allows on the order of tens to hundreds of K of data (e.g., 96 KiB on a NAND wordline, 48 KiB on a NAND wordline with two NAND wordlines activated at any particular time, up to hundreds of KiB when more planes are utilized, etc.) to be stored per NAND wordline (i.e., in the data portions of those NAND wordlines), resulting in NAND wordlines with ~250K cells.

Figure 3D:
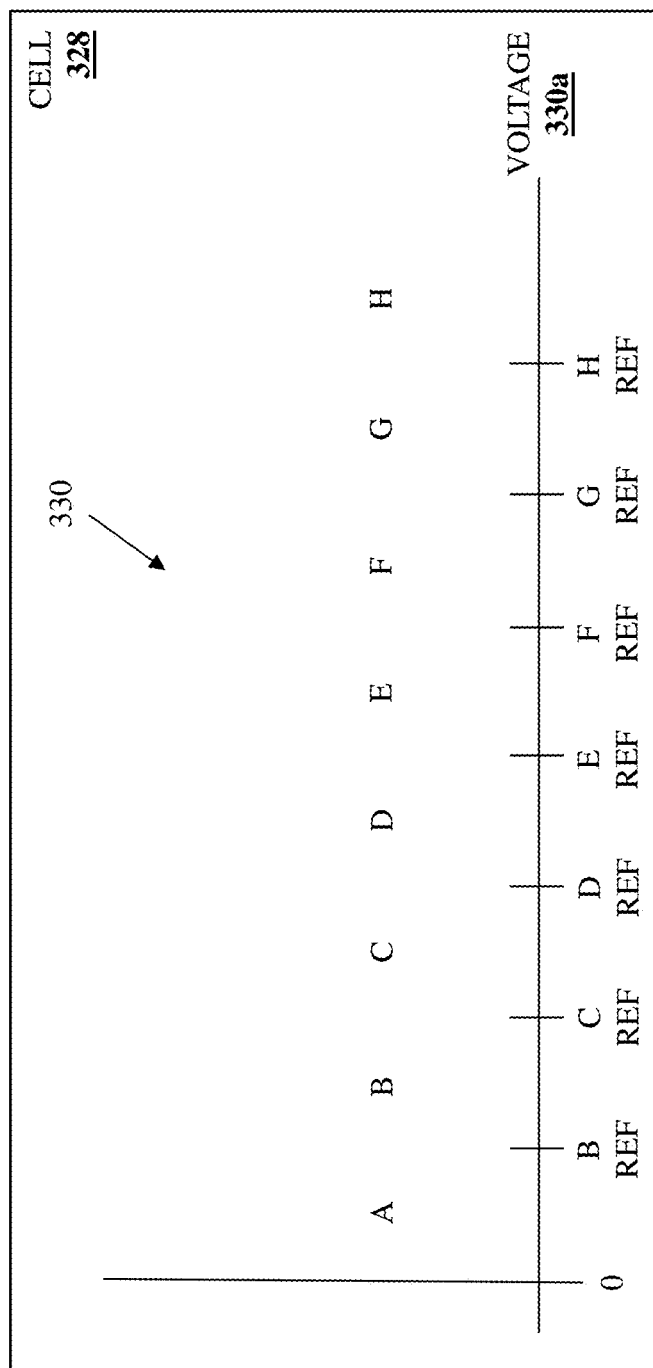
FIG. 3D is a graph view illustrating an embodiment of voltages/values available in a cell of a NAND wordline in a NAND block that is included in the NAND die of FIG. 3C.
Figure 3E:
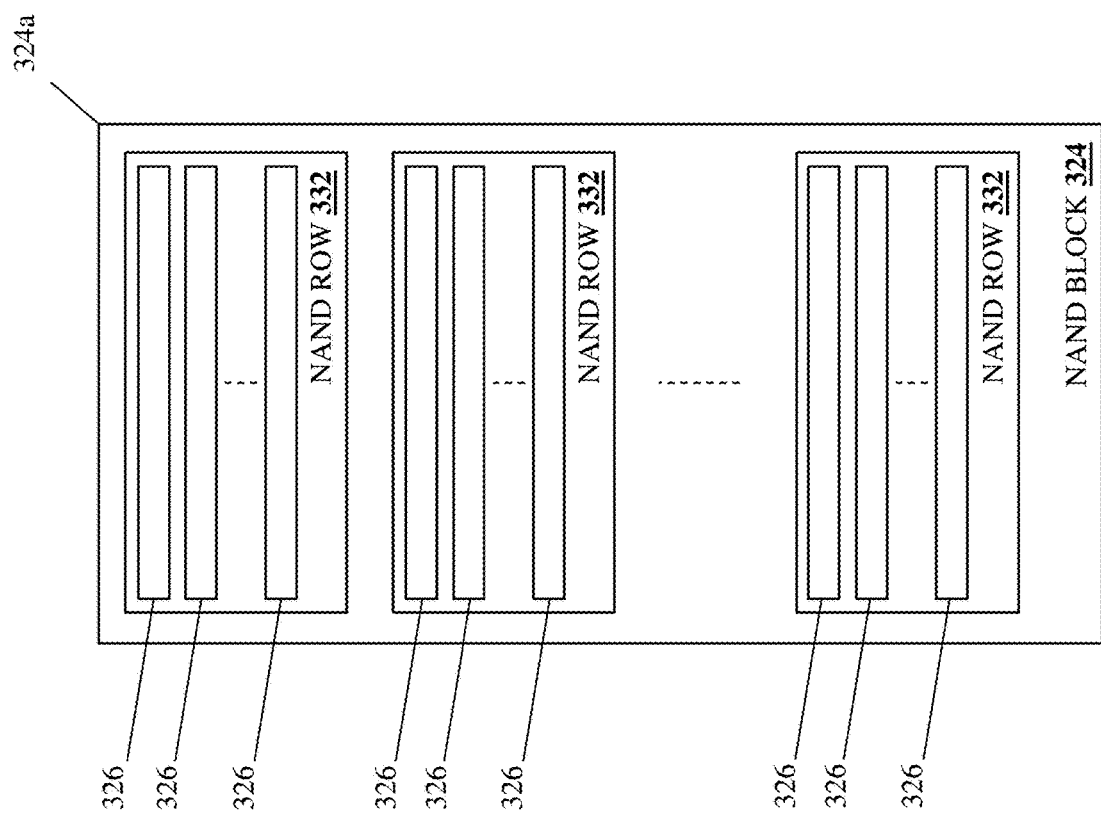
FIG. 3E is a schematic view illustrating an embodiment of a NAND block that is abstracted with "NAND rows" for purposes of describing different embodiments the read-disturb-based read temperature identification system of the present disclosure.

With reference to FIG. 3D, a simplified representation of how data may be stored in a cell 328 is provided, and one of skill in the art in possession of the present disclosure will appreciate how data may be stored in any of the plurality of cells in any of the plurality of NAND wordlines discussed above in the manner described below. The data storage representation of the cell 328 in FIG. 3D includes a graph 330 with voltage 330a on the X-axis, and illustrates how different voltages of the cell 228 may be associated with different values for that cell 328, which in specific example illustrated in FIG. 3E includes values "A", "B", "C", "D", "E", "F", "G", and "H". Furthermore, the data storage representation of the cell 328 also illustrated how reference voltages may be defined to distinguish whether a voltage in the cell provide a particular value, with a B reference ("B REF") distinguishing between a value "A" or a value "B" for the cell 328, a C reference ("C REF") distinguishing between a value "B" or a value "C" for the cell 328, a D reference ("D REF") distinguishing between a value "C" or a value "D" for the cell 328, an E reference ("E REF") distinguishing between a value "D" or a value "E" for the cell 328, an F reference ("F REF") distinguishing between a value "E" or a value "F" for the cell 328, a G reference ("G REF") distinguishing between a value "F" or a value "G" for the cell 328, an H reference ("H REF") distinguishing between a value "G" or a value "H" for the cell 328.

As such, when the cell 328 includes a voltage below "B REF" it will provide a value "A", when the cell 328 includes a voltage between "B REF" and "C REF" it will provide a value "B", when the cell 328 includes a voltage between "C REF" and "D REF" it will provide a value "C", when the cell 328 includes a voltage between "D REF" and "E REF" it will provide a value "D", when the cell 328 includes a voltage between "E REF" and "F REF" it will provide a value "E", when the cell 328 includes a voltage between "F REF" and "G REF" it will provide a value "F", when the cell 328 includes a voltage between "G REF" and "H REF" it will provide a value "G", when the cell 328 includes a voltage over "H REF" it will provide a value "H". While not illustrated or described in detail herein, one of skill in the art in possession of the present disclosure will appreciate that each value A-H illustrated in FIG. 3D may be configured to store more than one bit depending on the amount of voltage that is provided to indicate that value (e.g., a first voltage level between "B REF" and "C REF" will provide a first set of bits for the value "B", a second voltage level between "B REF" and "C REF" will provide a second set of bits for the value "B", and so on).

As will be appreciated by one of skill in the art in possession of the present disclosure, different storage device manufacturers/providers may configure the NAND wordlines/NAND layers in NAND blocks differently, with some storage devices including NAND blocks with separate NAND wordlines, some storage devices including NAND blocks with NAND layers that each include a plurality of NAND wordlines, and some storage devices including NAND blocks with groups of NAND layers that each include a plurality of NAND wordlines. As such, with reference to FIG. 3E, the present disclosure abstracts the physical implementation of NAND wordlines and NAND layers into "NAND rows", with each NAND block 324 discussed in the examples below including a plurality of NAND rows 332. In other words, any one of the NAND rows 332 may include NAND wordline(s), NAND layer(s) each including a plurality of NAND wordlines, or group(s) of NAND layers that each include a plurality of NAND wordlines. As will be appreciated by one of skill in the art in possession of the present disclosure, the read disturb signatures discussed below may vary based on the design of the storage subsystem/storage device, as it may effect a NAND wordline or group of NAND wordlines, and thus the abstraction of the physical implementation of NAND wordlines into NAND rows is provided to simplify the discussion below while encompassing such different storage subsystem/storage device designs.

However, while the specific examples discussed above describes the storage device 300 as including the storage interface 318 that may be provided by a flash device interface and the storage subsystem 320 that is described as being provided by NAND devices (e.g., NAND flash devices), one of skill in the art in possession of the present disclosure will appreciate how the teachings of the present disclosure may benefit other storage technologies, and thus storage devices utilizing those other types of storage technologies are envisioned as falling within the scope of the present disclosure as well. Furthermore, while a specific example of cells that may store 8 values ("A"-"H" in the examples above) are provided, one of skill in the art in possession of the present disclosure will appreciate how the cells may store 2 values (e.g., "A"/"0" and "B"/"1"), 4 values (e.g., "A"/"00", "B"/"01", "C"/"10", and "D"/"11"), or more than 8 values while remaining within the scope of the present disclosure as well). Furthermore, one of skill in the art in possession of the present disclosure will appreciate how different NAND rows 332 in any particular NAND block 324 of the storage subsystem 302 may use different value encoding techniques (e.g., "A" and "B", "A"-"D", "A"-"H" in the examples above), and such mixed encoding NAND rows 332 will fall within the scope of the present disclosure.

In the illustrated embodiment, a power loss prevention system 334 is housed in the chassis 302 and coupled to the storage subsystem 320, and in specific examples may be provided by a Power Loss Prevention (PLP) capacitor and/or other power storage/provisioning subsystems that would be apparent to one of skill in the art in possession of the present disclosure. In the illustrated embodiments, the storage device processing system 304 is also coupled to an expansion bus 336 such as, for example, a Peripheral Component Interconnect express (PCIe) expansion bus that may provide the connection to the global read temperature identification engine 204, as well as to one or more storage device processing system peripherals 338. Furthermore, the expansion bus 336 may provide one or more connections for performing operations associated with the storage device 300 (e.g., connection(s) for reading/writing, connections for managing any of the data/information discussed below, etc.), and may also provide out-of-band interface(s), side channel interface(s), and/or other interfaces that provide access to the storage device processing system 304 for other systems. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

Figure 4:
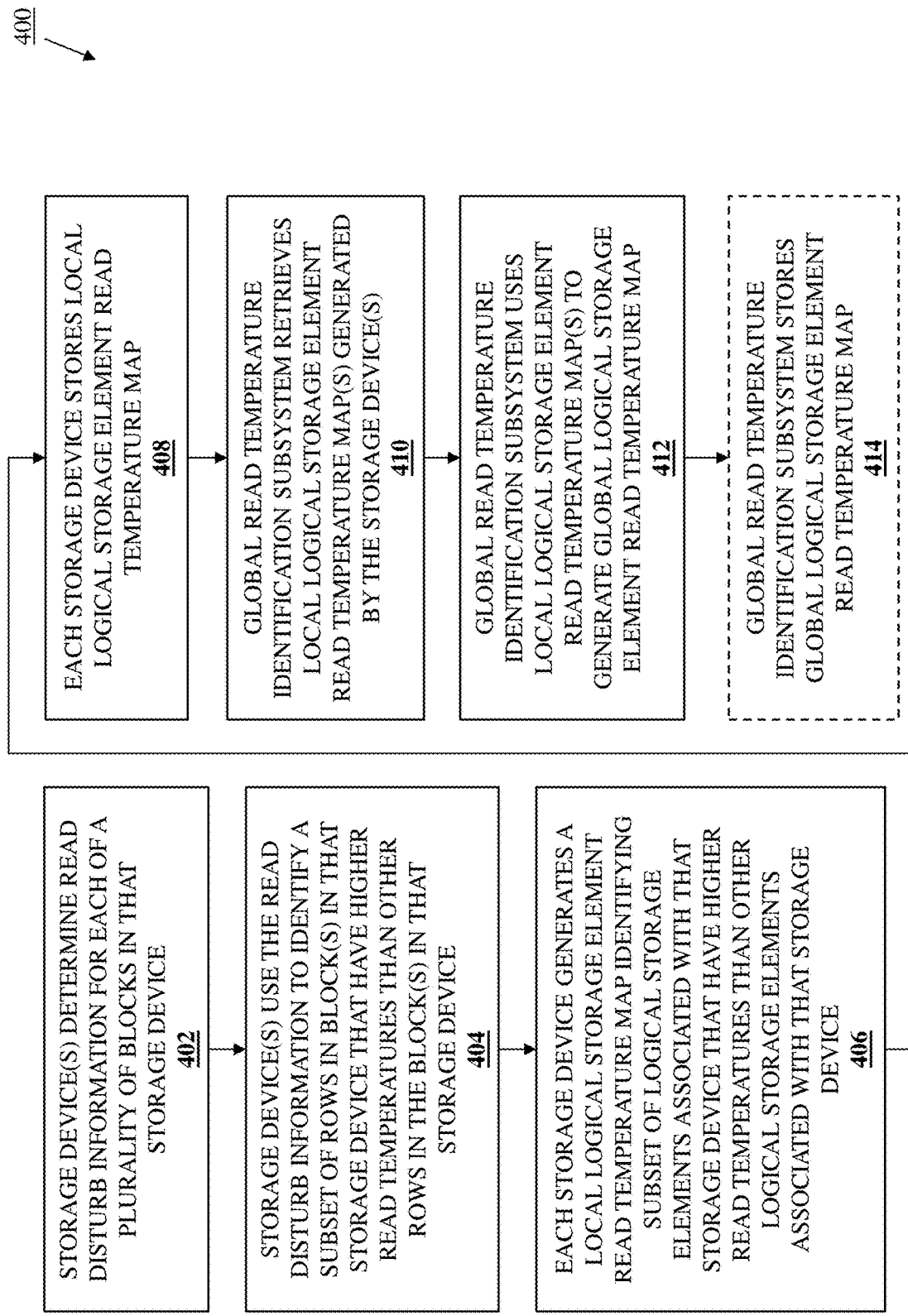
FIG. 4 is a flow chart illustrating an embodiment of a method for providing read-disturb-based read temperature identification.

Referring now to FIG. 4, an embodiment of a method 400 for providing read-disturb-based read temperature identification is illustrated. As discussed below, the systems and methods of the present disclosure utilize the read disturb effect that produces noise in adjacent NAND rows when any particular NAND row is read in order to identify NAND rows that are read more often than other NAND rows and thus have higher "read temperatures" than those other NAND rows. For example, the read-disturb-based read temperature identification system of the present disclosure may include storage device(s) that each determine read disturb information for each block in that storage device, use that read disturb information to identify a subset of rows in at least one block in that storage device that have a higher read temperature than the other rows in the at least one block in that storage device and, based on that identification, generate and store a local logical storage element read temperature map that identifies a subset of logical storage elements associated with that storage device that have a higher read temperature than the other logical storage elements associated with that storage device. A global read temperature identification subsystem coupled to the storage device(s) may then retrieve the local logical storage element read temperature map generated by each of the storage device(s) and use them to generate a global logical storage element read temperature map.

As such, the read disturb effect, which occurs automatically in response to conventional read operations and persists across power cycles, may be leveraged to generate read temperature maps for storage devices and storage systems, thus addressing many of the issues with conventional read temperature identification systems discussed above. As will be appreciated by one of skill in the art in possession of the present disclosure, the local logical storage element read temperature maps of the present disclosure are generated by the storage devices themselves (rather than the host processor/storage processor in the server device and/or storage system in which they are located), limiting read temperature identification operations performed by that host processor/storage processor to the utilization of those local logical storage element read temperature maps to generate a global logical storage element read temperature map in embodiments of the present disclosure. Furthermore, the local logical storage element read temperature maps of the present disclosure may be generated without any knowledge of the type of data being read, the application performing the read operation, or the workload being performed that resulted in the read operation.

The method 400 begins at block 402 where storage device(s) determine read disturb information for each of a plurality of blocks in that storage device. During or prior to the method 400, the computing device 200 may be utilized to write data to the storage devices 210a, 210b, and up to 210c in the storage system 208, and then read that data from those storage device(s). As will be appreciated by one of skill in the art in possession of the present disclosure, a simplified example of the writing of data to a NAND block in a storage device using the specific examples provided above includes a processing system in the computing device 200 (e.g., the processing system that provides the global read temperature identification engine 204) erasing all of the NAND rows in that NAND block to set each of their cells to the "A" value, and then selectively applying voltages across "vertical" bitlines in the NAND block and one or more "horizontal" NAND wordline(s) in NAND row(s) in that NAND block in order to cause the cells in those one or more NAND wordlines(s) to switch from the "A" value to a value indicated by a higher voltage in that cell (e.g., one of the values "B", "C", "D", "E", "F", "G", and "H" in the example above), resulting in each of those cells in the one or more NAND row(s) in that NAND block storing some number of electrons to provide one of the values "A" "B", "C", "D", "E", "F", "G", or "H" discussed above. As will be appreciated by one of skill in the art in possession of the present disclosure, the selective application of voltages discussed above may include no application of a voltage for a cell that is desired to have an "A" value.

Subsequently, data may be read from a NAND block by determining what values the cells in its NAND rows store. As will be appreciated by one of skill in the art in possession of the present disclosure, a simplified example of the reading of data from a first NAND row in a NAND block in a storage device includes a processing system in the computing device 200 (e.g., the processing system that provides the global read temperature identification engine 204) "selecting" the first NAND row by providing a voltage across the "vertical" bitlines in the NAND block, with the electrons stored in the cells in the first NAND row (i.e., to provide the values discussed above) operating to reduce the current that is sensed at the bottom of the "vertical" bitlines in the NAND block and that is produced in response to the applied voltage (with the sensing of that reduced current operating to identify particular values in the cells in the first NAND row). However, in order to prevent other second NAND rows in that NAND block that are not being read from effecting the current resulting from the voltage provided across the "vertical" bitlines in that NAND block (i.e., in order to ensure the effect on that current by the electrons stored in the cells of the first NAND row may be sensed as discussed above), those second NAND rows are "deselected" by providing a "bypass" voltage across each of those "horizontal" second NAND rows that forces its cell(s) to conduct current on the bitline.

As will be appreciated by one of skill in the art in possession of the present disclosure, the provisioning of that "bypass" voltage across each of the "horizontal" second NAND rows results in the "micro-programming" of those second NAND rows caused by electrons accumulating in those second NAND rows each time the first NAND row is read (i.e., due to the "bypass" voltage used to "deselect" them attracting electrons out of the bitline), which is referred to as the "read disturb effect" herein. Furthermore, one of skill in the art in possession of the present disclosure will appreciate how the read disturb effect/microprogramming/electron accumulation discussed above is higher in second NAND rows that are closer to the first NAND row being read, and the amount of read disturb effect/microprogramming/electron accumulation in NAND rows will depend on the type of SSD technology used in the SSD storage device.

As will be appreciated by one of skill in the art in possession of the present disclosure, while each NAND row includes many cells that may each identify multiple different values, any read of a NAND row operates to read all the cells in that NAND row and, as such, it is the read temperature of the NAND row that is of concern. Furthermore, while it is possible to read a portion of a NAND row (some subset of the NAND wordlines in that NAND row), that read operation will still apply a voltage to that entire NAND row in order to accomplish the read, thus introducing the same read disturb effect in that NAND row that would have occurred if the entire NAND row had been read.

Conventionally, the read disturb effect discussed above is considered a problem that must be corrected, as the microprogramming/electron accumulation in second NAND row(s) adjacent a first NAND row that is read often can cause a desired value in one or more of the cells in those second NAND row(s) to be mistakenly read as a different value, which one of skill in the art in possession of the present disclosure will appreciate results in a number of incorrect or "flipped" bits (i.e., bits that do not match their originally written value) that provide a "fail bit count" and must be corrected (e.g., using the error check portion 326b associated with the data portion 326a provided by the cell in the NAND wordline) to reverse the change in the value read for that cell in that NAND row. However, as discussed in further detail above, the inventors of the present disclosure have discovered that the read disturb effect may be leveraged in order to identify the read temperature of NAND rows in NAND blocks in a manner that eliminates many of the issues present in conventional read temperature identification systems.

As such, subsequent to the writing of data to the storage device(s) 210a-210c and the reading of that data from those storage device(s) 210a-210c, any or all of those storage device(s) 210a-210c/300 may operate at block 402 to determine read disturb information for each of the NAND blocks 324 included in the NAND die 322 in the storage subsystem 320 in that storage device. As will be appreciated by one of skill in the art in possession of the present disclosure, the discussion below of the determination of read disturb information by the storage device 300 may apply to any of the storage devices 210a-210c, and may be performed upon startup, reset, or other initialization of the storage device 300, periodically by the storage device during runtime, at the request of a user of the computing device 200, and/or on any other schedule or at any other time that would be apparent to one of skill in the art in possession of the present disclosure.

Figure 5A:
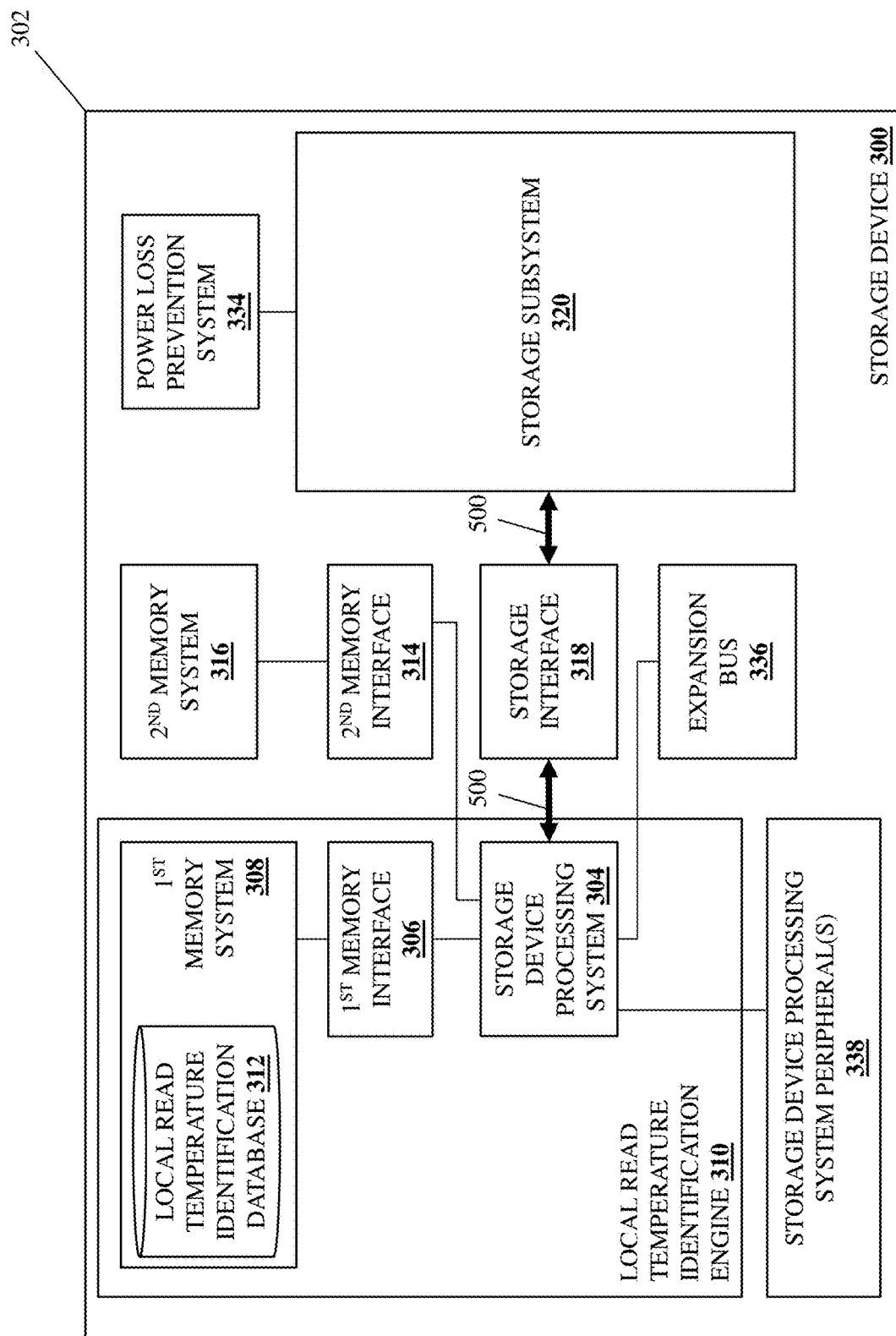
FIG. 5A is a schematic view illustrating an embodiment of the storage device of FIG. 3A operating during the method of FIG. 4.

With reference to FIG. 5A, in an embodiment of block 402, the storage device processing system 304 in the storage device 300 may perform read disturb information retrieval operations 506 that may include the storage device processing system 304 retrieving, via the storage interface 318, read disturb information associated with each of the NAND blocks 324 included in the NAND die 322 in the storage subsystem 320. The inventors of the present disclosure have developed techniques for retrieving read disturb information that are described in U.S. patent application Ser. No. 17/578,694, filed Jan. 19, 2022, the disclosure of which is incorporated by reference herein in its entirety. However, while the retrieval of read disturb information from each of the NAND rows 332 in each of the NAND blocks 324 in the storage subsystem 320 is described, one of skill in the art in possession of the present disclosure will appreciate how the retrieval of read disturb information for a subset of NAND rows 332 in a subset of NAND blocks 324 in the storage subsystem 320 will fall within the scope of the present disclosure as well (e.g., when a previously "hot" subset of NAND rows in NAND block(s) are being checked to determine whether they are still "hot").

Figure 5B:
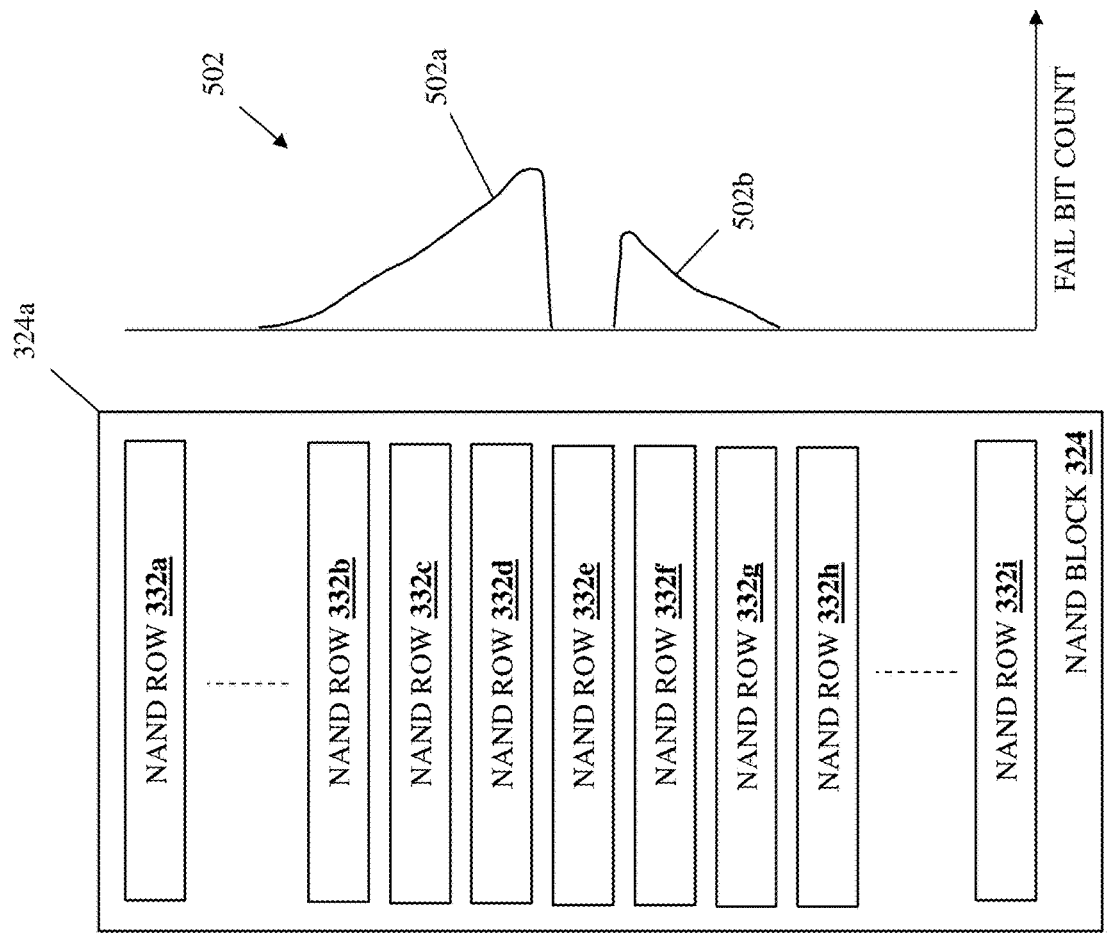
FIG. 5B is a schematic view illustrating an embodiment of a read disturb signature identified for the NAND rows in the NAND block of FIG. 3E during the method of FIG. 4.

For example, the read disturb information retrieval operations 506 performed at block 402 may include the storage device processing system 304 in the storage device 300 accessing each NAND block 324 to identify a read disturb "signature" for each of a plurality of NAND rows 332a-332i in that NAND block 324 that may be provided by fail bit counts in one or more adjacent NAND rows. With reference to FIG. 5B, a specific example of the read disturb information for the NAND row 332e in a NAND block 324 is provided, and illustrates a read disturb signature 502 provided by fail bit counts for some of the NAND rows 332a-332d and 332f-332i.

In particular, the read disturb signature 502 illustrated in FIG. 5B includes a fail bit count portion 502a associated with the NAND rows 332a-332e on a "first side" of the NAND row 332e, and a fail bit count portion 502b associated with the NAND rows 332f-332i on a "second side" of the NAND row 332e. As will be appreciated by one of skill in the art in possession of the present disclosure, the distribution of the read disturb signature 502 provides a histogram across all the cells in NAND wordlines of the NAND rows (e.g., with some cells in the NAND wordline(s) in the NAND row 332f relatively more effected by the read disturb effect than other cells in that NAND wordlines in that NAND row 3320, with all of the NAND wordlines in the NAND rows impacted by the read disturb effect to some extent (i.e., due to electron accumulation prior to the attenuation effects discussed above). However, while a particular example is provided, one of skill in the art in possession of the present disclosure will appreciate that other storage subsystem technologies (e.g., SCM storage devices, Dual Data Rate (DDR) storage devices, etc.) provide similar effects (e.g., DDR storage devices experience a "row hammer" effect) that will fall within the scope of the present disclosure as well. As will be appreciated by one of skill in the art in possession of the present disclosure, the fail bit count portion 502a illustrates how the NAND row 332d experiences a higher fail bit count than the NAND row 332c, which experiences a higher fail bit count than the NAND row 332b, and so on due to their relative proximity to the NAND row 332e. Similarly, the fail bit count portion 502b illustrates how the NAND row 332f experiences a higher fail bit count than the NAND row 332g, which experiences a higher fail bit count than the NAND row 332h, and so on due to their relative proximity to the NAND row 332e.

Furthermore, the fail bit count portions 502a and 502b also illustrate how the NAND row 332d experiences a higher fail bit count than the NAND row 332f due to the NAND row 332d seeing the "full" current resulting from the voltage applied to the "vertical" bitlines in the NAND block when performing a read of the NAND row 332e relative to the current that is attenuated by the charge in the cell of the NAND row 332e (e.g., if the charge in the cell(s) of a NAND row provides a relatively low voltage value (e.g., the "A" value discussed below), the "downstream" NAND rows will see relatively more electrons than the "upstream" NAND rows, while if the charge in the cell(s) of a NAND row provides a relatively high voltage value (e.g., the "H" value discussed below), the "downstream" NAND rows will see relatively less electrons than the "upstream" NAND rows).

Figure 5C:
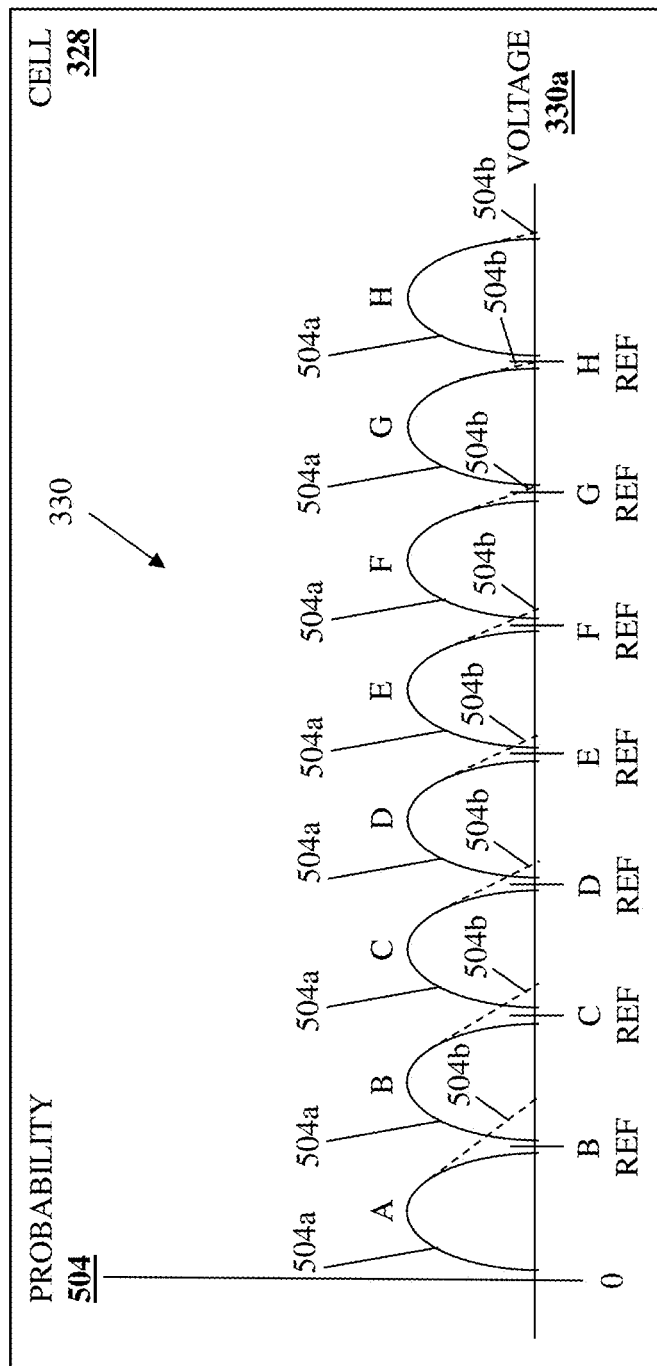
FIG. 5C is a graph view illustrating an embodiment of voltage skewing in a cell that provides a portion of the read disturb signature of FIG. 5B during the method of FIG. 4.

With reference to FIG. 5C, the simplified representation from FIG. 3D of how data may be stored in a cell 328 is reproduced, but with the data storage representation of the cell 328 in FIG. 5C including the graph 330 with voltage 330a on the X-axis and probability 504 on the Y-axis. The graph 330 in FIG. 5C also includes voltage/value probabilities 504a (provided in solid lines) for each value "A"–"H" available in the cell 328 that, as can be seen, is highest in the middle of the voltage range for each value "A"–"H", and reduces to near-zero near the bounds of the voltage range for each value "A"–"H" (e.g., the voltage/value probability for the value "A" is highest midway between "0" and "B REF" and reduces to near-zero at both "0" and "B REF", the voltage/value probability for the value "B" is highest midway between "B REF" and "C REF" and reduces to near-zero at both "B REF" and "C REF", and so on).

As will be appreciated by one of skill in the art in possession of the present disclosure, the cell 328 associated with the graph 330 in FIG. 5C has experienced the read disturb effect (e.g., it is a cell in one of the NAND rows 332b-d, 332f, or 332g in FIG. 5B), and the graph 330 illustrates a read disturb effect skew 504b (provided in dashed lines) that illustrates how the read disturb effect skews the voltage/value probabilities 504a for each value "A"–"H" available in the cell 328. As discussed above, after a plurality of reads to an adjacent NAND row (e.g., the NAND row 332e) that causes the accumulation of charge in a particular NAND row (e.g., the NAND row 332d), a desired value in some cells may be mistakenly read as a different value due to the voltage in those cells crossing the reference voltage that defines that different value.

For example, FIG. 5C illustrates how the accumulation of charge in the NAND row 332d may introduce the read disturb effect skew 504b for one or more of the values "A"–"H" that can cause at least a portion of the voltage/value probabilities 504a for those values to shift across the reference voltage for an adjacent value. As can be seen in FIG. 5C, the read disturb effect skew 504b to the voltage/value probability 504a for the value "A" causes that voltage/value probability 504a to skew past the B REF, and thus some reads of voltages in the cell 328 that are desired to provide the value "A" will instead mistakenly provide the value "B" (i.e., due to the actual voltage read being between the B REF and the C REF because it was "pushed" in that "direction" due to the read disturb effect). Furthermore, while a single example is provided, one of skill in the art in possession of the present disclosure will appreciate how the read disturb effect skew 504b to the voltage/value probability 504a for any of the values "B"–"H" can result in the identification of a mistaken value in a similarly manner.

One of skill in the art in possession of the present disclosure will recognize how conventional systems (e.g., SSD storage device firmware and controllers) may utilize software to shift the reference voltages for one or more values in a cell to compensate for this read disturb effect. However, at block 402, the storage device processing system 304 may instead identify this read disturb information for each NAND row in each of a plurality of NAND blocks 324 in its storage device 300, and one of skill in the art in possession of the present disclosure will appreciate how the read disturb signature for each of those NAND rows will differ depending on whether that NAND row has been read a relatively higher number of times (in which case its read disturb signature will include relatively high fail bit counts for its adjacent NAND rows), whether that NAND row has been read a relatively lower number of times (in which case its read disturb signature will include relatively lower fail bit counts for its adjacent NAND rows), whether that NAND row has been read a relatively intermediate number of times (in which case its read disturb signature will include relatively intermediate fail bit counts for its adjacent NAND rows), etc.

Techniques for determining read disturb information are described in further detail below, and include different techniques for determining the fail bit counts discussed above that provide the read disturb signatures that allow for the determination of read disturb information, as well as techniques for determining read disturb information without the need to explicitly identify failed bit counts. Furthermore, the inventors of the present disclosure describe techniques for isolating read disturb information in U.S. patent application Ser. No. 17/578,694, filed Jan. 19, 2022, the disclosure of which is incorporated by reference herein in its entirety, and the read disturb information determination techniques described below may be utilized to determine the read disturb information that is then isolated as described in U.S. patent application Ser. No. 17/578,694, filed Jan. 19, 2022, the disclosure of which is incorporated by reference herein in its entirety.

Figure 5D:
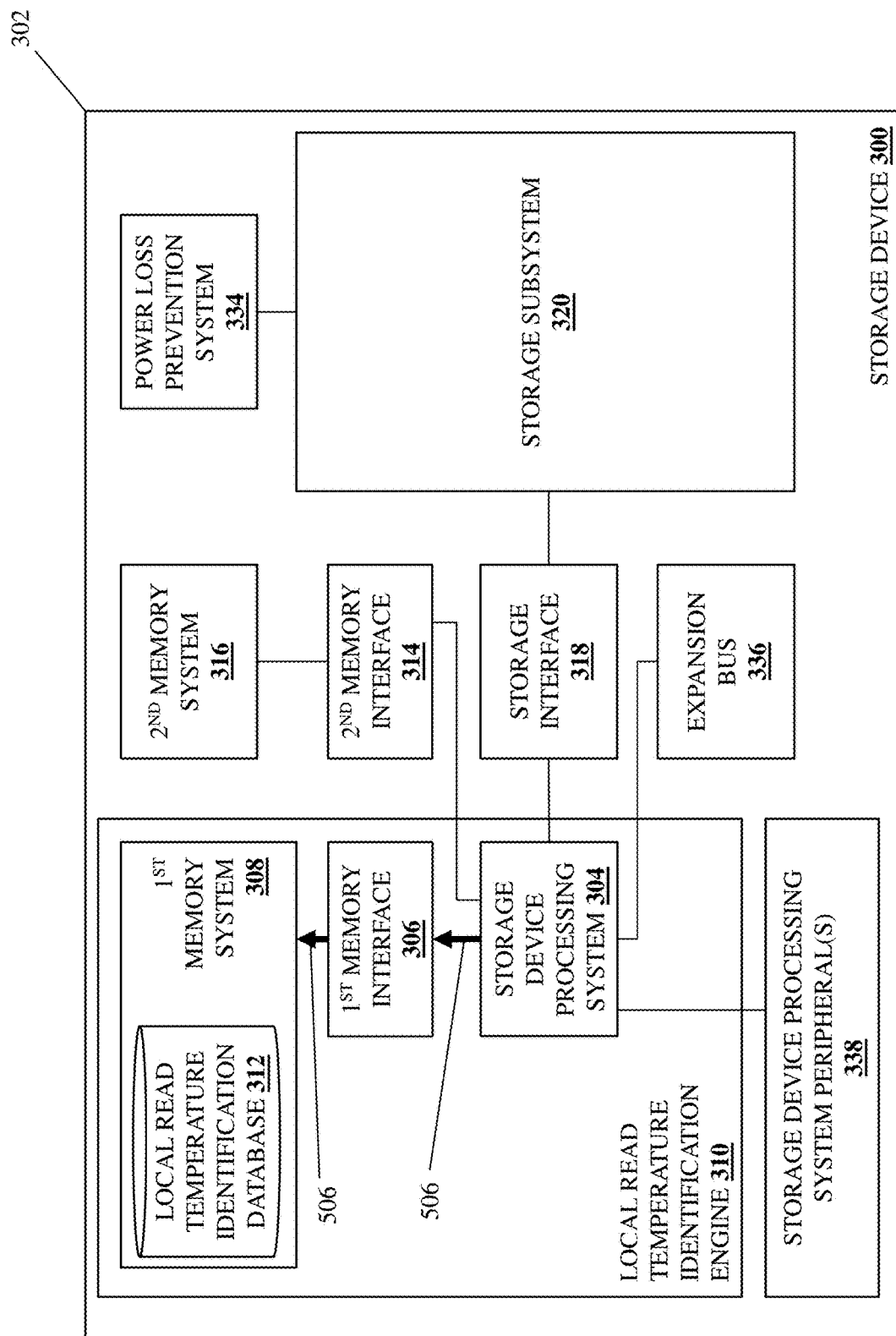
FIG. 5D is a schematic view illustrating an embodiment of the storage device of FIG. 3A operating during the method of FIG. 4.

With reference to FIG. 5D, the storage device processing system 304 may then perform read disturb information storage operations 506 that include accessing the first memory system 308 vis the first memory interface 306 and storing the read disturb information in the local read temperature identification database 312. As such, following block 402, each of the storage devices 210a-210c/300 in the computing device 200 may have determined and stored read disturb information for each NAND row 332a-332i included in each of its NAND blocks 324 provided by each of its NAND dies 322 in its storage subsystem 320.

In some embodiments, at block 402 and prior to or subsequent to storing the read disturb information in the local read temperature identification database 312, the storage device processing system 304 in the storage device 300 may perform read disturb information isolation operations in order to isolate data in the read disturb information determined for each NAND row 332a-332i included in each of its NAND blocks 324 provided by each of its NAND dies 322 in its storage subsystem 320. The inventors of the present disclosure have developed several techniques for isolating read disturb information that are described in U.S. patent application Ser. No. 17/578,694, filed Jan. 19, 2022, the disclosure of which is incorporated by reference herein in its entirety. As described in those patent documents, the read disturb information determined at block 402 by the storage device processing system 304 for each NAND row 332a-332i included in each of its NAND blocks 324 provided by each of its NAND dies 322 in its storage subsystem 320 may include "noise" and/or other information artifacts that are not indicative of the read disturb effect, and thus different isolation techniques may be performed on the read disturb information in order to allow the storage device processing system 304 to more accurately characterized the read disturb effect for each NAND row 332a-332i included in each of its NAND blocks 324 provided by each of its NAND dies 322 in its storage subsystem 320. As such, in some embodiments, the read disturb information stored in the local read temperature identification database 312 in each storage device 210a-210c/300 may be isolated read disturb information.

Figure 6:
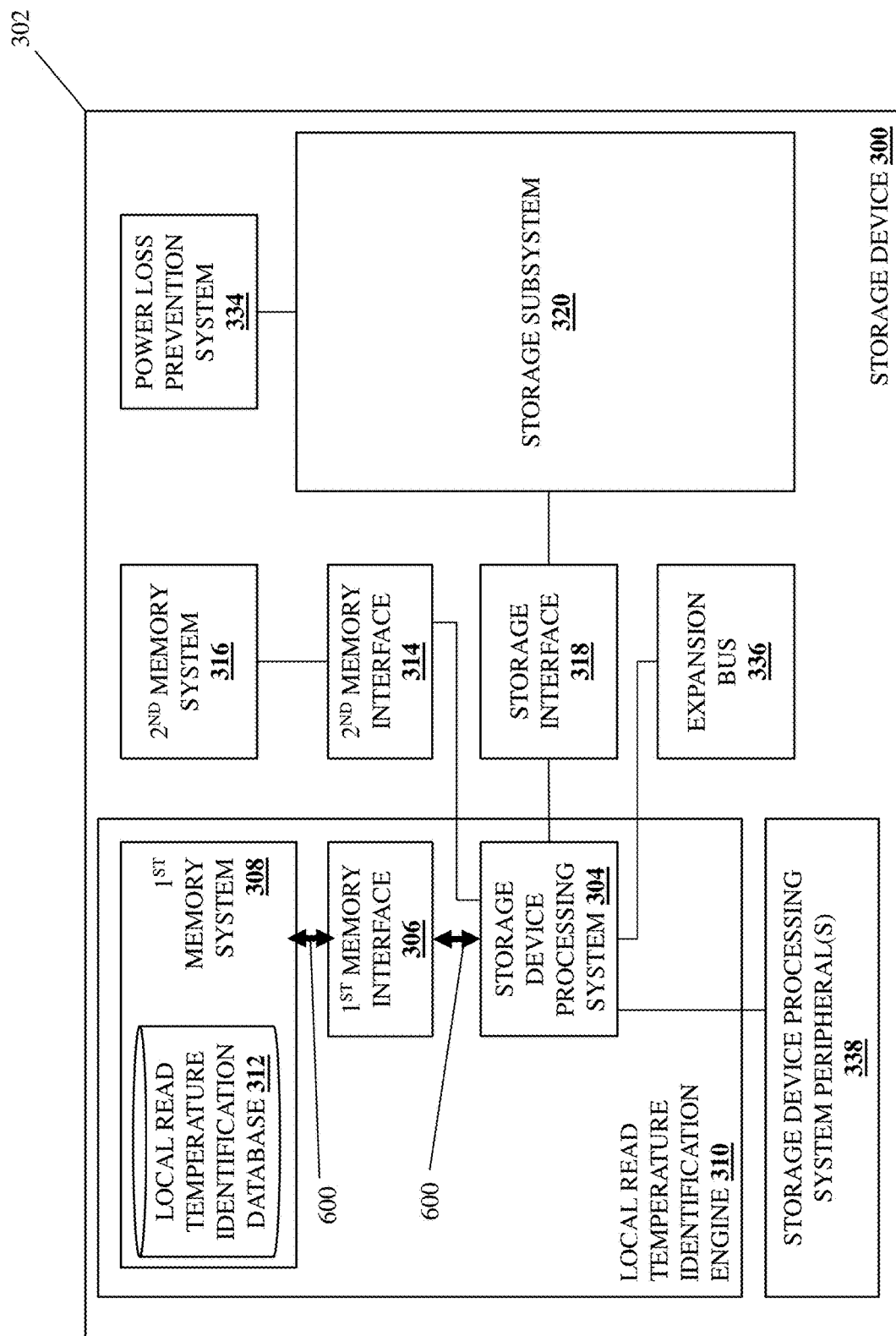
FIG. 6 is a schematic view illustrating an embodiment of the storage device of FIG. 3A operating during the method of FIG. 4.

The method 400 then proceeds to block 404 where the storage device(s) use the read disturb information to identify a subset of rows in block(s) in that storage device that have higher read temperatures than other rows in the block(s) in that storage device. With reference to FIG. 6, in an embodiment of block 404, the storage device processing system 304 may perform read temperature identification operations 600 that may include accessing the read disturb information stored in the local read temperature identification database 312 (e.g., via the first memory interface 306 and the first memory system 308), and identifying relative read temperatures of each NAND row 332a-332i included in each of its NAND blocks 324 provided by each of its NAND dies 322 in its storage subsystem 320. However, while the read temperature information is described as being stored in the local read temperature identification database 312 prior to being accessed and used to identify relative read temperatures of NAND rows, one of skill in the art in possession of the present disclosure will recognize that the read temperature information may be used to identify relative read temperatures of NAND rows upon its collection and without storing it in the local read temperature identification database 312 (e.g., relative read temperatures of NAND rows may be identified "on the fly" as read disturb information is collected at block 402) while remaining within the scope of the present disclosure as well.

As discussed above, the read disturb signature determined for each NAND row will differ depending on whether that NAND row has been read a relatively higher number of times, whether that NAND row has been read a relatively lower number of times, whether that NAND row has been read a relatively intermediate number of times, etc. Furthermore, one of skill in the art in possession of the present disclosure will appreciate how NAND rows that have been read a relatively higher number of times may be identified as having a relatively high read temperature, NAND rows that have been read a relatively lower number of times have be identified as having a relatively low read temperature, NAND rows that have been read a relatively intermediate number of times may be identified as having a relatively intermediate temperature, and so on.

As such, in some embodiments of block 404, the storage device processing system 304 may analyze each read disturb signature determined for each NAND row 328a-328i included in each of its NAND blocks 324 provided by each of its NAND dies 322 in its storage subsystem 320, and determine whether that read disturb signature identifies a relatively high read temperature (e.g., because the NAND rows adjacent the NAND row for which that read disturb signature was generated experienced relatively high fail bit counts), whether that read disturb signature identifies a relatively low read temperature (e.g., because the NAND rows adjacent the NAND row for which that read disturb signature was generated experienced relatively low fail bit counts), whether that read disturb signature identifies a relatively intermediate read temperature (e.g., because the NAND rows adjacent the NAND row for which that read disturb signature was generated experiences relatively intermediate fail bit counts), and/or whether that read disturb signature identifies other read temperature granularities that are distinguishable from the relatively high read temperature, the relatively low read temperature, and the relatively intermediate read temperature discussed above.

Furthermore, in some embodiments of block 404, the storage device 300 may operate to process current and previously determined read disturb information for a NAND row in order to generate a read temperature for that NAND row, and the inventors of the present disclosure describe techniques for storage devices to generate read temperature in U.S. patent application Ser. No. 17/580,359, filed Jan. 20, 2022; U.S. patent application Ser. No. 17/580,756, filed Jan. 21, 2022; and U.S. patent application Ser. No. 17/580,888, filed Jan. 21, 2022; the disclosures of which are incorporated by reference herein in their entirety.

As will be appreciated by one of skill in the art in possession of the present disclosure, any relative read temperature metrics may be assigned to the relatively high read temperature, relatively low read temperature, relatively intermediate read temperature, and so on, in order to indicate the different read temperatures for each of the NAND rows. For example, the NAND row read temperatures identified as discussed above using NAND row read disturb signatures may not provide exact numerical read temperatures (e.g., as may be provided in conventional read temperature identification systems may operate to record the exact number of reads of a NAND row), but the inventors of the present disclosure have found that the use of the NAND row read disturb signatures to provide NAND row read temperatures as discussed above provide for the accurate identification of relative temperatures of the different NAND rows in a storage subsystem. Furthermore, as read disturb signature analysis becomes more accurate in the future, the inventors of the present disclosure expect that any particular read disturb signature may then be associated with a number of reads of a NAND row, and thus envision doing so while remaining within the scope of the present disclosure as well.

While the embodiments discussed below describe the use of the read temperature determined as described above to generate a local logical storage element read temperature map, the inventors of the present disclosure have developed techniques for storage devices to identify and use read temperatures based on the read disturb effect to move data without the need to generate a local logical storage element read temperature map that are described in U.S. patent application Ser. No. 17/579,654, filed Jan. 20, 2022, the disclosure of which is incorporated by reference herein in its entirety.

The method 400 then proceeds to block 406 where each of the storage device(s) generate a local logical storage element read temperature map identifying a subset of logical storage elements that are associated with that storage device and that have higher read temperatures than other logical storage elements associated with that storage device, as well as to block 408 where the storage device(s) store the local storage element read temperature map generated by that storage device. The inventors of the present disclosure have developed several techniques for generating and/or maintaining a local logical storage element read temperature map that are described in U.S. patent application Ser. No. 17/581,874, filed Jan. 22, 2022; U.S. patent application Ser. No. 17/581,785, filed Jan. 21, 2022; U.S. Patent application Ser. No. 17/581,677, filed Jan. 21, 2022; U.S. patent application Ser. No. 17/579,988, filed Jan. 20, 2022; the disclosures of which are incorporated by reference herein in their entirety. As described in those patent documents, local logical storage element read temperature maps may be generated by mapping read temperatures identified for physical storage to a logical-to-physical mapping (e.g., via a "reverse lookup"), and may be maintained by identifying any historical read temperature(s) associated with a logical storage element when its data is moved to a new storage element (i.e., by writing that data to a physical storage location mapped to that new storage element), and then mapping those historical read temperatures to that new storage element in the logical-to-physical mapping as well (and in some cases, persistently storing those historical read temperatures in the NAND block that stores the corresponding data, in a metadata NAND block in the storage subsystem 320, and/or in other storage locations that would be apparent to one of skill in the art in possession of the present disclosure).

In an embodiment, at block 406, the storage device processing system 304 in the storage device 300 may generate a local logical storage element read temperature map using the relative read temperatures identified for each NAND row 332a-332i included in each of its NAND blocks 324 provided by each of its NAND dies 322 in its storage subsystem 320 at block 404. In an embodiment, the storage device 300 may utilize Logical Block Addressing (LBA), which one of skill in the art in possession of the present disclosure will recognize logically divides the storage subsystem 320 into logical storage elements (e.g., 512 byte to 4096 byte sectors), with the first logical storage element identified as logical block 0, the second logical storage element identified as logical block 1, and so on, and with each logical storage element mapped to a respective NAND row 332a-332i included in the NAND blocks 324 provided by the NAND dies 322 in the storage subsystem 320.

As such, block 406 may include the storage device processing system 304 mapping, in a local logical storage element read temperature map, the read temperature determined for each NAND row at block 404 to the logical storage element that is mapped to that NAND row. Thus, continuing with the example provided above, a read temperature identified for a first NAND row may be mapped, in the local logical storage element read temperature map, to an LBA block 0 that is mapped to the first NAND row; a read temperature identified for a second NAND row may be mapped, in the local logical storage element read temperature map, to an LBA block 1 that is mapped to the second NAND row; a read temperature identified for a third NAND row may be mapped, in the local logical storage element read temperature map, to an LBA block 2 that is mapped to the third NAND row; and so on until a read temperature is mapped to each of the LBA blocks.

In a specific example, any NAND row may be mapped to one or more logical storage elements, and in the event a NAND row has a particular read temperature, each logical storage element mapped to that NAND row will have that particular read temperature. As such, the present disclosure may provide read temperature granularity at the NAND row level. Furthermore, while most storage device implementations today map logical blocks to NAND rows such that each logical block is fully contained within that NAND row, one of skill in the art in possession of the present disclosure will appreciate that a logical block may "straddle" multiple NAND rows, and in such cases read temperatures of that logical block may be computed by combining the read temperatures determined for those multiple NAND rows using any of variety of techniques that would be apparent to one of skill in the art in possession of the present disclosure. Thus, following block 406, each of the storage devices 210a-210c/300 may have generated a respective local logical storage element read temperature map, and at block 408 each of the storage devices 210a-210c/300 may have stored that local logical storage element read temperature map in its local read temperature identification database 312.

Figure 7A:
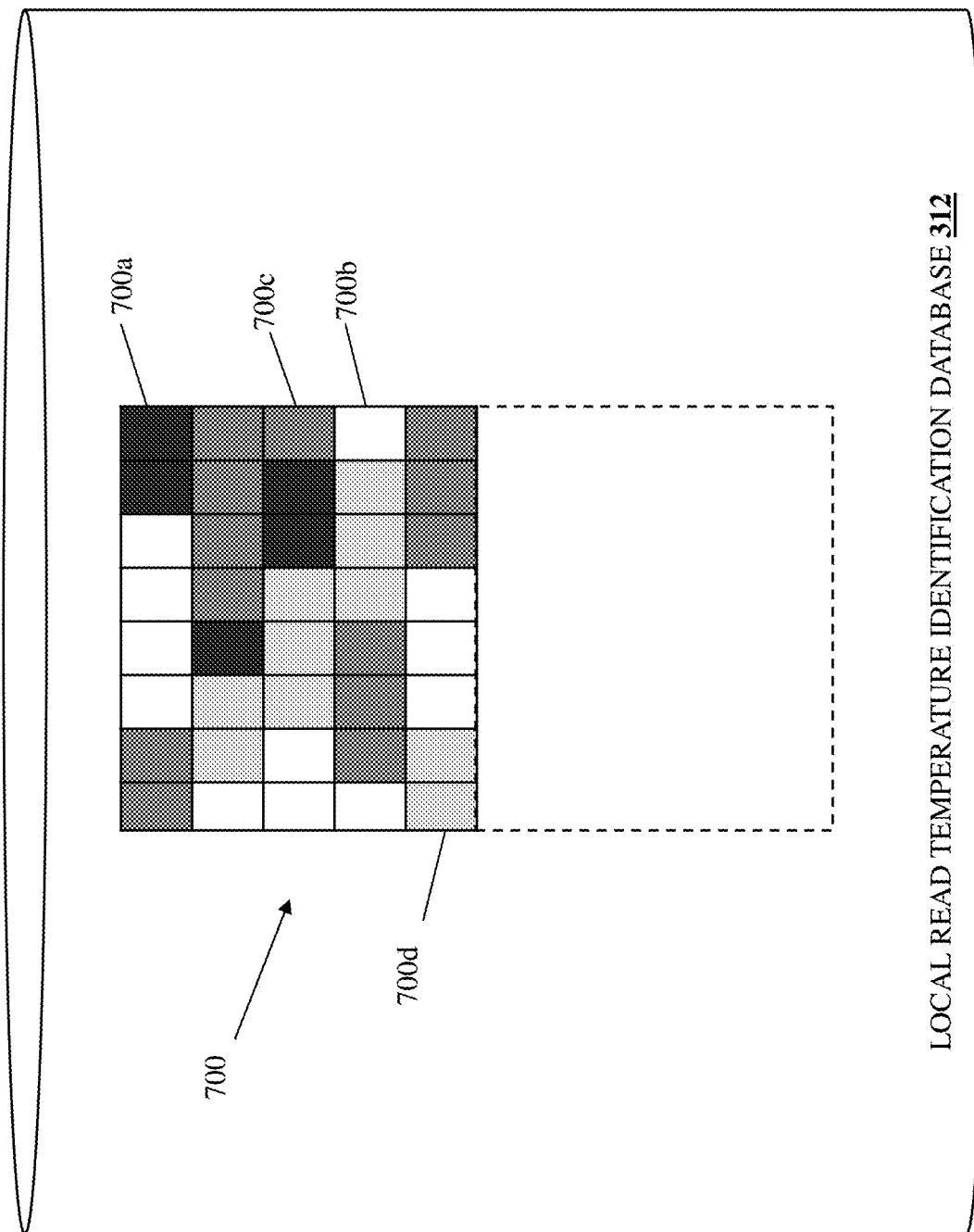
FIG. 7A is a schematic view illustrating an embodiment of local logical storage element read temperature map generated by a first storage device in the computing device of FIG. 2 during the method of FIG. 4.

With reference to FIG. 7A, an example of a local logical storage element read temperature map 700 is illustrated that may have been generated and stored by a first of the storage devices 210a-210c/300 in its local read temperature identification database 312. In the illustrated example, the local logical storage element read temperature map 700 includes relatively high read temperature logical storage elements 700a (illustrated as black boxes in the local logical storage element read temperature map 700), relatively low read temperature logical storage elements 700b (illustrated as white boxes in the local logical storage element read temperature map 700), relatively high-intermediate read temperature logical storage elements 700c (illustrated as dark grey boxes in the local logical storage element read temperature map 700), and relatively low-intermediate read temperature logical storage elements 700d (illustrated as light grey boxes in the local logical storage element read temperature map 700). However, one of skill in the art in possession of the present disclosure will recognize that the inclusion of other levels of read temperature granularity in local logical storage element read temperature maps will fall within the scope of the present disclosure as well. As will be appreciated by one of skill in the art in possession of the present disclosure, the dashed line in FIG. 7A is provided to indicate that the local logical storage element read temperature map 700 is one of a plurality of local logical storage element read temperature maps that provide the total logical storage space for the computing device 200.

Figure 7B:
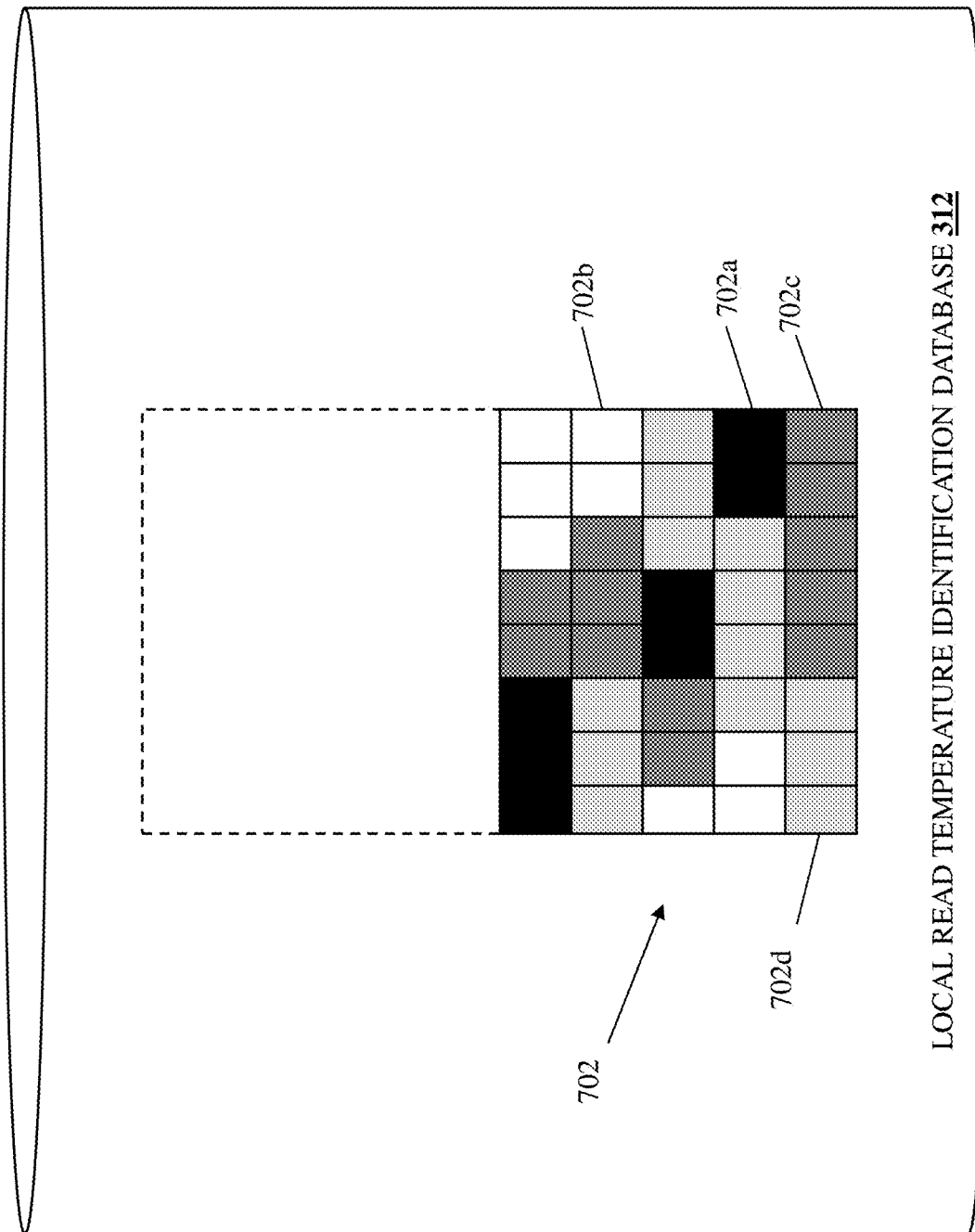
FIG. 7B is a schematic view illustrating an embodiment of local logical storage element read temperature map generated by a second storage device in the computing device of FIG. 2 during the method of FIG. 4.

With reference to FIG. 7B, an example of a local logical storage element read temperature map 702 is illustrated that may have been generated and stored by a second of the storage devices 210a-210c/300 in its local read temperature identification database 312. In the illustrated example, the local logical storage element read temperature map 702 includes relatively high read temperature logical storage elements 702a (illustrated as black boxes in the local logical storage element read temperature map 702), relatively low read temperature logical storage elements 702b (illustrated as white boxes in the local logical storage element read temperature map 702), relatively high-intermediate read temperature logical storage elements 702c (illustrated as dark grey boxes in the local logical storage element read temperature map 70), and relatively low-intermediate read temperature logical storage elements 702d (illustrated as light grey boxes in the local logical storage element read temperature map 702). However, one of skill in the art in possession of the present disclosure will recognize that the inclusion of other levels of read temperature granularity in local logical storage element read temperature maps will fall within the scope of the present disclosure as well. As will be appreciated by one of skill in the art in possession of the present disclosure, the dashed line in FIG. 7B is provided to indicate that the local logical storage element read temperature map 702 is one of a plurality of local logical storage element read temperature maps that provide the total logical storage space for the computing device 200. Furthermore, while examples of only two local logical storage element read temperature maps 700 and 702 generated by two storage devices are provided, one of skill in the art in possession of the present disclosure will appreciate that storage systems may include many more storage devices, and each of those storage devices may generate a local logical storage element read temperature map while remaining within the scope of the present disclosure as well.

While the embodiments discussed below describe the use of local logical storage element read temperature maps from different storage devices to generate a global logical storage element read temperature map, the inventors of the present disclosure have developed techniques for storage devices to use their local logical storage element read temperature map to move data that are described in U.S. patent application Ser. No. 17/579,689, filed Jan. 20, 2022, the disclosure of which is incorporated by reference herein in its entirety. Furthermore, the global read temperature identification engine 204 (or other host subsystem in the computing device 200) may operate to adjust read temperatures included in the local logical storage element read temperature map based on data characteristics of the data stored in corresponding logical storage elements, and the inventors of the present disclosure describe techniques for host subsystem read temperature adjustments in U.S. patent application Ser. No. 17/580,756, filed Jan. 21, 2022; and U.S. patent application Ser. No. 17/580,888, filed Jan. 21, 2022; the disclosures of which are incorporated by reference herein in their entirety.

Figure 8A:
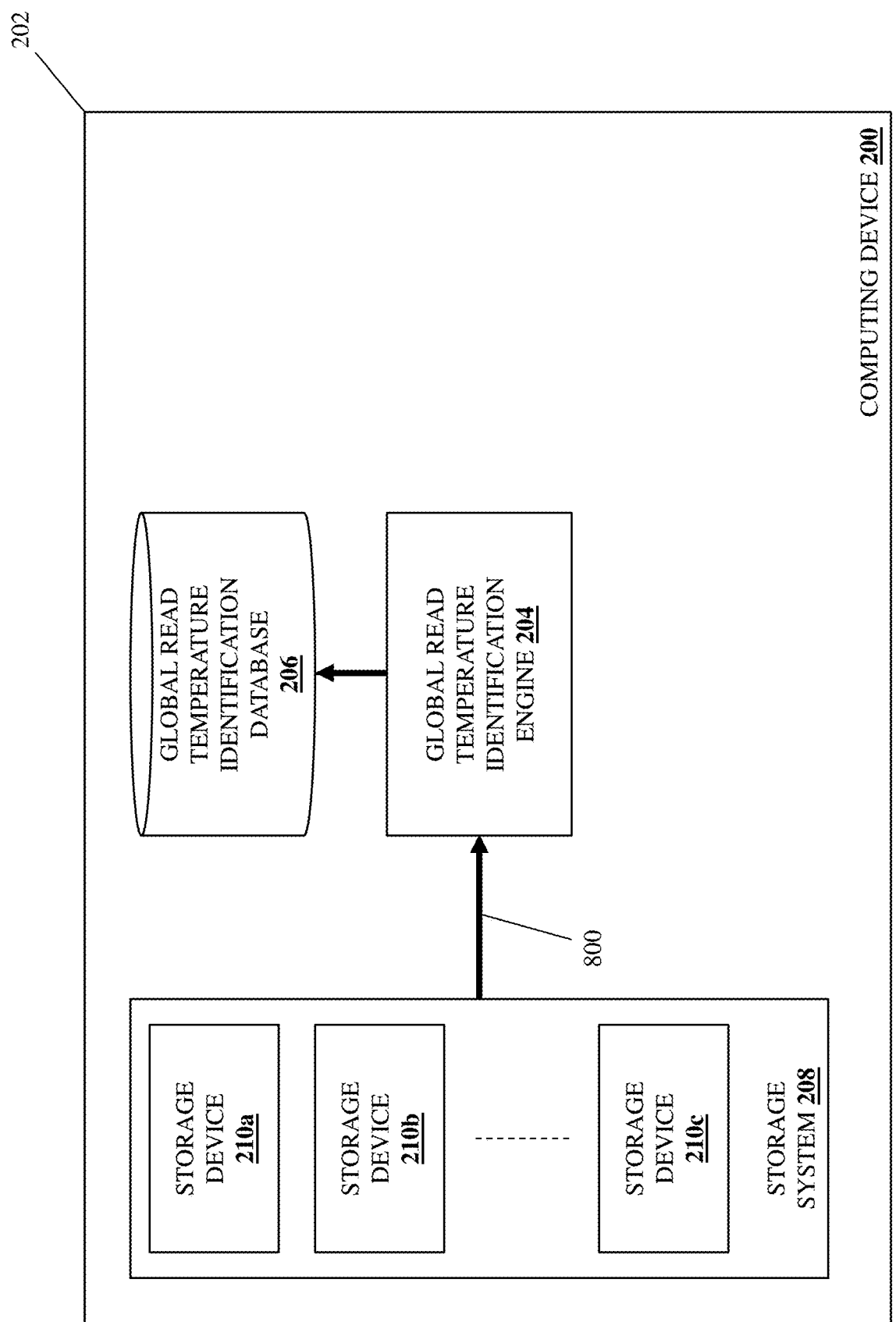
FIG. 8A is a schematic view illustrating an embodiment of the computing device of FIG. 2 operating during the method of FIG. 4.

The method 400 then proceeds to block 410 where a global read temperature identification subsystem retrieves the local logical storage element read temperature map(s) generated by the storage device(s). With reference to FIG. 8A, in an embodiment of block 410, the global read temperature identification engine 204 in the computing device 200 may perform local logical storage element read temperature map retrieval operations 800 in order to retrieve the local logical storage element read temperature maps generated and stored by the storage devices 210a, 210b, and up to 210c at blocks 406 and 408. The inventors of the present disclosure have developed several techniques for accessing and utilizing local logical storage element read temperature maps, information provided therein, and/or associated information, which are described in U.S. patent application Ser. No. 17/579,282, filed Jan. 19, 2022; and U.S. patent application Ser. No. 17/579,020, filed Jan. 19, 2022; the disclosures of which are incorporated by reference herein in their entirety.

As will be appreciated by one of skill in the art in possession of the present disclosure, in some examples the global read temperature identification engine 204 in the computing device 200 may access the local read temperature identification databases 312 in the first memory system 308 in each of the storage devices 210a-210c/300 in order to retrieve the local logical storage element read temperature maps stored therein, while in other embodiments the global read temperature identification engine 204 in the computing device 200 may provide requests for those local logical storage element read temperature maps such that each of the storage devices 210a-210c/300 transmit them to the global read temperature identification engine 204.

Figure 8B:
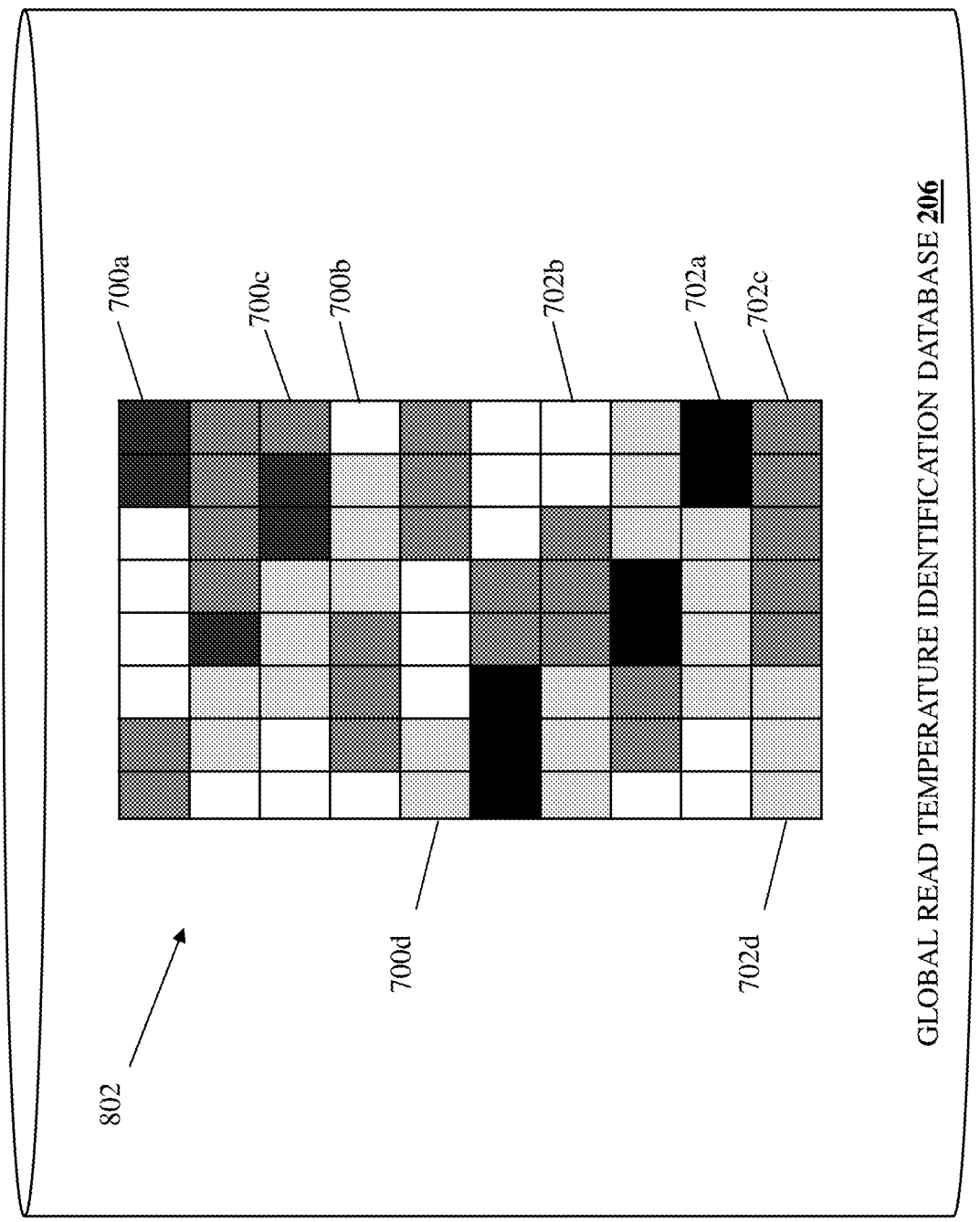
FIG. 8B is a schematic view illustrating an embodiment of global logical storage element read temperature map generated by the computing device of FIG. 2 during the method of FIG. 4.

The method 400 then proceeds to block 412 where the global read temperature identification subsystem uses the local logical storage element read temperature map(s) to generate a global logical storage element read temperature map, as well as to optional block 414 where the global read temperature identification subsystem stores the global logical storage element read temperature map. In some embodiment, at block 412, the global read temperature identification engine 204 in the computing device 200 may concatenate (or otherwise combine) the local logical storage element read temperature maps retrieved from the storage devices 210a-210c/300 to generate a global logical storage element read temperature map that it then stores in the global read temperature identification database 206. For example, FIG. 8B illustrates an example of a global logical storage element read temperature map 802 that may have been generated by the global read temperature identification engine 204 via concatenation (or other combination) of the local logical storage element read temperature maps 700 and 702 discussed above with reference to FIGS. 7A and 7B, and then stored by the global read temperature identification engine 204 in its global read temperature identification database 312.

However, one of skill in the art in possession of the present disclosure will appreciate how the generation of a global logical storage element read temperature map via concatenation (or other combination) of local logical storage element read temperature maps provides a simplified example of the use of local logical storage element read temperature maps to generate a global logical storage element read temperature map, and that the local logical storage element read temperature maps discussed above may be utilized to generate the global logical storage element read temperature map in other manners that will fall within the scope of the present disclosure as well. For example, the generation of the global logical storage element read temperature map using the local logical storage element read temperature maps may depend on how the global read temperature identification engine 204 is configured to track read temperatures, how the global read temperature identification engine 204 is configured to organize data (e.g., data may be "striped" across the storage devices 210a-210c), and/or based on other factors that would be apparent to one of skill in the art in possession of the present disclosure.

For example, in some embodiments the computing device 200 may store data in the storage devices 210a-210b independently of each other (e.g., as the logical blocks discussed above), in which case the generation of the global logical storage element read temperature map via concatenation (or other combination) of local logical storage element read temperature maps may be appropriate. However, in other embodiments, the computing device 200 may utilize more complex software that organizes the storage of the data in the storage devices 210a-210c in "groups" of logical blocks. For example, for performance considerations a data group of data A, B, and C may be provided by three respective logical blocks, and may be written to each of three respective storage devices, but the computing device 200 may view that data group as "atomic" such that the read temperature that matters is the read temperature of that data group. In such an embodiment, a "higher level" "group global logical storage element read temperature map" may be generated in order to allow the tracking of data group read temperatures, and the inventors of the present disclosure are developing techniques for doing so. One example of such an embodiment is a Redundant Array of Independent Drives (RAID) storage system, but one of skill in the art in possession of the present disclosure will appreciate that other storage systems may introduce similar considerations as well.

Furthermore, the inventors of the present disclosure have developed techniques for generating global logical storage element read temperature maps using local logical storage element read temperature maps which are described in U.S. patent application Ser. No. 17/579,020, filed Jan. 19, 2022, the disclosure of which is incorporated by reference herein in its entirety. As described in that patent document, data in local logical storage element read temperature maps generated by different storage devices may be scaled relative to each other so that the read temperatures of storage locations in different storage devices with different utilizations (e.g., a first storage device with one million reads and a second storage device with ten million reads) may be accurately compared relative to each other (i.e., "hot" storage locations in the first storage device with one million reads may not be "hot" relative to "hot" storage locations in the second storage device with ten million reads).

In some embodiments, a subset of the local logical storage element read temperature maps generated by the storage devices 210a-210c may be retrieved and used by the global read temperature identification engine 204 at block 412. For instance, if the memory system in the computing device 300 does not have sufficient space to store the global logical storage element read temperature map (or for other reasons that memory space is allocated for the storage of other data), a global logical storage element read temperature map may be generated that only identifies logical storage elements with relatively "hot" red temperatures. As such, in some embodiments, the local logical storage element read temperature maps retrieved from the storage devices 210a-210c may only identify logical storage elements having a particular read temperature (e.g., those with relatively "hot" read temperatures), allowing for the generation of the global logical storage element read temperature map identifying logical storage elements with that particular temperature as well. However, in other embodiments, the global read temperature identification engine 204 may be configured to retrieve the local logical storage element read temperature map(s) from the storage devices 210a-210c, and then utilize a filter to generate a filtered global logical storage element read temperature map that identifies particular read temperatures from the local logical storage element read temperature map(s).

In an embodiment, following block 412, the computing device 200 (e.g., the processing system in the computing device 200) may utilize the global logical storage element read temperature map (which may have been stored in the global read temperature identification database 206) in order to provide for the storage of data, movement of data, and/or other data operations that would be apparent to one of skill in the art in possession of the present disclosure. For example, data stored in NAND rows with relatively high read temperatures may be moved to relatively high capability/cost storage devices, data stored in NAND rows with relatively low read temperatures may be moved to relatively low capability/cost storage devices, data stored in NAND rows with relatively intermediate read temperatures may be moved to relatively intermediate capability/cost storage devices, etc. In another example, the computing device 200 (e.g., the processing system in the computing device 200) may utilize the global logical storage element read temperature map in order to perform load balancing (e.g., when the storage devices 210*a*-210*c* are the same type of capability/cost storage device, load balancing reads to those storage devices can result in a higher performing storage system (relative to the performance of that storage system without the load balancing). However, while a few specific examples of operations based on identified read temperatures have been described, one of skill in the art in possession of the present disclosure will appreciate how the read temperatures identified in the global logical storage element read temperature map may be utilized to perform any of a variety of read-temperature-based operations while remaining within the scope of the present disclosure as well.

As will be appreciated by one of skill in the art in possession of the present disclosure, global read temperature identification engine 204 that created the global logical storage element read temperature map 802 may perform any of the read-temperature-based operations discussed above. However, one of skill in the art in possession of the present disclosure will also recognize that other subsystems in the computing device 200 (i.e., other than the global read temperature identification engine 204) may perform the read-temperature-based operations discussed above while remaining within the scope of the present disclosure. Furthermore, subsystems outside the computing device 200 may perform the read-temperature-based operations discussed above while remaining within the scope of the present disclosure as well. As such, access to the global logical storage element read temperature map 802 and/or the local logical storage element read temperature maps 700 and 702 may be provided to subsystems other than the storage devices and global read temperature identification engine 204 discussed above, allowing the information stored therein (as well as information used to generated those maps) to be utilized by those other subsystems in any of a variety of manners that will be apparent to one of skill in the art in possession of the present disclosure.

Thus, systems and methods have been described that utilize the read disturb effect that produces noise in adjacent NAND rows when any particular NAND row is read to identify NAND rows that are read more often than other NAND rows and thus have higher "read temperatures" than those other NAND rows. For example, the read-disturb-based read temperature identification system of the present disclosure may include storage device(s) that each determine read disturb information for each block in that storage device, use that read disturb information to identify a subset of rows in at least one block in that storage device that have a higher read temperature than the other rows in the at least one block in that storage device and, based on that identification, generate and store a local logical storage element read temperature map that identifies a subset of logical storage elements associated with that storage device that have a higher read temperature than the other logical storage elements associated with that storage device. A global read temperature identification subsystem coupled to the storage device(s) may then retrieve the local logical storage element read temperature map generated by each of the storage device(s) and use them to generate a global logical storage element read temperature map.

As such, the read disturb effect that happens automatically in response to conventional read operations and that persists across power cycles may be leveraged to generate read temperature maps for storage devices and storage systems, thus addressing many of the issues with conventional read temperature identification systems discussed above. As will be appreciated by one of skill in the art in possession of the present disclosure, systems and methods of the present disclosure allow a determination of the relative read temperatures of data within storage devices by the storage device themselves (i.e., without requiring processing cycles of a host processor in the server device and/or storage system in which they are located), and with the advent of Storage Class Memory (SCM) devices and low-cost NAND devices that is causing the storage landscape to fracture further than it already has, the opportunity and value associated with placing particular data in the most efficient storage media has increased, and may be realized with the novel read-disturb-based read temperature identification techniques described herein.

Figure 9:
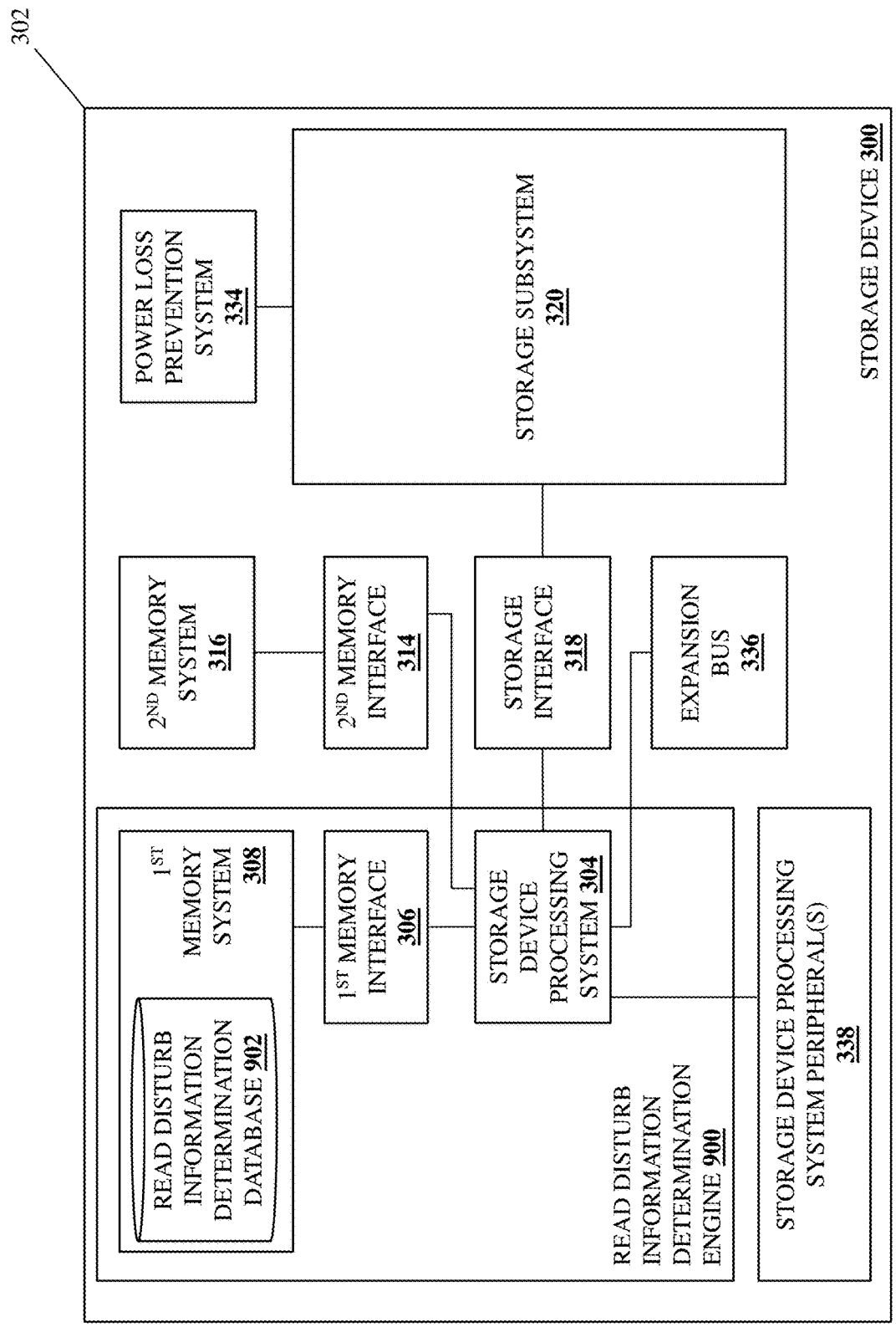
FIG. 9 is a schematic view illustrating an embodiment of a storage device that may be included in the computing device of FIG. 2 and that may provide the read disturb information determination system of the present disclosure.

Referring now to FIG. 9, an embodiment of the storage device 300 discussed above with reference to FIGS. 3A-3E is illustrated. In the embodiments illustrated and discussed below, the first memory system 308 may include instructions that, when executed by the storage processing system 304, cause the storage device processing system 304 to provide a read disturb information determination engine 900 that is configured to perform the functionality of the read disturb information determination engines and/or storage devices discussed below. For example, the local read temperature identification engine 310 discussed above and the read disturb information determination engine 900 described below may be integrated as part of the same engine, although systems with separate local read temperature identification engines and read disturb information determination engines are envisioned as falling within the scope of the present disclosure as well.

As also illustrated in the specific examples provided herein, the first memory system 308 may also include a read disturb information determination database 902 that is configured to store any of the information utilized by the read disturb information determination engine 900 discussed below. For example, the local read temperature identification database 312 discussed above and the read disturb information determination database 902 described below may be integrated as part of the same database, although systems with separate local read temperature identification databases and read disturb information determination databases are envisioned as falling within the scope of the present disclosure as well. Furthermore, one of skill in the art in possession of the present disclosure will recognize that other embodiments of the present disclosure may provide the read disturb information determination database 902 in other locations while remaining within the scope of the present disclosure as well. For example, the read disturb information determination database 902 may be provided by the second memory system 316 while remaining within the scope of the present disclosure as well. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

Figure 10:
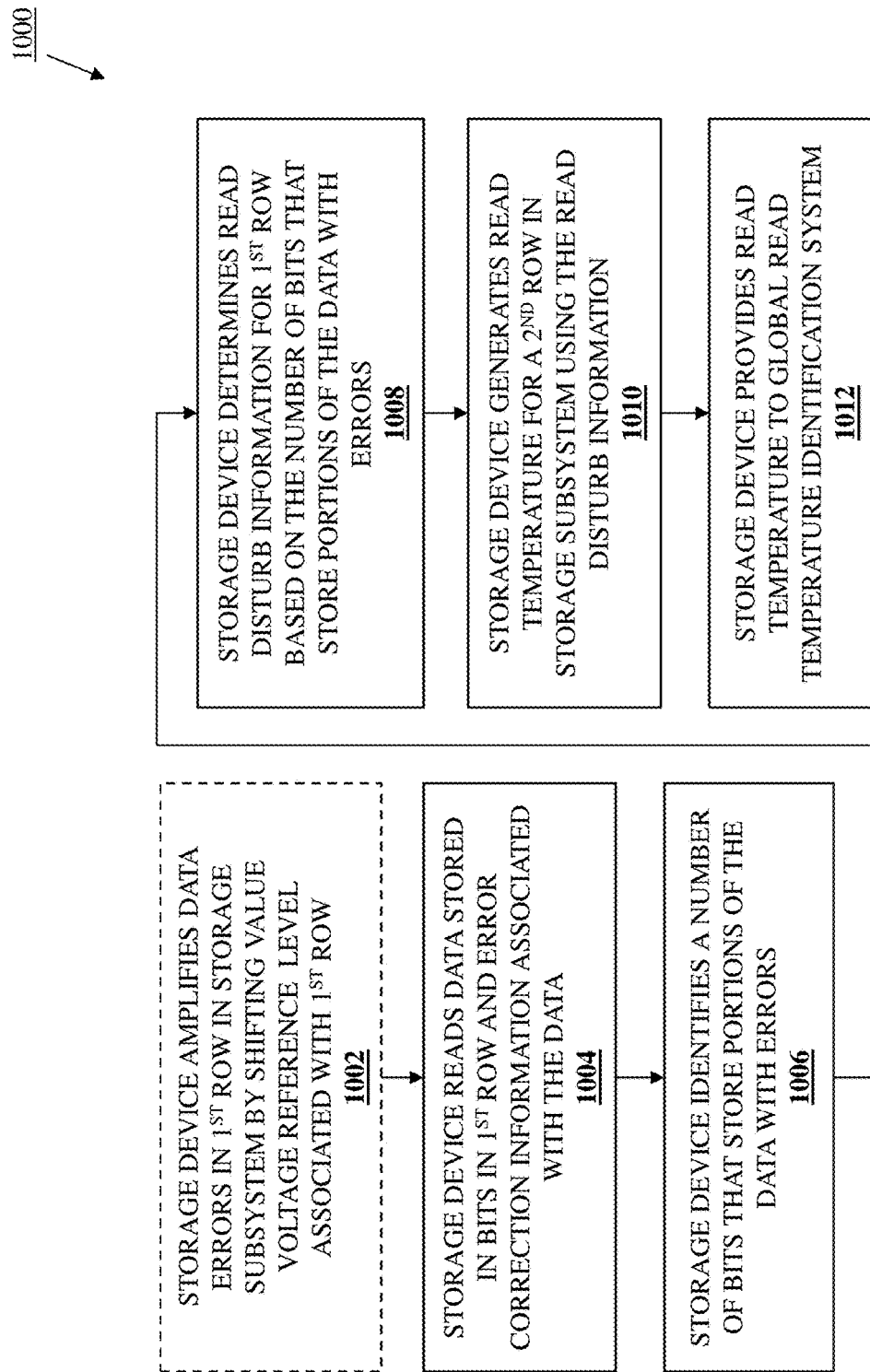
FIG. 10 is a flow chart illustrating an embodiment of a method for determining read disturb information.

With reference to FIG. 10, an embodiment of a method 1000 for determining read disturb information is illustrated. As discussed below, the systems and methods of the present disclosure provide for the determination of read disturb information for a row in a storage subsystem based on bits that are provided in that row and that store data with errors, with some embodiments of the method identifying the bits storing data with errors based on a default value voltage reference level, and other embodiments of the method identifying the bits storing data with errors by amplifying those errors via the shifting of the value voltage reference level associated with the row. For example, some embodiments of the present disclosure provide a read disturb information determination system that includes a storage device coupled to a global read temperature identification system. The storage device reads, from a first row in a storage subsystem in the storage device, data stored in bits that were previously identified as being susceptible to read disturb effects, and error correction information associated with the data. The storage device uses the error correction information to identify a number of the bits that store portions of the data with errors and, based on the number of bits that store portions of the data with errors, determines read disturb information for the first row in the storage subsystem in the storage device. The storage device then uses the read disturb information to generate a read temperature for a second row in the storage subsystem in the storage device, and provides the read temperature to the global read temperature identification system.

In another example, other embodiments of the present disclosure provide an amplification-based read disturb information determination system that includes a storage device coupled to a global read temperature identification system. The storage device amplifies data errors in a first row in its storage subsystem by shifting a first value voltage reference level associated with the first row to provide a second value voltage reference level, reads data stored in bits provided in the first row and error correction information associated with the data, and uses the error correction information to identify a number of the bits that store portions of the data with errors. For the first row and based on the number of bits that store portions of the data with errors, the storage device determines read disturb information and uses it to generate a read temperature for a second row in its storage subsystem that it provides to the global read temperature identification system. As such, read disturb information may be determined based on data errors that may be determined based on a default value voltage reference level, or that may be determined via amplification of those data errors by the shifting of the default value voltage reference level.

Figure 11A:
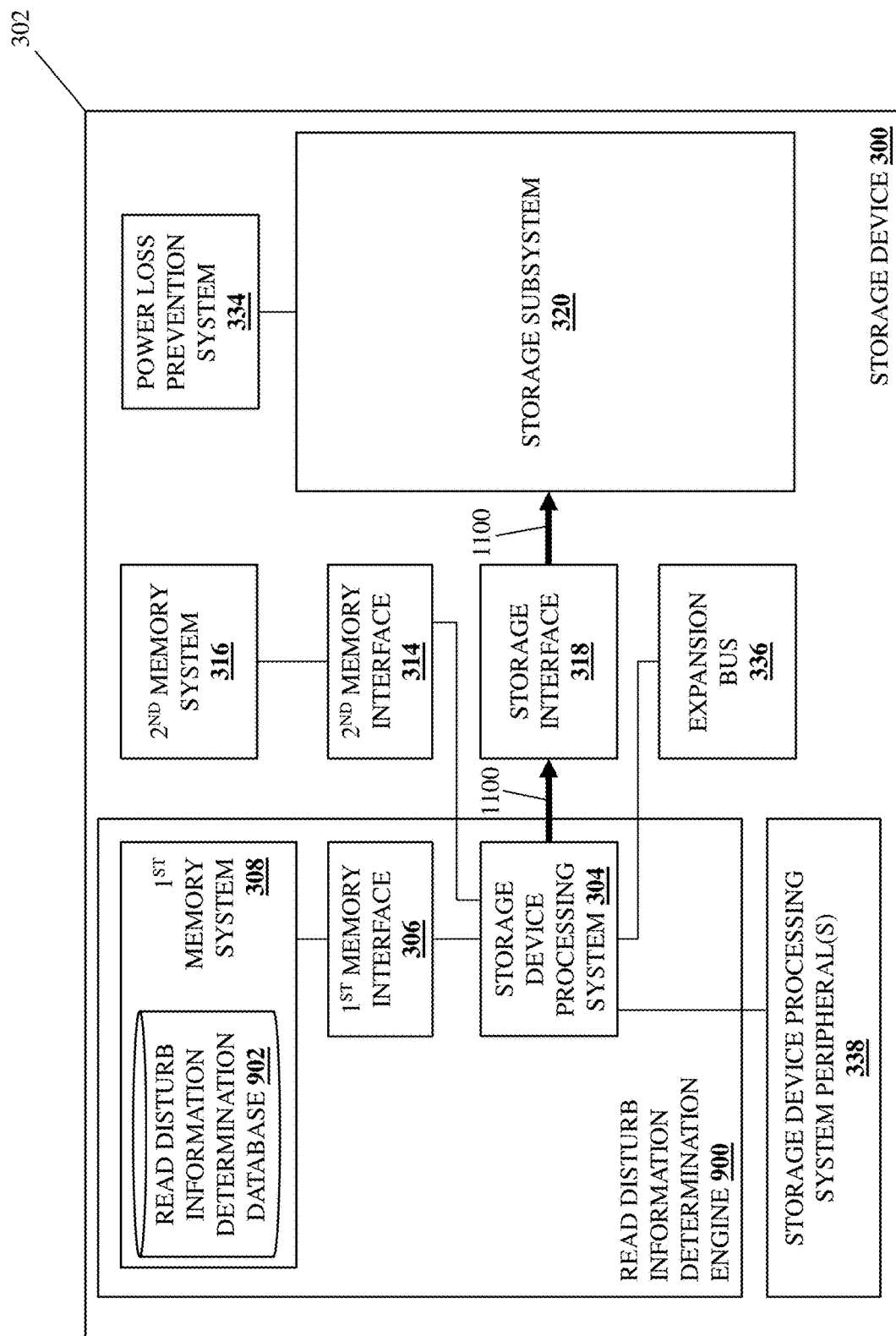
FIG. 11A is a schematic view illustrating an embodiment of the storage device of FIG. 9 operating during the method of FIG. 10.

In embodiments in which the method 1000 provides for amplification-based read disturb information determination, the method 1000 may begin at optional block 1002 where a storage device may amplify data errors in a first row of a storage subsystem by shifting a value voltage reference level associated with that first row. With reference to FIG. 11A, in an embodiment of optional block 1002, the storage device processing system 304 that provides the read disturb information determination engine 900 may perform data error amplification operations 1100 that may include accessing the storage subsystem 320 via the storage interface 318 to shift a default value voltage reference level associated with a NAND row 332 in the storage subsystem 320 in order to amplify errors associated with data stored in bits provided in different values in that NAND row 332.

Figure 12:
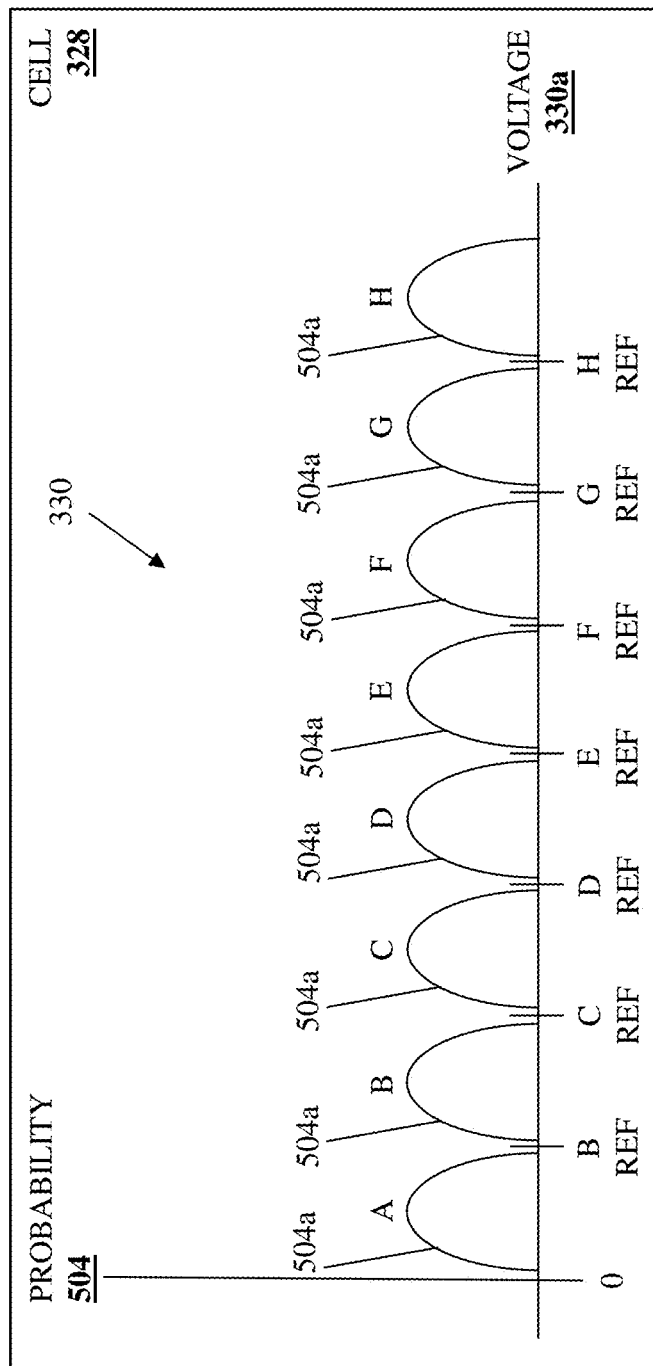
FIG. 12 is a graph view illustrating an embodiment of voltages/values available in a cell of a NAND row included in the storage device of FIG. 9.

For example, with reference to FIG. 12, the simplified representation of how data may be stored in a cell 328 from FIG. 3D is reproduced with the voltage/value probabilities 504a for each value "A"–"H" available in the cell 328 as described above with reference to FIG. 5C. Similarly as discussed above, FIG. 12 illustrates a plurality of "default" value voltage reference levels, including a default "B REF" value voltage reference level between values "A" and "B", a default "C REF" value voltage reference level between values "B" and "C", a default "D REF" value voltage reference level between values "C" and "D", a default "E REF" value voltage reference level between values "D" and "E", a default "F REF" value voltage reference level between values "E" and "F", a default "G REF" value voltage reference level between values "F" and "G", and a default "H REF" value voltage reference level between values "G" and "H". As will be appreciated by one of skill in the art in possession of the present disclosure, each of the default value voltage reference levels may be defined for the cell 328 such that adjacent values in the cell may be distinguished based on that default value voltage reference level (e.g., voltages below the default "B REF" value voltage reference level provide an "A value", and voltages above the default "B REF" value voltage reference level provide a "B value").

In the examples below, each of the eight values available in the cell 328 may represent 3 bits of data: an "upper" bit, a "middle" bit", and a "lower" bit (e.g., a value may represent 3 bits "xyz", with x providing the "upper" bit, y providing the "middle" bit, and z providing the "lower" bit). Furthermore, in the examples below 3 pages may be provided in the cell 328 for respective bits represented by the eight values (e.g., an "upper" page with a specific "upper" bit each provided by a single cell where each of the eight values provides a single bit ("1" or "0") to the page, a "middle" page with the "middle" bit provided by a single cell where each of the eight values provides a single bit ("1" or "0") to the page, and a "lower" page with the "lower" bit provided by a single cell where each of the eight values provides a single bit ("1" or "0") to the page). However, while a specific example is provided, one of skill in the art in possession of the present disclosure will appreciate how different bit/page configurations for cells may be defined and utilized with teachings of the present disclosure while remaining within its scope.

As discussed above with reference to FIG. 5C, the read disturb effect can produce skewing in the voltage/value probability 504a for any particular value that will cause any particular value to be read as an adjacent value (e.g., repeated reads of the cell 328 may skew the voltage/value probability 504a for the "A" value such that it crosses the default "B REF" value voltage reference level between values "A" and "B" as illustrated in FIG. 5C, which one of skill in the art in possession of the present disclosure will recognize can cause the 3 bits "111" represented by value "A" to be read as "110"). As will be appreciated by one of skill in the art in possession of the present disclosure, such situations produce an error associated with the value being read (i.e., when the "lower" bit "1" in the 3 bits "111" represented by the value "A" is read as a "0" in the example above), and as discussed below may be detected (as a "flipped" bit, i.e., a bit that flipped from "1" to "0") using error correction information such as the error correction data discussed above.

As will be appreciated by one of skill in the art in possession of the present disclosure, optional block 1002 of the amplification-based read disturb information determination method 1000 recognizes that some situations may benefit from the amplification of read-disturb induced data errors. For example, relatively early on in the repeated reading of any particular data, the read disturb effect may begin to build in the cells that store that data, but may not be significant enough to skew voltage/value probabilities for that data enough to produce the errors discussed above. As such, the reading of data a relatively high number of times may not be detectable based on the read-disturb effect early on in the lifetime of a cell (i.e., before use/aging degrades the cell and allows the read disturb effect to become more pronounced), and amplification of errors associated with that data may be performed to allow the detection of the relatively high number of reads of that data.

Figure 13:
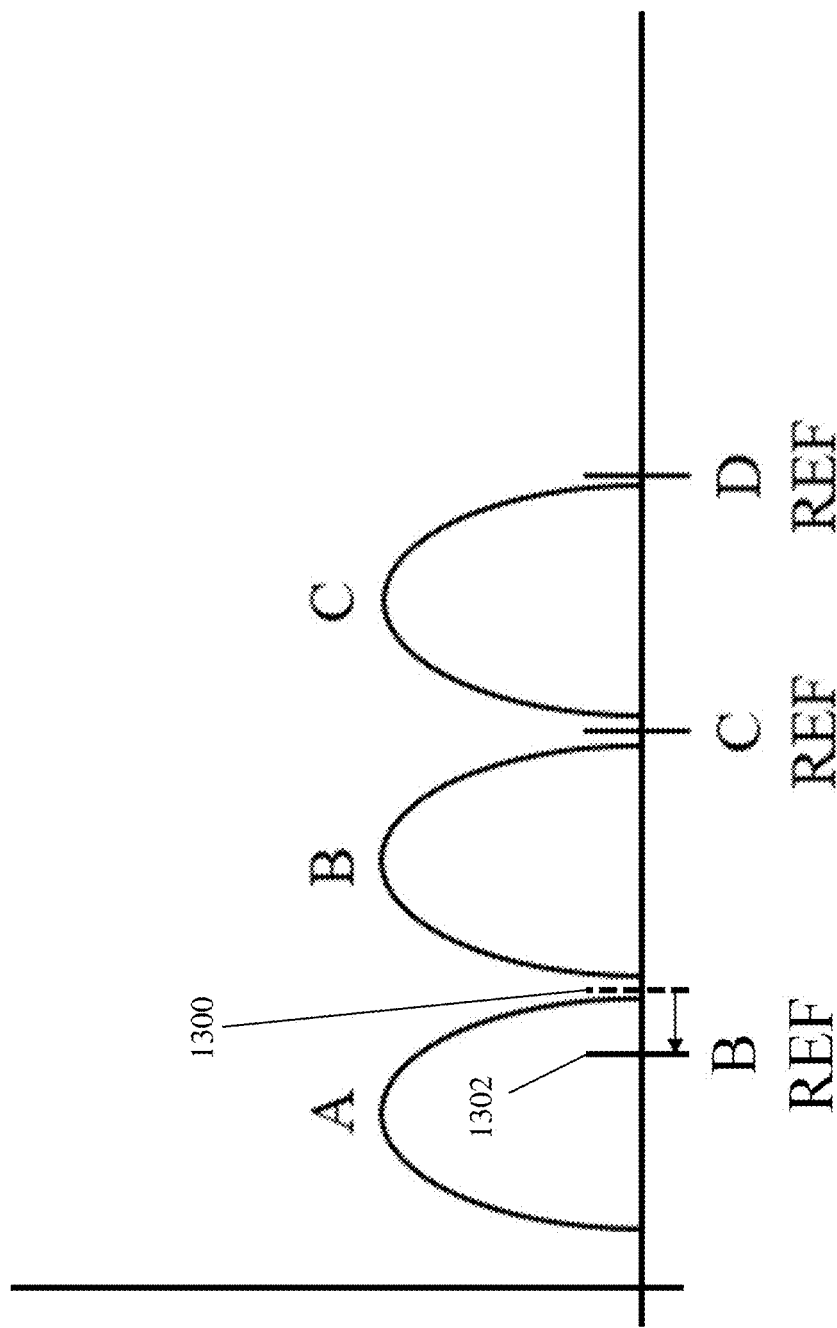
FIG. 13 is a schematic view illustrating an embodiment of the amplification of errors due to the read disturb effect via the shifting of a value voltage reference level during the method of FIG. 10.

With reference to FIG. 13, the data error amplification operations 1100 performed at optional block 1102 may cause a default "B REF" value voltage reference level 1300 (illustrated by a dashed line in FIG. 13) to be shifted to provide a shifted "B REF" value voltage reference level 1302 (illustrated by a solid line in FIG. 13). As will be appreciated by one of skill in the art in possession of the present disclosure, using the shifted "B REF" value voltage reference level 1302 (particularly when the early lifetime voltage distribution in the cell 328 is relatively "tight" or "narrow"), errors associated with the reading of the value "A" are more likely to occur even in the early lifetime of a cell due to read disturb effects. As will be appreciated by one of skill in the art in possession of the present disclosure, each of the default value voltage reference levels may be individually programmable, and thus the operations discussed above to shift the default "B REF" value voltage reference level may be performed on any of the other default value voltage reference levels "A" and "C"–"H". Furthermore, as illustrated in FIG. 5C, read disturb effects may be more pronounced for different values (e.g., the "lower" values "A", "B", etc.), and thus a subset of default value voltage reference levels (as well as a single default value voltage reference level in some examples) may be shifted to amplify errors for particular values while remaining within the scope of the present disclosure.

Furthermore, the data error amplification operations discussed above may be performed multiple times to focus that amplification in a manner that produces discernable data errors that allow for the identification of those errors in determining read disturb information, discussed in further detail below. For example, an initial amplification operation may be performed at a "highest" value voltage reference level shift that operates to shift the default value voltage reference level as far as is possible. However, in the event that "highest" value voltage reference level shift produces uncorrectable errors (i.e., by producing a number of errors that exceeds the abilities of the error correction information to identify), the value voltage reference level shift may be reduced such that less errors are produced, and that process may be repeated until only correctable errors result. As such, one of skill in the art in possession of the present disclosure will appreciate how the shifting of the value voltage reference level at optional block 1002 may be adjusted based on the error detection operations described below, and thus the value voltage reference level shifts may be performed to increase the number of correctable errors (relative to the number of correctable errors that are identified at the default value voltage reference level) in order to amplify the read disturb effects on the cell 328 to a desired level.

Figure 11B:
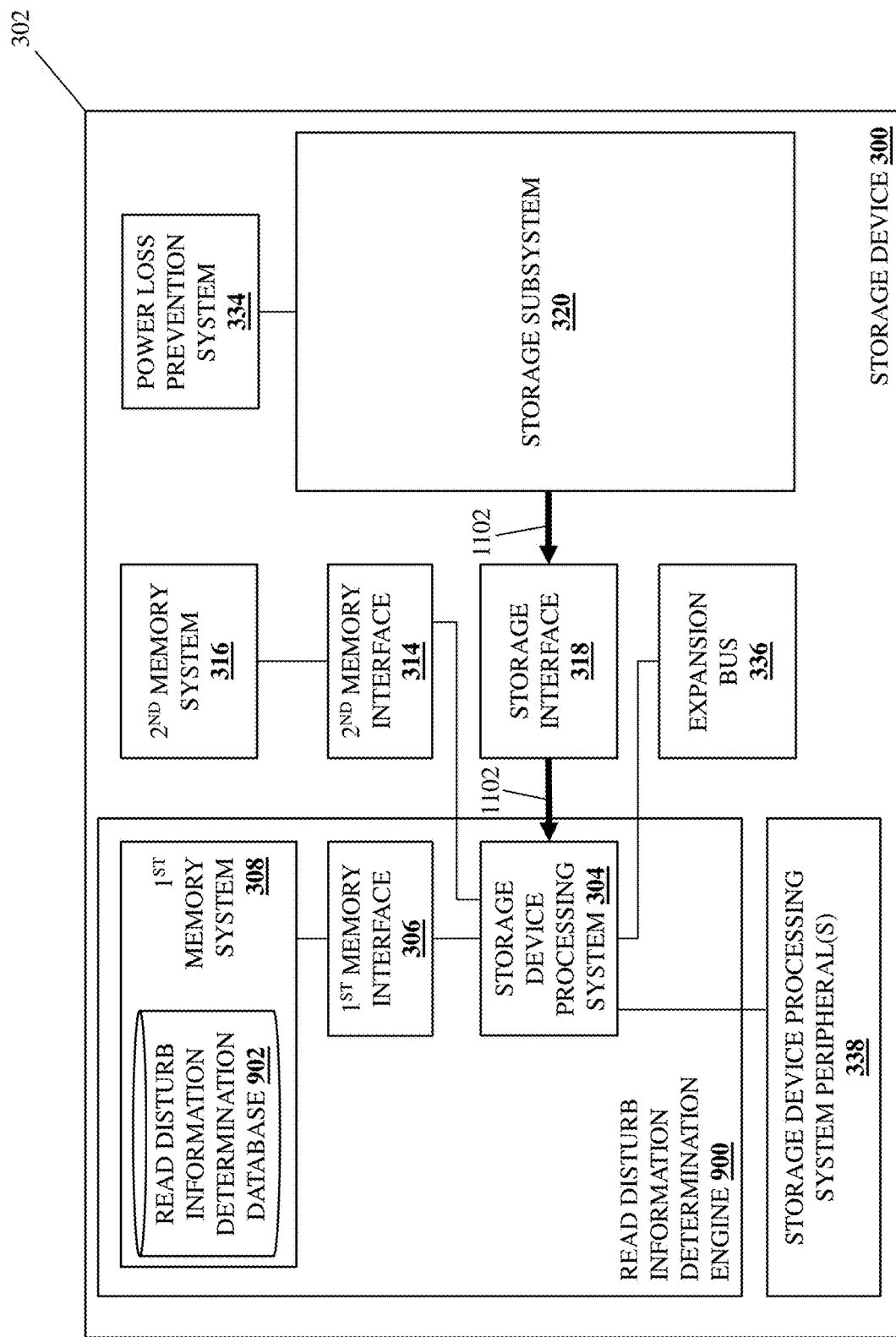
FIG. 11B is a schematic view illustrating an embodiment of the storage device of FIG. 9 operating during the method of FIG. 10.

The method 1000 may then proceed to (i.e., following optional block 1002) or begin at (in embodiments in which optional block 1002 is not performed) block 1004 where the storage device reads data stored in bits in the first row and error correction information associated with the data. With reference to FIG. 11B, in an embodiment of block 1004, the storage device processing system 304 that provides the read disturb information determination engine 900 may perform data read operations 1102 that may include accessing the storage subsystem 320 via the storage interface 318 and reading at least some data and corresponding error correction information (sometimes called a "code word", which refers to data and the error correction information that is configured to correct errors that may have been introduced in that data) from a NAND row 332 in the storage subsystem 320. In some embodiments, at block 1004 all the data in a NAND row 332 may be read along with its corresponding error correction information. However, in other embodiments, at block 1004 a subset of the data in a NAND row 332 may be read along with its corresponding error correction information, with that subset of the data treated as a "representative subset" of the NAND row 332 that is assumed to experience read disturb effects that are consistent with the data stored in other cells in that NAND row.

As will be appreciated by one of skill in the art in possession of the present disclosure, the read disturb effect in any particular cell will be more pronounced in the "lower" distributions represented by each of the values in that cell. As such, with reference to the cell 328 discussed above with reference to FIG. 12, the "lower" page including bits determined by the lowest distribution transition (i.e., the "A" value distribution and "B" value distribution in FIG. 12) with the bits represented by the eight values "A"–"H" may be read as the subset of the data in the NAND row 332 discussed above in order to reduce the amount of data that must be read in order to determine the read disturb information as discussed below. However, while a specific subset of bits are described as being susceptible to the read disturb effects, one of skill in the art in possession of the present disclosure will appreciate how bits susceptible to the read disturb effects may depend on the specific NAND technology being used and that may be determined in a variety of manners, and the identification of read-disturb-susceptible bits may be performed in a variety of manners to determine which bits to read as a subset of data in a NAND row. Furthermore, in situations in which a subset of data in NAND rows are read to determine read disturb information, the subset read in each NAND row may be consistent across the NAND rows (e.g., the "lower" pages/bits will be read in each of the NAND rows in order to determine read disturb information for each of those NAND rows).

The method 1000 then proceeds to block 1006 where the storage device identifies a number of bits that store portions of the data with errors. In embodiments in which the data error amplification described above with reference to optional block 1002 is not performed, the storage device processing system 304 that provides the read disturb information determination engine 900 may perform data error identification operations that include using the data and error correction information read at block 1004 along with the default value voltage reference levels described above to identify bits that store portions of the data with errors. As discussed above, the read disturb effect can produce skewing in the voltage/value probability for any particular value in a cell across its associated default value voltage reference level and that will cause that particular value to be read as an adjacent value, which may result in the 3 bits "111" represented by the value "A" to be read as "110", as described in the example above. As such, for each bit that stores a portion of the data read at block 1004, the data error identification operations may include using the error correction information read along with the data to determine a number of bits that store portions of the data with errors (i.e., a number of bits that have "flipped" from an expected value to an unexpected value, such as the "flip" from "1" to "0" in the "lower" bit in the example above) that are based on the default value voltage reference level.

In embodiments in which the data error amplification described above with reference to optional block 1002 is performed, the storage device processing system 304 that provides the read disturb information determination engine 900 may perform data error identification operations that include using the data and error correction information read at block 1004 along with the shifted value voltage reference levels described above to identify bits that store portions of the data with errors. As discussed above, the read disturb effect can produce skewing in the voltage/value probability for any particular value in a cell across its associated shifted value voltage reference level and that will cause that particular value to be read as an adjacent value, which may result in the 3 bits "111" represented by the value "A" to be read as "110", as described in the example above. As such, for each bit that stores a portion of the data read at block 1004, the data error identification operations may include using the error correction information read along with the data to determine a number of bits that store portions of the data with amplified errors (i.e., a number of bits that have "flipped" from an expected value to an unexpected value, such as the "flip" from "1" to "0" in the "lower" bit in the example above) that are based on the shifted value voltage reference level.

As discussed above, in some cases the number of errors in bits storing data read at block 1004 may exceed the capabilities of the error correction information to correct (and thus identify), which may result in the data error identification operations detecting "uncorrectable" errors (i.e., the number of errors associated with the data may be identified as "out of correctable range" of the error correction information). As will be appreciated by one of skill in the art in possession of the present disclosure, an "uncorrectable" error situation may prevent the identification of a number of bits that store portions of the data with errors, as the capabilities of the error correction information will be exceeded by the number of errors in the data read at block 1004 such that the number of those errors simply cannot be identified. As will be appreciated by one of skill in the art in possession of the present disclosure, such an uncorrectable error situation may result from the read disturb effect, temperature changes, dwell times, physical defects, and/or other error events known in the art, and it may not be possible to determine the cause of such uncorrectable errors on a single read and without some history of the data at issue.

In embodiments in which the method utilizes the default value voltage reference level, such an uncorrectable error situation may be dealt with by accessing a prior history of errors associated with the data, and using a number of errors in the most recent situation in which that number of errors was correctable (particularly when that history of errors indicates that the errors were increasing rapidly). In another example, such an uncorrectable error situation may be addressed by shifting the default value voltage reference level (discussed above) in order to de-amplify the errors to a level that allows the error correction information to correct/identify those errors. However, while two specific examples of dealing with uncorrectable error situation have been described, one of skill in the art in possession of the present disclosure will appreciate how other techniques may be utilized to deal with uncorrectable error situations while remaining within the scope of the present disclosure as well. As discussed above, in embodiments in which the method utilizes the shifted value voltage reference level, any uncorrectable error situation may be addressed by shifting the shifted value voltage reference level (discussed above) in order to de-amplify the errors to a level that allows the error correction information to correct/identify those errors.

Furthermore, in specific examples, the amount and direction of value voltage reference level shifts can be utilized along with corresponding error numbers (e.g., flipped bit counts) to identify read disturb information. For example, particular error numbers (e.g., 50 flipped bits) identified at particular value voltage reference level shifts (e.g., +4, −8) may be utilized to differentiate the likelihood of the existence of read disturb effects (even though the error numbers are the same for each of the value voltage reference level shifts). For example, 100 flipped bits at the default reference level (e.g., 0) and 50 flipped bits at a first shifted reference level (e.g., +4) might be indicative of a read disturb event, while 100 flipped bits at the default reference level (e.g., 0) and 50 flipped bits at a second shifted reference level (e.g., −8) might be indicative of a data retention event or aging event. Furthermore, if the maximum shift of the reference level is −10, then the second shifted reference level of −8 in the example above may indicate that the data may soon be uncorrectable and should be moved as soon as possible.

As such, following block 1006, the storage device processing system 304 that provides the read disturb information determination engine 900 may have identified a number of bits that store data with errors, i.e., "flipped" bits in the data read at block 1004. As will be appreciated by one of skill in the art in possession of the present disclosure, following the determination of number of bits that store data with errors, the data read at block 1004 may be discarded, as it is the number data errors stored by the bits (i.e., "flipped" bits) that is used to determine the read disturb information, and not the data itself.

The method 1000 then proceeds to block 1008 where the storage device determines read disturb information for the first row based on the number of bits that store portions of the data with errors. In an embodiment, at block 1008 the storage device processing system 304 that provides the read disturb information determination engine 900 may perform read disturb information determination operations to determine read disturb information for the NAND row 332 based on the number of bits that store portions of the data read at block 1004 with errors. As discussed above with reference to FIG. 5B, the "flipping" of bits in a NAND row 332 result in a fail bit count for that NAND row 332 that may provide the read disturb information for that NAND row 332. As such, the read disturb information determined for the NAND row 332 at block 1008 may be the number of bits in that NAND row 332 that were identified as storing portions of the data read at block 1004 with errors, some conversion of the number of bits in that NAND row 332 that were identified as storing portions of the data read at block 1004 with errors, and/or any other read disturb information that may be generated based on the number of bits in that NAND row 332 that were identified as storing portions of the data read at block 1004 with errors.

Figure 14:
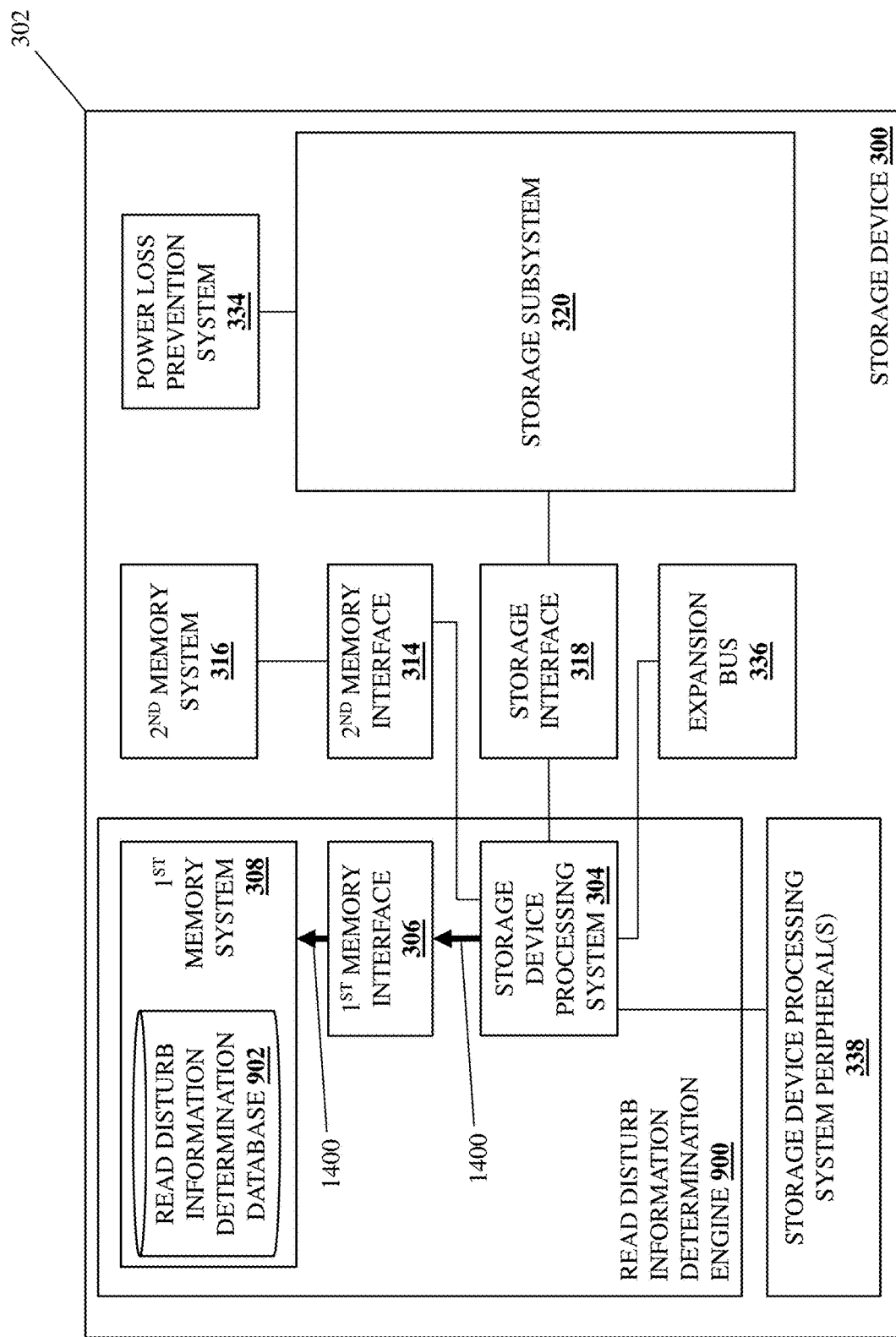
FIG. 14 is a schematic view illustrating an embodiment of the storage device of FIG. 9 operating during the method of FIG. 10.

One of skill in the art in possession of the present disclosure will appreciate how optional block 1002 and/or blocks 1004-1008 may be performed for multiple NAND rows 332 in order to determine read disturb information for each of those NAND rows 332, and as illustrated in FIG. 14 the storage device processing system 304 that provides the read disturb information determination engine 900 may perform read disturb information storage operations 1400 to store that read disturb information in the read disturb information determination database 902 (e.g., in the first memory system 308 via the first memory interface 306), which allows for the read disturb signature 502 illustrated in FIG. 5B to be generated based on the read disturb information for the NAND rows 332a-332d and 332f-332i.

The method 1000 may then proceed to block 1010 where the storage device generates a read temperature for a second NAND row in the storage subsystem using the read disturb information. As will be appreciated by one of skill in the art in possession of the present disclosure, at block 1010 the storage device processing system 304 that provides the read disturb information determination engine 900 may operate substantially as described above with regard to block 404 of the method 400 to determine a read temperature for a NAND row using the read disturb information identified for its adjacent NAND rows (e.g., a read temperature for the NAND row 332e using the read disturb information identified for the NAND rows 332a-332d and 332f-332i, illustrated in FIG. 5B). The method 1000 may then proceed to block 1012 where the storage device provides the read temperature to the global read temperature identification system. As will be appreciated by one of skill in the art in possession of the present disclosure, at block 1012 the storage device processing system 304 that provides the read disturb information determination engine 900 may operate substantially as described above with regard to block 406, 408, and 410 of the method 400 to provide the read temperature determined at block 1010 to the global read temperature identification engine 204.

Thus, systems and methods have been described that provide for the determination of read disturb information for a row in a storage subsystem based on bits that are provided in that row and that store data with errors, with some embodiments of the method identifying the bits storing data with errors based on a default value voltage reference level, and other embodiments of the method identifying the bits storing data with errors by amplifying those errors via the shifting of the value voltage reference level associated with the row. As such, a storage device may determine read disturb information for first NAND rows in its storage subsystem, which allows a read temperature of a second NAND row to be determined, and the storage device may then determine read temperatures for multiple NAND rows in such a manner to generate a local logical storage element read temperature map and provide that local logical storage element read temperature map to a global read temperature identification system for use in manipulating data based on its read temperature.

Figure 15:
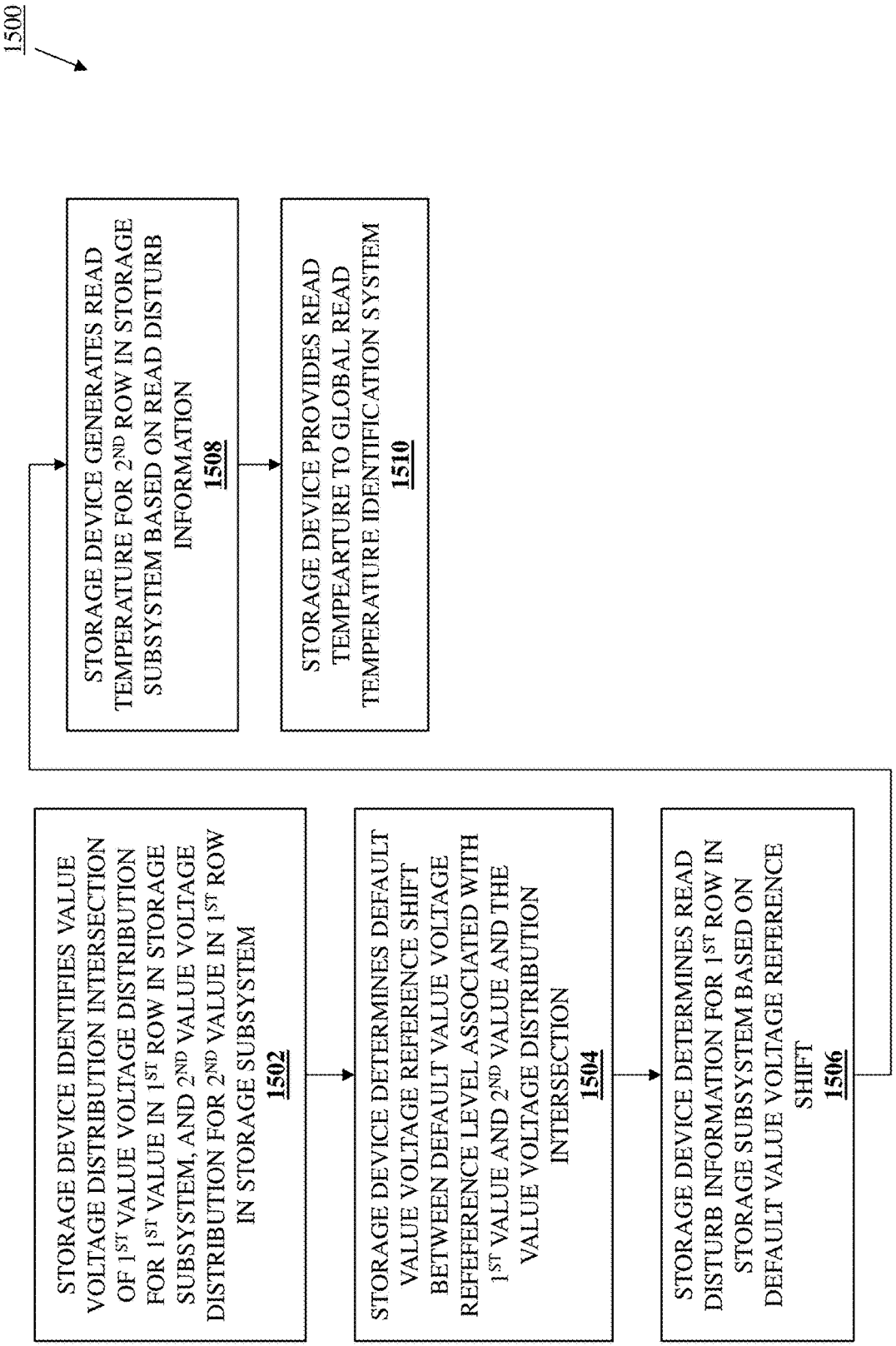
FIG. 15 is a flow chart illustrating an embodiment of a method for determining read disturb information.

Referring now to FIG. 15, an embodiment of a method 1500 determining read disturb information is illustrated. As discussed below, the systems and methods of the present disclosure provide for the determination of read disturb information for a row in a storage subsystem based on a value voltage distribution intersection of two adjacent states/values (discussed in further detail below), and without the need for the explicit error detection techniques described above. For example, the value-voltage-distribution-intersection-based read disturb information determination system of the present disclosure includes a storage device coupled to a global read temperature identification system. The storage device identifies a value voltage distribution intersection of first and second value voltage distributions for respective first and second values in a first row in a storage subsystem in the storage device, and determines a default value voltage reference level shift between a default value voltage reference level associated with the first value and the second value and the value voltage distribution intersection. Based on the default value voltage reference level shift, the storage device determines read disturb information for the first row in the storage subsystem in the storage device, and uses it to generate a read temperature for a second row in the storage subsystem in the storage device that it provides to the global read temperature identification system. As will be appreciated by one of skill in the art in possession of the present disclosure, the method 1500 provides one example of an alternative technique for determining read disturb information (i.e., alternative to read disturb determinations based on explicit error correction operations), and that other read disturb determination techniques will fall within the scope of the present disclosure as well.

Figure 16:
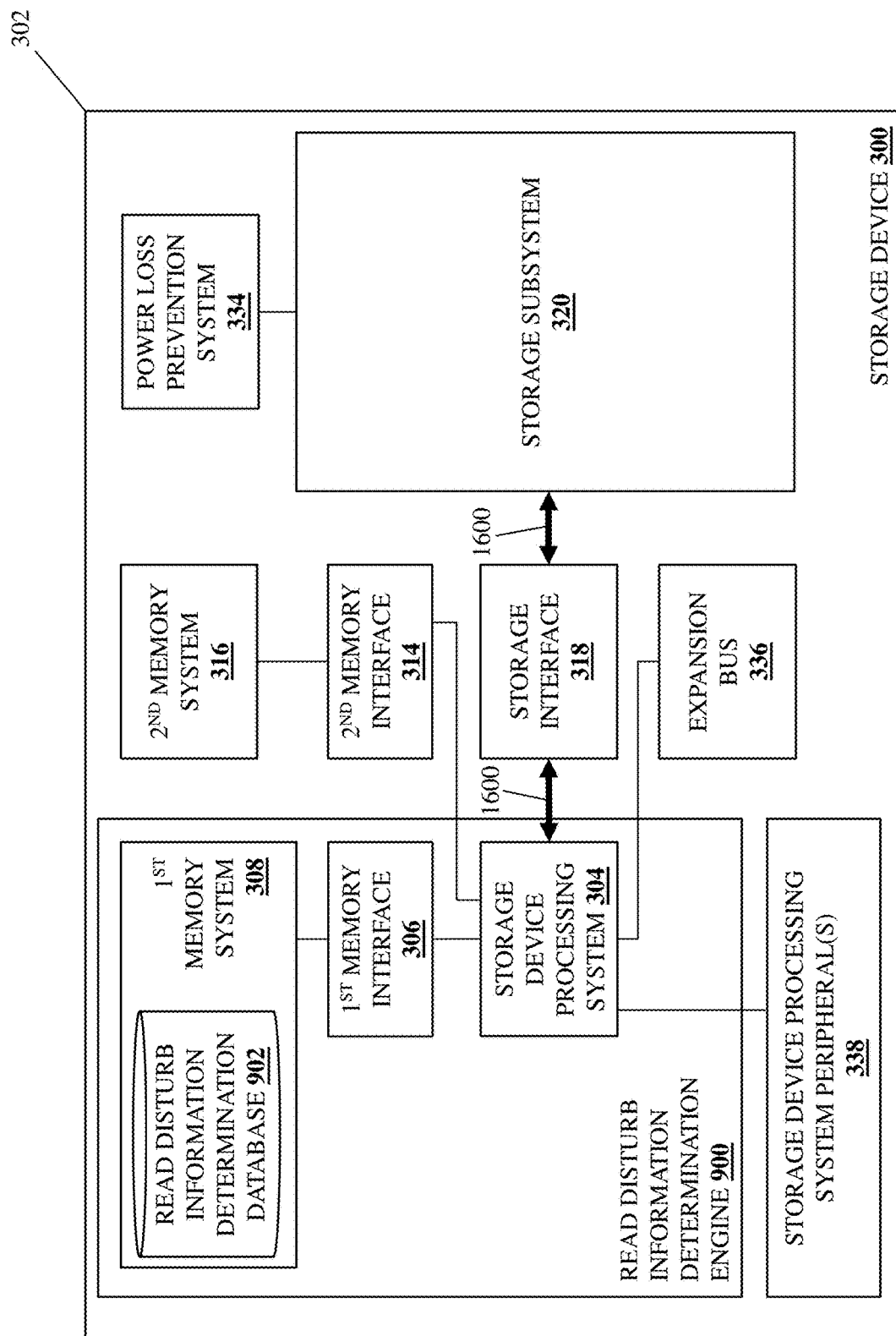
FIG. 16 is a schematic view illustrating an embodiment of the storage device of FIG. 9 operating during the method of FIG. 15.

The method 1500 begins at block 1502 where a storage device identifies a value voltage distribution intersection of a first value voltage distribution for a first value in a first row in a storage subsystem, and a second value voltage distribution for a second value in the first row in the storage subsystem. With reference to FIG. 16, in an embodiment of block 1502, the storage device processing system 304 that provides the read disturb information determination engine 900 may perform value voltage distribution intersection identification operations 1600 that include accessing the storage subsystem 320 via the storage interface 318 to identify a value voltage distribution intersection between a first value voltage distribution for a first value and a second value voltage distribution for a second value in a NAND row 332 in the storage subsystem 320.

Figure 17A:
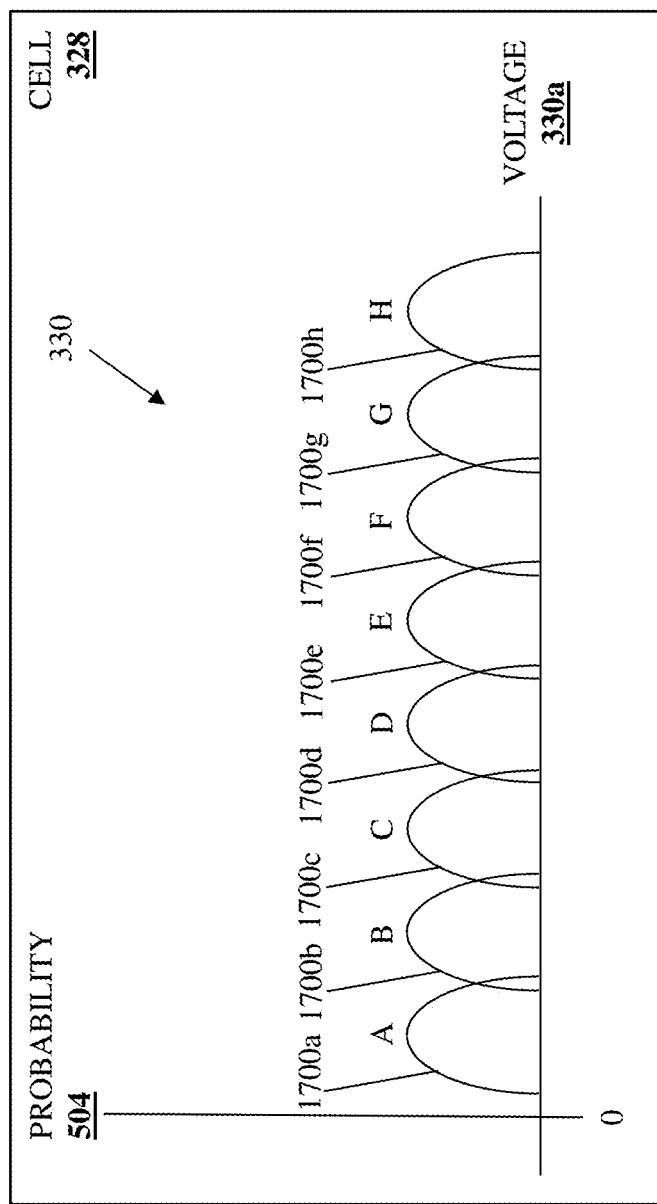
FIG. 17A is a graph view illustrating an embodiment of overlapping voltages/values that may exist in a cell of a NAND row included in the storage device of FIG. 9 during the method of FIG. 15.

With reference to FIG. 17A, the simplified representation of how data may be stored in a cell 328 from FIG. 3D above is reproduced with the voltage/value probabilities 504a for each value "A"–"H" available in the cell 328 as described above with reference to FIG. 5C, and with those voltage/value probabilities 504a for each pair of values overlapping (as occurs in real-world situations). In the discussion below, each of the value voltage probabilities 504a discussed above with reference to FIG. 5C provide a "value voltage distribution" for that value, with a value voltage distribution 1700a for value "A", a value voltage distribution 1700b for value "B", a value voltage distribution 1700c for value "C", a value voltage distribution 1700d for value "D", a value voltage distribution 1700e for value "E", a value voltage distribution 1700f for value "F", a value voltage distribution 1700g for value "G", and a value voltage distribution 1700h for value "H".

Figure 17B:
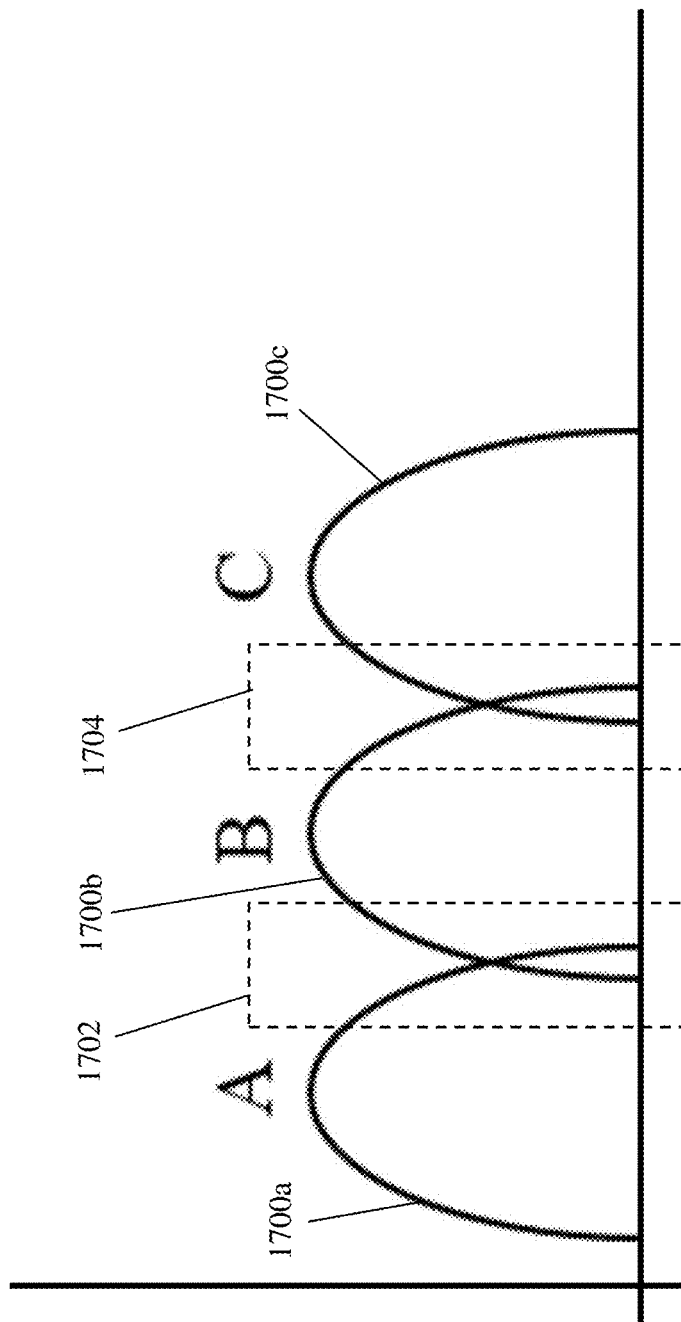
FIG. 17B is a graph view illustrating an embodiment of overlapping voltages/values in FIG. 17A that may have been determined to be more susceptible to read disturb effects.

The value voltage distribution intersection identified at block 1502 may be provided by the intersection between any two adjacent value voltage distributions, and as the read disturb effect operates to effect relatively "lower" states/values at relatively lower potentials, the value voltage distribution intersection for one or more relatively "lower" states/values may be identified at block 1502 (while ignoring the relatively "higher" states/values, which may be assumed to be constant). For example, FIG. 17B illustrates the value voltage distributions 1700a, 1700b, and 1700c for the values "A", "B", and "C", with a value voltage distribution overlap 1702 between the value voltage distributions 1700a and 1700b (for values "A" and "B", respectively) that may be selected for value voltage distribution intersection identification based on the corresponding page bits represented by the value "A" (e.g., the "z" bit in three bits "xyz" represented by the value "A") being more susceptible to read disturb effects (i.e., due to the relatively "lower" energy boundary for value "A"), and a value voltage distribution overlap 1704 between the value voltage distributions 1700b and 1700c (for values "B" and "C", respectively) that may be selected for value voltage distribution intersection identification based on their corresponding bits represented by the value "B" (e.g., the "y" bit in three bits "xyz" represented by the value "B") being more susceptible to read disturb effects (i.e., due to the relatively "lower" boundary for value "B"). However, while a few specific value voltage distribution overlaps are described that may be selected for value voltage distribution intersection identification, one of skill in the art in possession of the present disclosure will appreciate how different value voltage distribution overlaps may be selected for value voltage distribution intersection identification based on known, predetermined, or otherwise-characterized read disturb effect susceptibility while remaining within the scope of the present disclosure as well.

As discussed below, the value voltage distribution intersection identification operations 1600 may include performing a respective read at each of a plurality of different value voltage reference levels within a value voltage distribution overlap, determining whether each respective read produced an expected value, and identifying the value voltage distribution intersection as a value voltage reference level within a pair of value voltage reference levels at which the amount of data that provides the expected value changes the least from adjacent pair(s) of value voltage reference levels. As will be appreciated by one of skill in the art in possession of the present disclosure, the point at which two value voltage distributions intersect should result in the smallest change in the number of reads that provide an expected value relative to adjacent pair(s) of value voltage reference levels, and the value voltage distribution intersection identification operations 1600 may operate to identify that smallest change in the number of reads that provide an expected value between pairs of value voltage reference levels in order to identify the value voltage distribution intersection.

As described below and as will be appreciated by one of skill in the art in possession of the present disclosure, the value voltage distribution intersection identification operations 1600 may include reading data exactly as it is stored in the NAND rows on a bit basis (e.g., without removing scrambling or error correcting information), and moving the read level voltage incrementally in different directions between reads. In many embodiments, not all read levels need be utilized, and several may be skipped to save time (although more read levels may be utilized if higher accuracy is desired). In the examples provided with reference to FIGS. 18A-18E below, an expected value of "1" is utilized to identify the value voltage distribution intersection between values "A" and "B", but one of skill in the art in possession of the present disclosure will appreciate that for different value pairs, the value voltage distribution intersection may be identified using an expected value of "0".

Figure 18A:
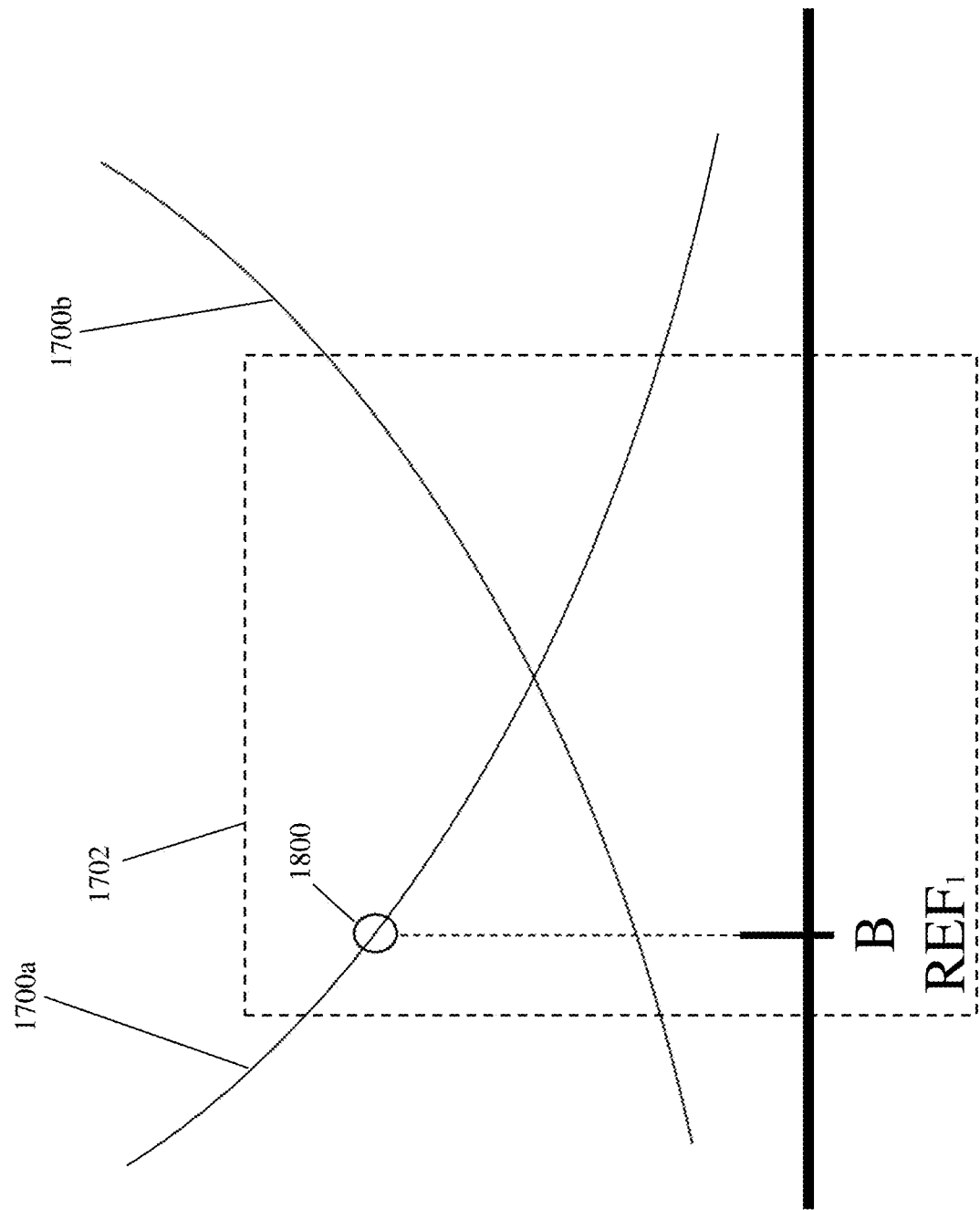
FIG. 18A is a graph view illustrating an embodiment of a voltage/value read at a first value voltage reference level during the method of FIG. 15.
Figure 18B:
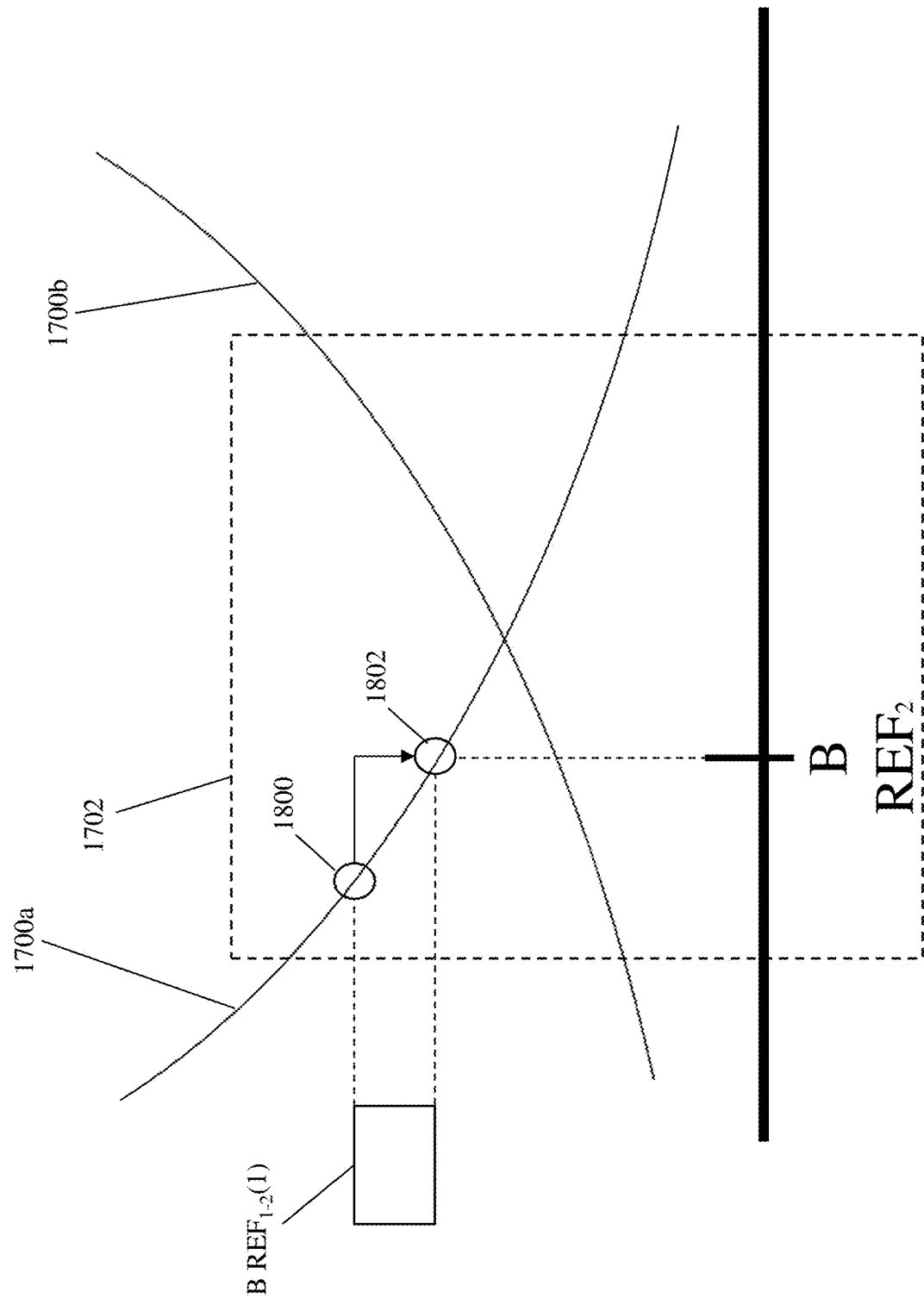
FIG. 18B is a graph view illustrating an embodiment of a voltage/value read at a second value voltage reference level during the method of FIG. 15.

For example, FIG. 18A illustrates how a first value voltage reference level ("B REF$_1$") may be utilized to perform a first read 1800 in the value voltage distribution overlap 1702 between the value voltage distributions 1700a and 1700b (for values "A" and "B", respectively). In an embodiment, the first value voltage reference level ("B REF$_1$") may be the default value voltage reference level between the values "A" and "B" discussed above, although embodiments in which a non-default value voltage reference level is used will fall within the scope of the present disclosure as well. FIG. 18B illustrates how the value voltage distribution intersection identification operations 1600 may include a plurality of reads in the value voltage distribution overlap 1702 between the between the value voltage distributions 1700a and 1700b (for values "A" and "B", respectively), with those plurality of reads performed between the first read 1800 at the first value voltage reference level ("B REF$_1$") and a subsequent read 1802 at a second value voltage reference level ("B REF$_2$").

In the examples below, the reads performed at the first value voltage reference level ("B REF$_1$") and up the second value voltage reference level ("B REF$_2$") are for the corresponding bit which changes state at the "B REF" reference level read threshold representing the value "A" that has an expected value of "1" if the voltage is to the left of the "B REF" reference level in the Figures, and for each of those reads that bit will either be the expected value ("1") or the unexpected value ("0") (i.e., if the voltage is to the right of the "B REF" reference level in the Figures). As such, the reads performed at the first value voltage reference level ("B REF$_1$") and up the second value voltage reference level ("B REF$_2$") will result in some number of reads of the expected value ("1") and some number of reads of the unexpected value ("0"), and the value voltage distribution intersection identification operations 1600 may identify how many of those reads resulted in the expected value ("1"), or "B REF$_{1-2}$(1)" in FIG. 18B and the equations below.

Figure 18C:
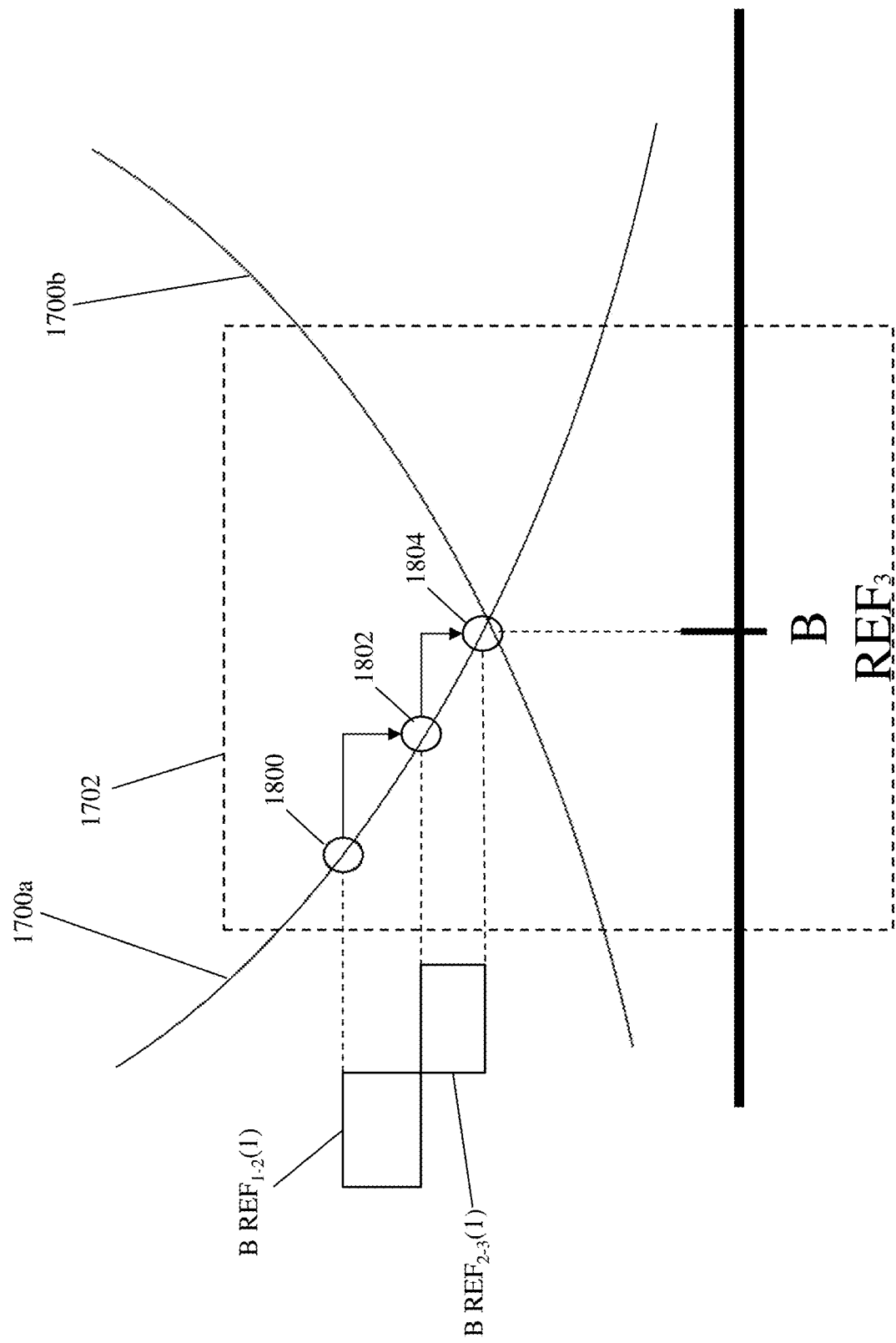
FIG. 18C is a graph view illustrating an embodiment of a voltage/value read at a third value voltage reference level during the method of FIG. 15.

FIG. 18C illustrates how the value voltage distribution intersection identification operations 1600 may include a plurality of reads in the value voltage distribution overlap 1702 between the between the value voltage distributions 1700a and 1700b (for values "A" and "B", respectively), with those plurality of reads performed between the subsequent read 1802 at the second value voltage reference level ("B REF$_2$") and a subsequent read 1804 at a third value voltage reference level ("B REF$_3$"). In the examples below, the reads performed at the second value voltage reference level ("B REF$_2$") and up the third value voltage reference level ("B REF$_3$") are for the page with bits represented by the value "A" that has an expected value of "1", and for each of those reads that bit will either be the expected value ("1") or the unexpected value ("0") (i.e., depending on which side of the "B REF" reference level the voltage falls in the Figures). As such, the reads performed at the second value voltage reference level ("B REF$_2$") and up the third value voltage reference level ("B REF$_3$") will result in some number of reads of the expected value ("1") and some number of reads of the unexpected value ("0"), and the value voltage distribution intersection identification operations 1600 may identify how many of those reads resulted in the expected value ("1"), or "B REF$_{2-3}$(1)" in FIG. 18C and the equations below.

Following the subsequent read 1804 at the third value voltage reference level ("B REF$_3$"), the number of reads performed at the second value voltage reference level ("B REF$_2$") and up the third value voltage reference level ("B REF$_3$") that resulted in the expected value ("1") may be compared to the number of reads performed at the first value voltage reference level ("B REF$_1$") and up the second value voltage reference level ("B REF$_2$") that resulted in the expected value ("1") to determine how the number of reads resulting in the expected value ("1") is changing, which may be represented by the equation:

$$\Delta_1 = B\ \text{REF}_{1\text{-}2}(1) - B\ \text{REF}_{2\text{-}3}(1)$$

As will be appreciated by one of skill in the art in possession of the present disclosure, if $\Delta_1$ is positive, the number of reads resulting in the expected value ("1") is decreasing from B REF$_{1\text{-}2}$(1) to B REF$_{2\text{-}3}$(1), while if $\Delta 1$ is negative, the number of reads resulting in the expected value ("1") is increasing from B REF$_{1\text{-}2}$(1) to B REF$_{2\text{-}3}$(1).

As will be appreciated by one of skill in the art in possession of the present disclosure, as a plurality of reads are performed progressively closer to intersection of the value voltage distributions 1700a and 1700b, the number of reads that result in the expected value will reduce (i.e., in response to more bits "flipping" due to their voltage crossing the value voltage reference level B REF). As such, Ai provides an indication of whether the value voltage reference level B REF$_3$ has moved towards the intersection of the value voltage distributions 1700a and 1700b, or away from the intersection of the value voltage distributions 1700a and 1700b. The example in FIG. 18C illustrates a situation where Ai is positive and thus the number of bits changing from the value ("0") to the expected value ("1") is decreasing from B REF$_{1-2}$(1) to B REF$_{2-3}$(1). As such, Ai in FIG. 18C indicates that the value voltage reference level B REF$_3$ has moved towards the intersection of the value voltage distributions 1700a and 1700b.

However, in the event Ai is negative and thus the number of bits resulting in the expected value ("1") is increasing from B REF$_{1-2}$(1) to B REF$_{2-3}$(1), the value voltage distribution intersection identification operations 1600 may determine that the value voltage reference level B REF$_3$ has moved away the intersection of the value voltage distributions 1700a and 1700b, and thus may perform subsequent reads at value voltage reference levels that are opposite the first value voltage reference level ("B REF$_1$") from the second and third value voltage reference level ("B REF$_2$" and ("B REF$_3$"). In other words, the value voltage distribution intersection identification operations 1600 may identify subsequent value voltage reference levels at which to perform read operations based on Ai to ensure that the value voltage reference levels are moving towards the intersection of the value voltage distributions 1700a and 1700b.

As such, the value voltage distribution intersection identification operations 1600 may include performing first reads of first data at first value voltage levels (e.g., between "B REF$_1$" and "B REF$_2$" in the example above) and determining a first amount of the first data that provides an expected value, performing second reads of the first data at second value voltage levels (e.g., between "B REF$_2$" and "B REF$_3$" in the example above) and determining a second amount of the first data that provides the expected value and, based on a difference between the first amount and the second amount, identify third value voltage reference levels at which to perform third reads of the first data. However, while a specific technique has been described for determining where to perform reads in order to identify the value voltage distribution intersection, other techniques will fall within the scope of the present disclosure as well.

Figure 18D:
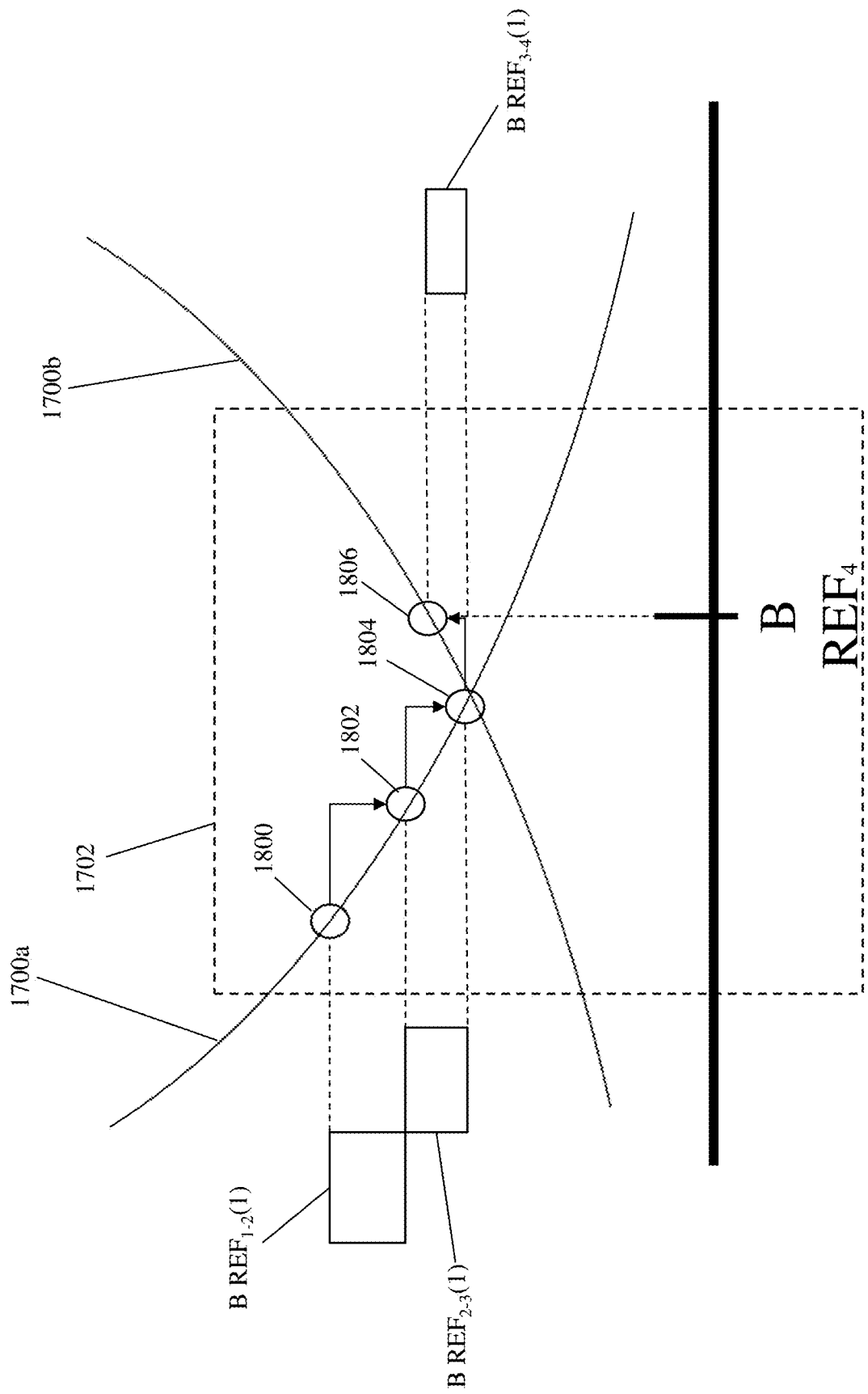
FIG. 18D is a graph view illustrating an embodiment of a voltage/value read at a fourth value voltage reference level during the method of FIG. 15.

FIG. 18D illustrates how the value voltage distribution intersection identification operations 1600 may include a plurality of reads in the value voltage distribution overlap 1702 between the value voltage distributions 1700a and 1700b (for values "A" and "B", respectively), with those plurality of reads performed between the third value voltage reference level ("B REF$_3$") and a subsequent read 1806 at a fourth value voltage reference level ("B REF$_4$"). In the examples below, the reads performed at the third value voltage reference level ("B REF$_3$") and up the fourth value voltage reference level ("B REF$_4$") are for a bit representing the value "A" that has an expected value of "1", and for each of those reads that bit will either be the expected value ("1") or the unexpected value ("0"). As such, the reads performed at the third value voltage reference level ("B REF$_3$") and up the fourth value voltage reference level ("B REF$_4$") will result in some number of reads of the expected value ("1") and some number of reads of the unexpected value ("0"), and the value voltage distribution intersection identification operations 1600 may identify how many of those reads resulted in the expected value ("1"), or "B REF$_{3-4}$(1)" in FIG. 18D and the equations below.

Following the subsequent read 1806 at the fourth value voltage reference level ("B REF$_4$"), the number of reads performed at the third value voltage reference level ("B REF$_3$") and up the fourth value voltage reference level ("B REF$_4$") that resulted in the expected value ("1") may be compared to the number of reads performed at the second value voltage reference level ("B REF$_2$") and up the third value voltage reference level ("B REF$_3$") that resulted in the expected value ("1") to determine how the number of reads resulting in the expected value ("1") is changing, which may be represented by the equation:

$$\Delta_2 = B\ REF_{2-3}(1) - B\ REF_{3-4}(1)$$

Figure 18E:
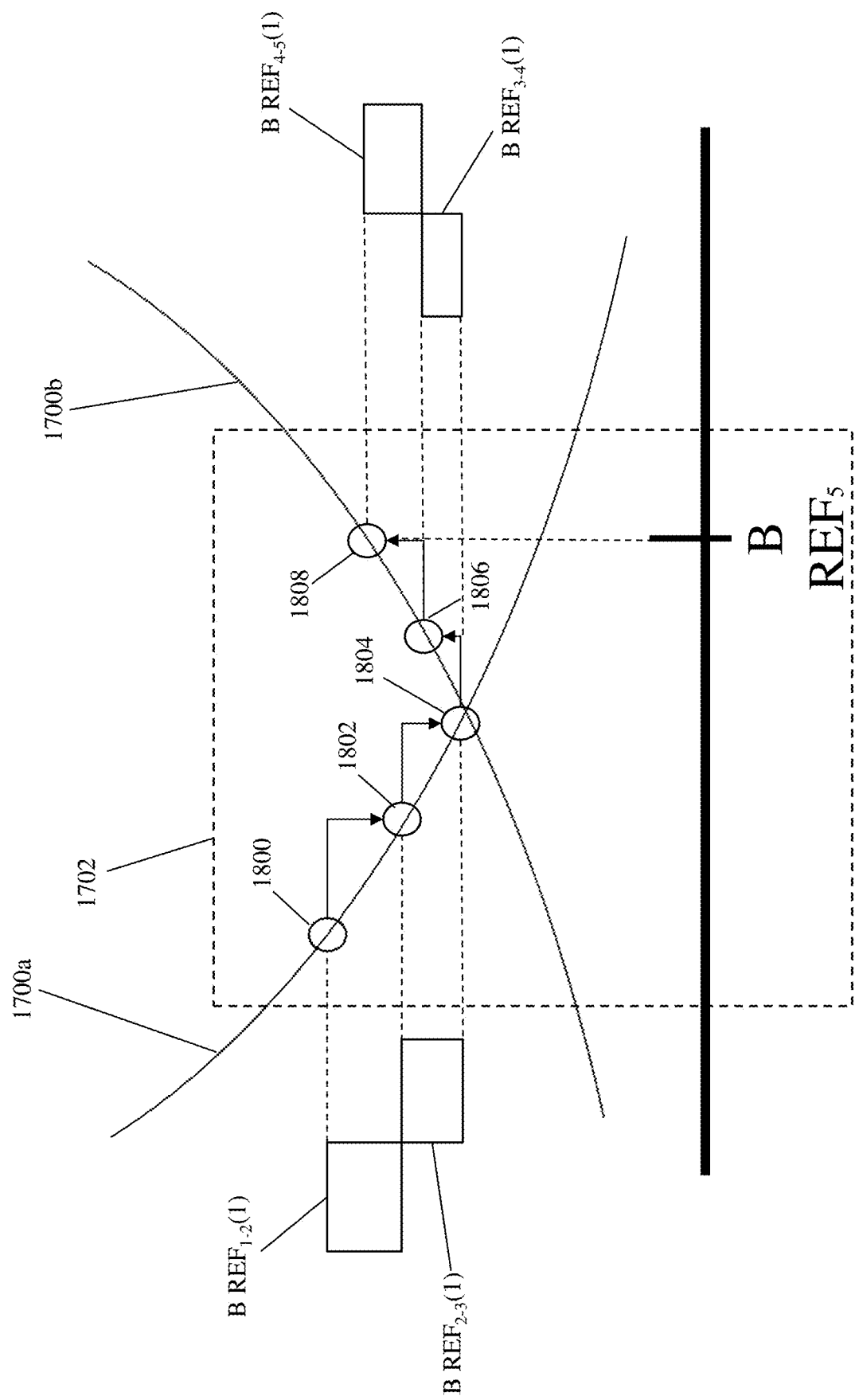
FIG. 18E is a graph view illustrating an embodiment of a voltage/value read at a fifth value voltage reference level during the method of FIG. 15.

FIG. 18E illustrates how the value voltage distribution intersection identification operations 1600 may include a plurality of reads in the value voltage distribution overlap 1702 between the value voltage distributions 1700a and 1700b (for values "A" and "B", respectively), with those plurality of reads performed between the fourth value voltage reference level ("B REF$_4$") and a subsequent read 1808 at a fifth value voltage reference level ("B REF$_5$"). In the examples below, the reads performed at the fourth value voltage reference level ("B REF$_4$") and up the fifth value voltage reference level ("B REF$_5$") are for a bit representing the value "A" that has an expected value of "1", and for each of those reads that "lower" bit will either be the expected value ("1") or the unexpected value ("0"). As such, the reads performed at the fourth value voltage reference level ("B REF$_4$") and up the fifth value voltage reference level ("B REF$_5$") will result in some number of reads of the expected value ("1") and some number of reads of the unexpected value ("0"), and the value voltage distribution intersection identification operations 1600 may identify how many of those reads resulted in the expected value ("1"), or "B REF$_{4-5}$(1)" in FIG. 18D and the equations below.

Following the subsequent read 1808 at the fifth value voltage reference level ("B REF$_5$"), the number of reads performed at the fourth value voltage reference level ("B REF$_4$") and up the fifth value voltage reference level ("B REF$_5$") that resulted in the expected value ("1") may be compared to the number of reads performed at the third value voltage reference level ("B REF$_3$") and up the fourth value voltage reference level ("B REF$_4$") that resulted in the expected value ("1") to determine how the number of bits with the expected value ("1") is changing, which may be represented by the equation:

$$\Delta_3 = B\ REF_{3-4}(1) - B\ REF_{4-5}(1)$$

Following the subsequent read 1808 at the fifth value voltage reference level ("B REF$_5$"), the number of reads performed between any pair of the value voltage reference levels (e.g., the B REF$_1$/B REF$_2$ pair, the B REF$_2$/B REF$_3$ pair, the B REF$_3$/B REF$_4$ pair, and the B REF$_4$/B REF$_5$ pair in the examples above) that resulted in the expected value ("1") may be compared to determine which pair of value voltage reference levels had reads with the expected value ("1") that changed the least relative to its adjacent pair(s) of value voltage reference levels. In other words, the value voltage distribution intersection identification operations 1600 may determine which of $\Delta_1$, $\Delta_2$, and $\Delta_3$ discussed above is the smallest. As will be appreciated by one of skill in the art in possession of the present disclosure, the intersection of the value voltage distributions 1700a and 1700b will fall within the pair of value voltage reference levels with reads resulting in the expected value ("1") that changed the least relative to its adjacent pair(s) of value voltage reference levels (e.g., the "valley" between the value voltage distributions 1700a and 1700b). One of skill in the art in possession of the present disclosure will appreciate how the operations performed during the method 1800 may be analogized to using an altimeter to identify a physical valley, which involves taking readings from the altimeter (i.e., the reads described above) as you traverse across the valley (i.e., the value voltage distribution overlap 1702), and analyzing those readings (i.e., determining the number of bits with the expected value) to identify the lowest point (i.e., value voltage distribution intersection).

In the example illustrated in FIG. 18E, 42 indicates that the pair of the third and fourth value voltage reference levels ("B REF$_3$" and "B REF$_4$") has reads with the expected value ("1") that changed the least relative to 4i/the adjacent pair of the second and third value voltage reference levels ("B REF$_2$" and "B REF$_3$") and 43/the adjacent pair of the fourth and fifth value voltage reference levels ("B REF$_4$" and "B REF$_5$").

The value voltage distribution intersection identification operations 1600 may then identify the value voltage distribution intersection as a value voltage reference level between the pair of the third and fourth value voltage reference levels ("B REF$_3$" and "B REF$_4$") that had reads with the expected value ("1") that changed the least relative to the adjacent pair(s) of value voltage reference levels, which may include identifying the value voltage distribution intersection as the value voltage reference level at the edge of that pair of value voltage reference levels (i.e., either the third value voltage reference level "B REF$_3$" or the fourth value voltage reference level "B REF$_4$"), identifying the value voltage distribution intersection as a value voltage reference level midway between that pair of value voltage reference levels (i.e., a value voltage reference level midway between the third value voltage reference level "B REF$_3$" or the fourth value voltage reference level "B REF$_4$"), and/or using any other selection techniques that would be apparent to one of skill in the art in possession of the present disclosure.

As such, the value voltage distribution intersection identification operations 1600 may include performing a respective read at each of a plurality of different value voltage reference levels (e.g., between the first value voltage reference level "B REF$_1$" and the fifth value voltage reference level "B REF$_5$"), determining an amount of data that provides an expected value for different subsets of the reads between pairs of the value voltage reference levels (e.g., B REF$_{1-2}$(1), B REF$_{2-3}$(1), B REF$_{3-4}$(1), and B REF$_{4-5}$(1)), and identifying a value voltage distribution intersection as a value voltage reference level included within a first pair of the value voltage reference levels that resulted in a number of reads with the expected value that changed the least from at least one adjacent pair of the value voltage reference levels. However, while a specific technique has been described for identifying the value voltage distribution intersection, other techniques will fall within the scope of the present disclosure as well. For example, using the reads 1800-1808, signal processing techniques (curve fitting, filtering, etc.) may be performed to extract signatures that identify the effects (e.g., read disturb effects, data retention effects, etc.) discussed above.

The method 1500 then proceeds to block 1504 where the storage device determines a default value voltage reference level shift between a default value voltage reference level associated with the first value and the second value, and the value voltage distribution intersection. In an embodiment, at block 1504, the storage device processing system 304 that provides the read disturb information determination engine 900 may perform default value voltage reference level shift determination operations that include determining a default value voltage reference level shift between the value voltage distribution intersection identified at block 1502 and the default value voltage reference level associated with the values for which the value voltage distribution intersection was identified.

Continuing with the example above, with reference to FIGS. 18A and 18E and in embodiments in which the first value voltage reference level ("B REF$_1$") is the default value voltage reference level for the values "A" an "B", the default value voltage reference level shift determination operations may include determining a difference between the value voltage distribution intersection determined at block 1502 and the first value voltage reference level ("B REF$_1$"). Thus, in different embodiments of the example provided above, the default value voltage reference level shift (i.e., the "shift" from the default value voltage reference level to the value voltage distribution intersection) may be the difference between the first value voltage reference level ("B REF$_1$") and any of 1) the third value voltage reference level ("B REF$_3$"), 2) the fourth value voltage reference level ("B REF$_4$"), 3) midway between the third value voltage reference level ("B REF$_3$") and the fourth value voltage reference level ("B REF$_4$"), or 4) any other value voltage reference level between the third value voltage reference level ("B REF$_3$") and the fourth value voltage reference level ("B REF$_4$").

The method 1500 then proceeds to block 1506 where the storage device determines read disturb information for the first row based on the default value voltage reference level shift. In an embodiment, at block 1506 the storage device processing system 304 that provides the read disturb information determination engine 900 may perform read disturb information determination operations to determine read disturb information for the NAND row 332 based on the default value voltage reference level shift. As will be appreciated by one of skill in the art in possession of the present disclosure, the default value voltage reference level shift (i.e., a voltage difference) may provide the read disturb information for the NAND row 332, or may be used to generate the read disturb information for the NAND row 332 (e.g., via an equation that weighs respective voltage differences provided by the default value voltage reference level shifts for that NAND row 332 differently).

Figure 19:
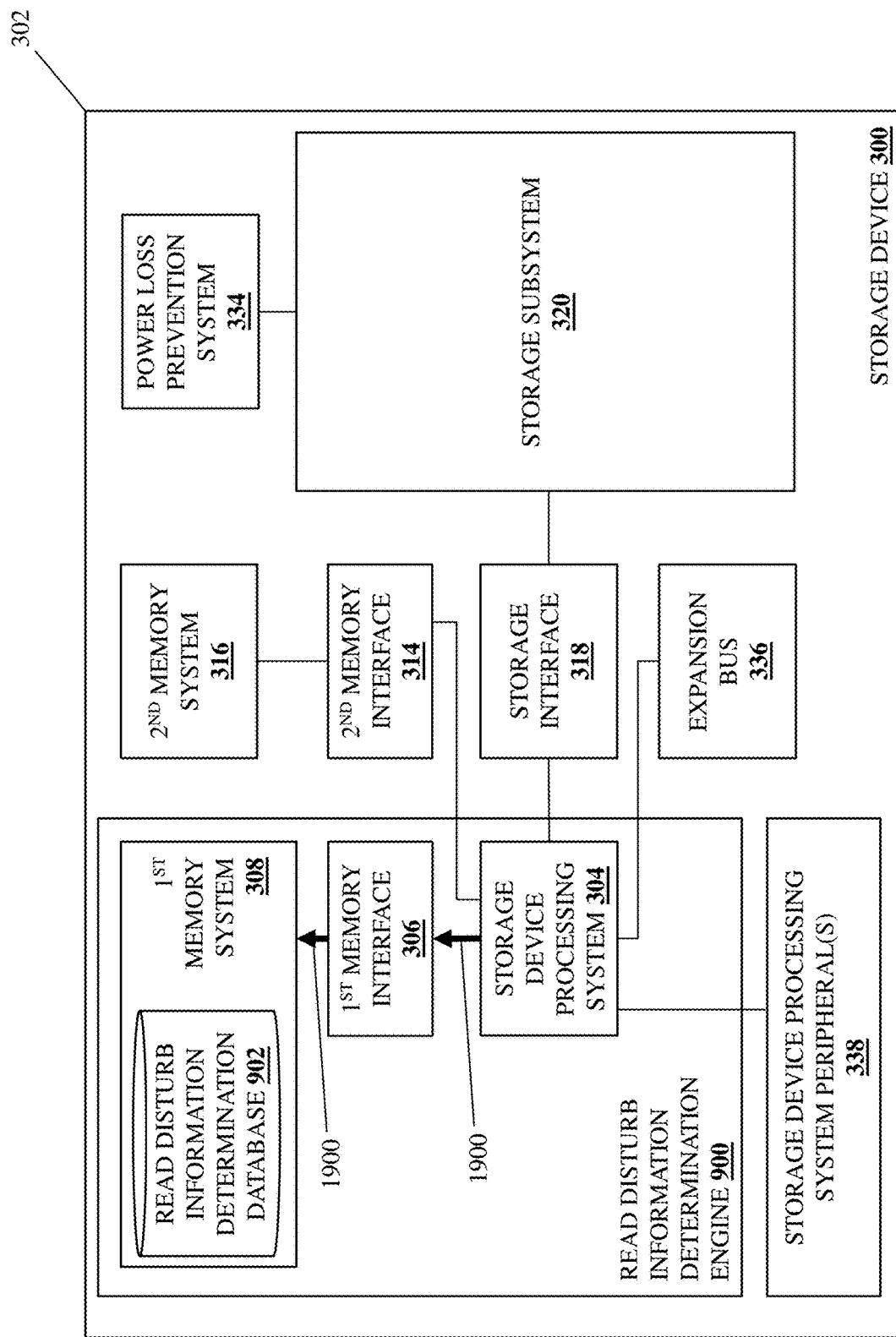
FIG. 19 is a schematic view illustrating an embodiment of the storage device of FIG. 9 operating during the method of FIG. 15.

One of skill in the art in possession of the present disclosure will appreciate how blocks 1502 and 1504 may be performed for multiple NAND rows 332 in order to determine read disturb information for each of those NAND rows 332 and, as illustrated in FIG. 19, the storage device processing system 304 that provides the read disturb information determination engine 900 may perform read disturb information storage operations 1900 to store that read disturb information in the read disturb information determination database 902 (e.g., in the first memory system 308 via the first memory interface 306), which allows for the read disturb signature 502 illustrated in FIG. 5B to be generated based on the read disturb information for the NAND rows 332a-332d and 332f-332i that was determined at block 1506.

The method 1500 may then proceed to block 1508 where the storage device generates a read temperature for a second NAND row in the storage subsystem using the read disturb information. As will be appreciated by one of skill in the art in possession of the present disclosure, at block 1508 the storage device processing system 304 that provides the read disturb information determination engine 900 may operate substantially as described above with regard to block 404 of the method 400 to determine a read temperature for a NAND row using the read disturb information identified for its adjacent NAND rows (e.g., a read temperature for the NAND row 332e using the read disturb information identified for the NAND rows 332a-332d and 332f-332i, illustrated in FIG. 5B). The method 1500 may then proceed to block 1510 where the storage device provides the read temperature to the global read temperature identification system. As will be appreciated by one of skill in the art in possession of the present disclosure, at block 1510 the storage device processing system 304 that provides the read disturb information determination engine 900 may operate substantially as described above with regard to block 406, 408, and 410 of the method 400 to provide the read temperature determined at block 1508 to the global read temperature identification engine 204.

Thus, systems and methods have been described that provide for the determination of read disturb information for a row in a storage subsystem without the need for explicit error correction techniques and based on a value voltage distribution intersection of value voltage distributions for adjacent values in cell(s) of a row in a storage subsystem. Furthermore, while several specific techniques for determining read disturb information are described above herein, one of skill in the art in possession of the present disclosure will appreciate how other techniques for determining read disturb information will fall within the scope of the present disclosure as well.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A value-voltage-distribution-intersection-based read disturb information determination system, comprising:
   a global read temperature identification subsystem; and
   a storage device that is coupled to the global read temperature identification system and configured to:
      identify a value voltage distribution intersection of a first value voltage distribution for a first value in a first row in a storage subsystem in the storage device, and a second value voltage distribution for a second value in the first row in the storage subsystem in the storage device;
      determine a default value voltage reference shift between a default value voltage reference level associated with the first value and the second value and the value voltage distribution intersection;
      determine, based on the default value voltage reference shift, read disturb information for the first row in the storage subsystem in the storage device;
      generate, using the read disturb information, a read temperature for a second row in the storage subsystem in the storage device; and
      provide the read temperature to the global read temperature identification system.

2. The system of claim 1, wherein the first value voltage distribution and the second value voltage distribution were previously identified as being susceptible to read disturb effects.

3. The system of claim 2, wherein the first value voltage distribution and the second value voltage distribution provide for transitions between relatively lower values.

4. The system of claim 1, wherein the identifying the value voltage distribution intersection of the first value voltage distribution and the second value voltage distribution includes:
   performing a respective read at each of a plurality of different value voltage reference levels;
   determining an amount of data that provides an expected value for different subsets of the reads between pairs of the value voltage reference levels; and
   identifying a value voltage distribution intersection as a value voltage reference level included within a first pair of the value voltage reference levels that resulted in a number of reads with the expected value that changed the least from at least one adjacent pair of the value voltage reference levels.

5. The system of claim 4, wherein the expected value of the data is a 1 value, and wherein an unexpected value of the data is a 0 value.

6. The system of claim 1, wherein the identifying the value voltage distribution intersection of the first value voltage distribution and the second value voltage distribution includes:
   performing first reads of first data at first value voltage reference levels and determining a first amount of the first data that provides an expected value;
   performing second reads of the first data at second value voltage reference levels and determining a second amount of the first data that provides the expected value; and
   identifying, based on a difference between the first amount and the second amount, third value voltage reference levels at which to perform third reads of the first data.

7. The system of claim 6, wherein the identifying the value voltage distribution intersection of the first value voltage distribution and the second value voltage distribution includes:
   performing third reads of the first data at the third value voltage reference levels and determining a third amount of the first data that provides the expected value.

8. A storage device, comprising:
   a processing system; and
   a memory system that is coupled to the processing system and that includes instructions that, when executed by the processing system, cause the processing system to provide a value-voltage-distribution-intersection-based read disturb information determination engine that is configured to:
      identify a value voltage distribution intersection of a first value voltage distribution for a first value in a first row in a storage subsystem, and a second value voltage distribution for a second value in the first row in the storage subsystem;
      determine a default value voltage reference shift between a default value voltage reference level associated with the first value and the second value and the value voltage distribution intersection;
      determine, based on the default value voltage reference shift, read disturb information for the first row in the storage subsystem;
      generate, using the read disturb information, a read temperature for a second row in the storage subsystem; and
      provide the read temperature to the global read temperature identification system.

9. The storage device of claim 8, wherein the first value voltage distribution and the second value voltage distribution were previously identified as being susceptible to read disturb effects.

10. The storage device of claim 9, wherein the first value voltage distribution and the second value voltage distribution provide for transitions between relatively lower values.

11. The storage device of claim 8, wherein the identifying the value voltage distribution intersection of the first value voltage distribution and the second value voltage distribution includes:
   performing a respective read at each of a plurality of different value voltage reference levels;
   determining an amount of data that provides an expected value for different subsets of the reads between pairs of the value voltage reference levels; and
   identifying a value voltage distribution intersection as a value voltage reference level included within a first pair of the value voltage reference levels that resulted in a number of reads with the expected value that changed the least from at least one adjacent pair of the value voltage reference levels.

12. The storage device of claim 8, wherein the identifying the value voltage distribution intersection of the first value voltage distribution and the second value voltage distribution includes:
   performing first reads of first data at first value voltage reference levels and determining a first amount of the first data that provides an expected value;
   performing second reads of the first data at second value voltage reference levels and determining a second amount of the first data that provides the expected value; and
   identifying, based on a difference between the first amount and the second amount, third value voltage reference levels at which to perform third reads of the first data.

13. The storage device of claim 12, wherein the identifying the value voltage distribution intersection of the first value voltage distribution and the second value voltage distribution includes:
   performing third reads of the first data at the third value voltage reference levels and determining a third amount of the first data that provides the expected value.

14. A method for determining read disturb information, comprising:
   identifying, by a storage device, a value voltage distribution intersection of a first value voltage distribution for a first value in a first row in a storage subsystem in the storage device, and a second value voltage distribution for a second value in the first row in the storage subsystem in the storage device;
   determining, by the storage device, a default value voltage reference shift between a default value voltage reference level associated with the first value and the second value and the value voltage distribution intersection;
   determining, by the storage device based on the default value voltage reference shift, read disturb information for the first row in the storage subsystem in the storage device;
   generating, by the storage device using the read disturb information, a read temperature for a second row in the storage subsystem in the storage device.

15. The method of claim 14, wherein the first value voltage distribution and the second value voltage distribution were previously identified as being susceptible to read disturb effects.

16. The method of claim 15, wherein the first value voltage distribution and the second value voltage distribution provide for transitions between relatively lower values.

17. The method of claim 14, wherein the identifying the value voltage distribution intersection of the first value voltage distribution and the second value voltage distribution includes:
   performing, by the storage device, a respective read at each of a plurality of different value voltage reference levels;
   determining, by the storage device, an amount of data that provides an expected value for different subsets of the reads between pairs of the value voltage reference levels; and
   identifying, by the storage device, a value voltage distribution intersection as a value voltage reference level included within a first pair of the value voltage reference levels that resulted in a number of reads with the expected value that changed the least from at least one adjacent pair of the value voltage reference levels.

18. The method of claim 17, wherein the expected value of the data is a 1 value, and wherein an unexpected value of the data is a 0 value.

19. The method of claim 14, wherein the identifying the value voltage distribution intersection of the first value voltage distribution and the second value voltage distribution includes:
   performing, by the storage device, first reads of first data at first value voltage reference levels and determining a first amount of the first data that provides an expected value;
   performing, by the storage device, second reads of the first data at second value voltage reference levels and determining a second amount of the first data that provides the expected value; and
   identifying, by the storage device based on a difference between the first amount and the second amount, third value voltage reference levels at which to perform third reads of the first data.

20. The method of claim 19, wherein the identifying the value voltage distribution intersection of the first value voltage distribution and the second value voltage distribution includes:
   performing, by the storage device, third reads of the first data at the third value voltage reference levels and determining a third amount of the first data that provides the expected value.

* * * * *

UNITED STATES PATENT AND TRADEMARK OFFICE
CERTIFICATE OF CORRECTION

Page 1 of 1

PATENT NO. : 11,763,898 B2
APPLICATION NO. : 17/581879
DATED : September 19, 2023
INVENTOR(S) : Aiouaz et al.

It is certified that error appears in the above-identified patent and that said Letters Patent is hereby corrected as shown below:

On the Title Page

Page 2, Item (56), References Cited, OTHER PUBLICATIONS, delete "U.S. Appl. No. 17/279,020, filed 2022.*"

Signed and Sealed this
Twenty-first Day of May, 2024

Katherine Kelly Vidal
*Director of the United States Patent and Trademark Office*